United States Patent
Joei et al.

(10) Patent No.: US 12,464,829 B2
(45) Date of Patent: Nov. 4, 2025

(54) IMAGING ELEMENT AND IMAGING DEVICE

(71) Applicants: SONY GROUP CORPORATION, Tokyo (JP); SONY SEMICONDUCTOR SOLUTIONS CORPORATION, Kanagawa (JP)

(72) Inventors: Masahiro Joei, Kanagawa (JP); Shintarou Hirata, Kanagawa (JP); Tomiyuki Yukawa, Kanagawa (JP); Ryosuke Suzuki, Kanagawa (JP); Hiroshi Nakano, Tokyo (JP); Toshihiko Hayashi, Kanagawa (JP); Ryotaro Takaguchi, Kanagawa (JP); Iwao Yagi, Kanagawa (JP); Kenichi Murata, Kanagawa (JP)

(73) Assignees: SONY GROUP CORPORATION, Tokyo (JP); SONY SEMICONDUCTOR SOLUTIONS CORPORATION, Kanagawa (JP)

(*) Notice: Subject to any disclaimer, the term of this patent is extended or adjusted under 35 U.S.C. 154(b) by 487 days.

(21) Appl. No.: 17/915,619

(22) PCT Filed: Mar. 24, 2021

(86) PCT No.: PCT/JP2021/012401
§ 371 (c)(1),
(2) Date: Sep. 29, 2022

(87) PCT Pub. No.: WO2021/200509
PCT Pub. Date: Oct. 7, 2021

(65) Prior Publication Data
US 2023/0215880 A1 Jul. 6, 2023

(30) Foreign Application Priority Data

Mar. 31, 2020 (JP) ................................. 2020-064017
Mar. 19, 2021 (JP) ................................. 2021-045945

(51) Int. Cl.
H10F 19/50 (2025.01)
H10F 39/00 (2025.01)
(Continued)

(52) U.S. Cl.
CPC .......... H10F 19/50 (2025.01); H10F 39/1825 (2025.01); H10F 39/805 (2025.01);
(Continued)

(58) Field of Classification Search
CPC ...... H10F 19/50; H10F 39/1825; H10F 39/805; H10F 39/8037; H10F 39/812;
(Continued)

(56) References Cited

U.S. PATENT DOCUMENTS

2009/0283758 A1  11/2009  Nomura
2009/0315136 A1  12/2009  Hayashi
(Continued)

FOREIGN PATENT DOCUMENTS

CN  104010141 A  8/2014
CN  111034174 A  4/2020
(Continued)

OTHER PUBLICATIONS

International Search Report from corresponding PCT application PCT/JP2021/012401, dated Jun. 22, 2021.

*Primary Examiner* — Bitew A Dinke
(74) *Attorney, Agent, or Firm* — K&L Gates LLP

(57) ABSTRACT

An imaging element according to an embodiment of the present disclosure includes: a first electrode and a second electrode; a third electrode; a photoelectric conversion layer; and a semiconductor layer. The first electrode and the second electrode are disposed in parallel. The third electrode is disposed to be opposed to the first electrode and the second electrode. The photoelectric conversion layer is provided between the first electrode and second electrode and the (Continued)

third electrode. The semiconductor layer is provided between the first electrode and second electrode and the photoelectric conversion layer. The semiconductor layer has a first layer and a second layer stacked therein in order from the photoelectric conversion layer side. The second layer has an energy level at a lowest edge of a conduction band that is shallower than an energy level of the first layer at a lowest edge of a conduction band.

46 Claims, 64 Drawing Sheets

(51) Int. Cl.
    *H10F 39/18*     (2025.01)
    *H10K 39/32*     (2023.01)

(52) U.S. Cl.
    CPC ......... *H10K 39/32* (2023.02); *H10F 39/8037* (2025.01); *H10F 39/812* (2025.01)

(58) Field of Classification Search
    CPC .... H10F 39/193; H10F 39/192; H10F 39/803; H10F 39/809; H10F 39/18; H10K 39/32; H10K 30/353; H10K 30/85; Y02E 10/549
    See application file for complete search history.

(56) References Cited

U.S. PATENT DOCUMENTS

| | | |
|---|---|---|
| 2014/0239430 A1 | 8/2014 | Egawa |
| 2016/0148960 A1 | 5/2016 | Egawa |
| 2019/0189815 A1* | 6/2019 | Cho ........................ H10F 10/16 |
| 2019/0296086 A1* | 9/2019 | Kobayashi ............. H10K 19/20 |
| 2020/0212108 A1* | 7/2020 | Bando .................... H10K 30/82 |
| 2020/0221042 A1 | 7/2020 | Watanabe et al. |
| 2020/0258923 A1* | 8/2020 | Ono ..................... H10F 39/8033 |
| 2021/0020857 A1* | 1/2021 | Hirata ................... H10F 39/011 |
| 2021/0273017 A1 | 9/2021 | Murata |
| 2021/0288111 A1 | 9/2021 | Joei |

FOREIGN PATENT DOCUMENTS

| | | | | |
|---|---|---|---|---|
| EP | 3376543 A1 | 9/2018 | | |
| EP | 3671840 A1 | 6/2020 | | |
| EP | 3832725 A1 | 6/2021 | | |
| JP | 2010003901 A | 1/2010 | | |
| JP | 2013020998 A | 1/2013 | | |
| JP | 2014165399 A | 9/2014 | | |
| JP | 2015043370 A | * | 3/2015 | |
| JP | 2019047294 A | 3/2019 | | |
| KR | 20140106361 A | 9/2014 | | |
| TW | 201911550 A | 3/2019 | | |
| WO | WO-2019035252 A1 | * | 2/2019 | ......... H01L 27/1461 |
| WO | WO-2019035254 A1 | * | 2/2019 | ......... H01L 27/14603 |
| WO | 2019044464 A1 | 3/2019 | | |
| WO | WO-2019150987 A1 | 8/2019 | | |
| WO | WO-2019151049 A1 | 8/2019 | | |
| WO | WO-2019181456 A1 | * | 9/2019 | ....... H01L 27/14609 |
| WO | WO-2020017330 A1 | 1/2020 | | |
| WO | WO-2020026851 A1 | 2/2020 | | |

\* cited by examiner

[FIG. 2]
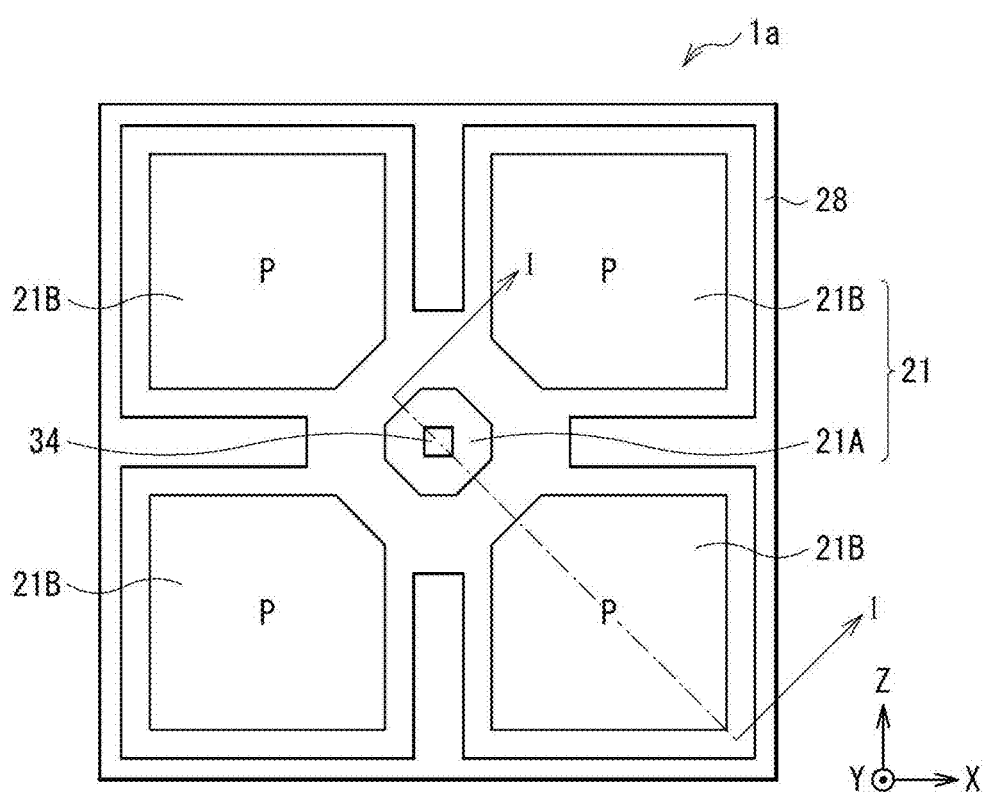

[ FIG. 3 ]
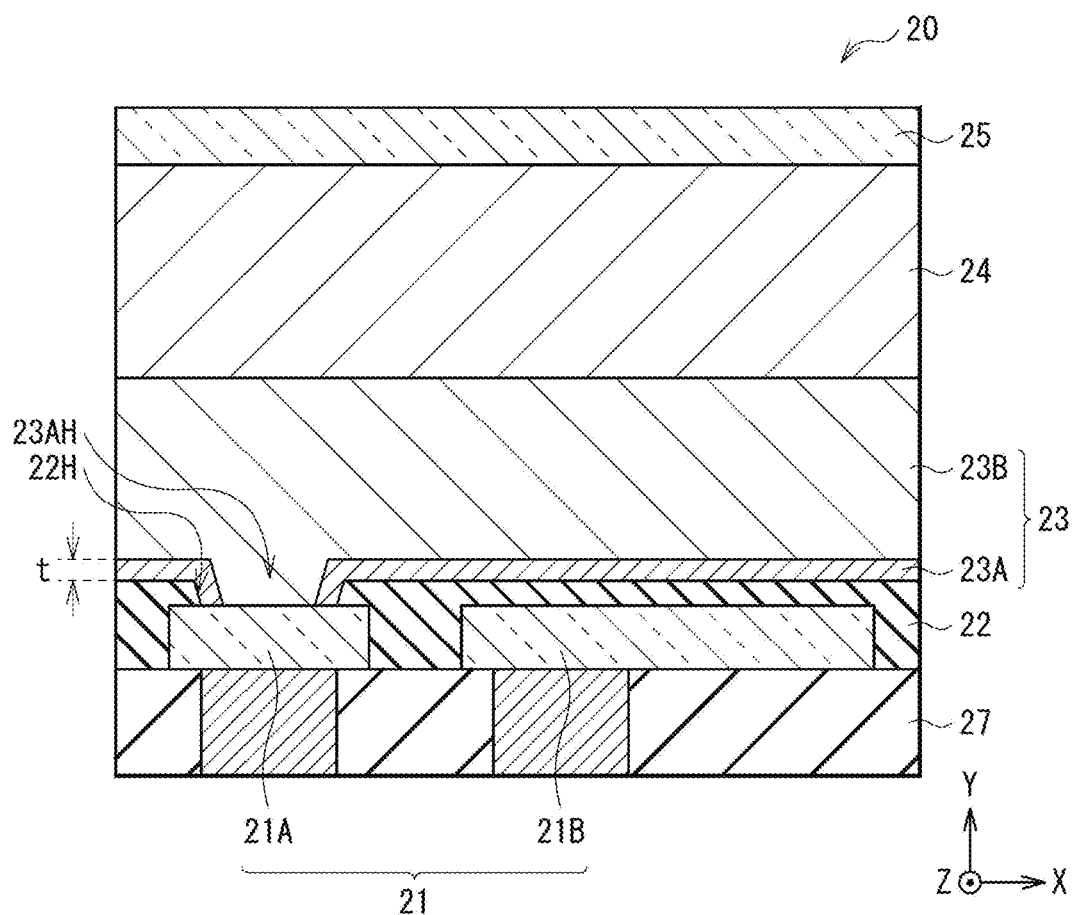

[ FIG. 4A ]
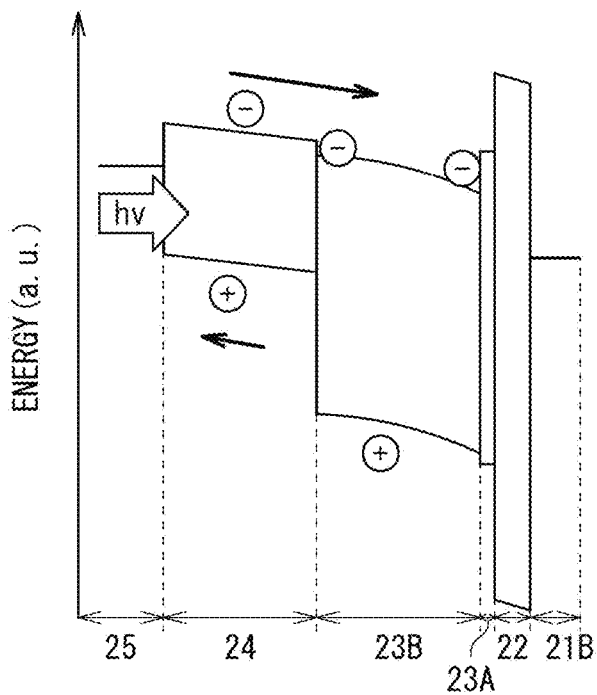
[ FIG. 4B ]
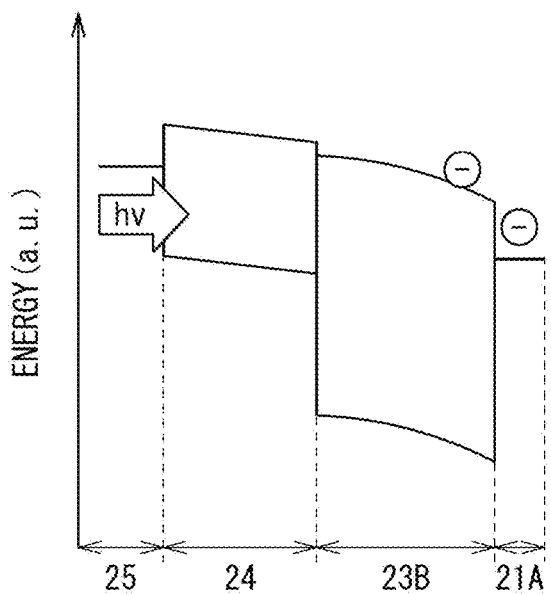

[FIG. 5]
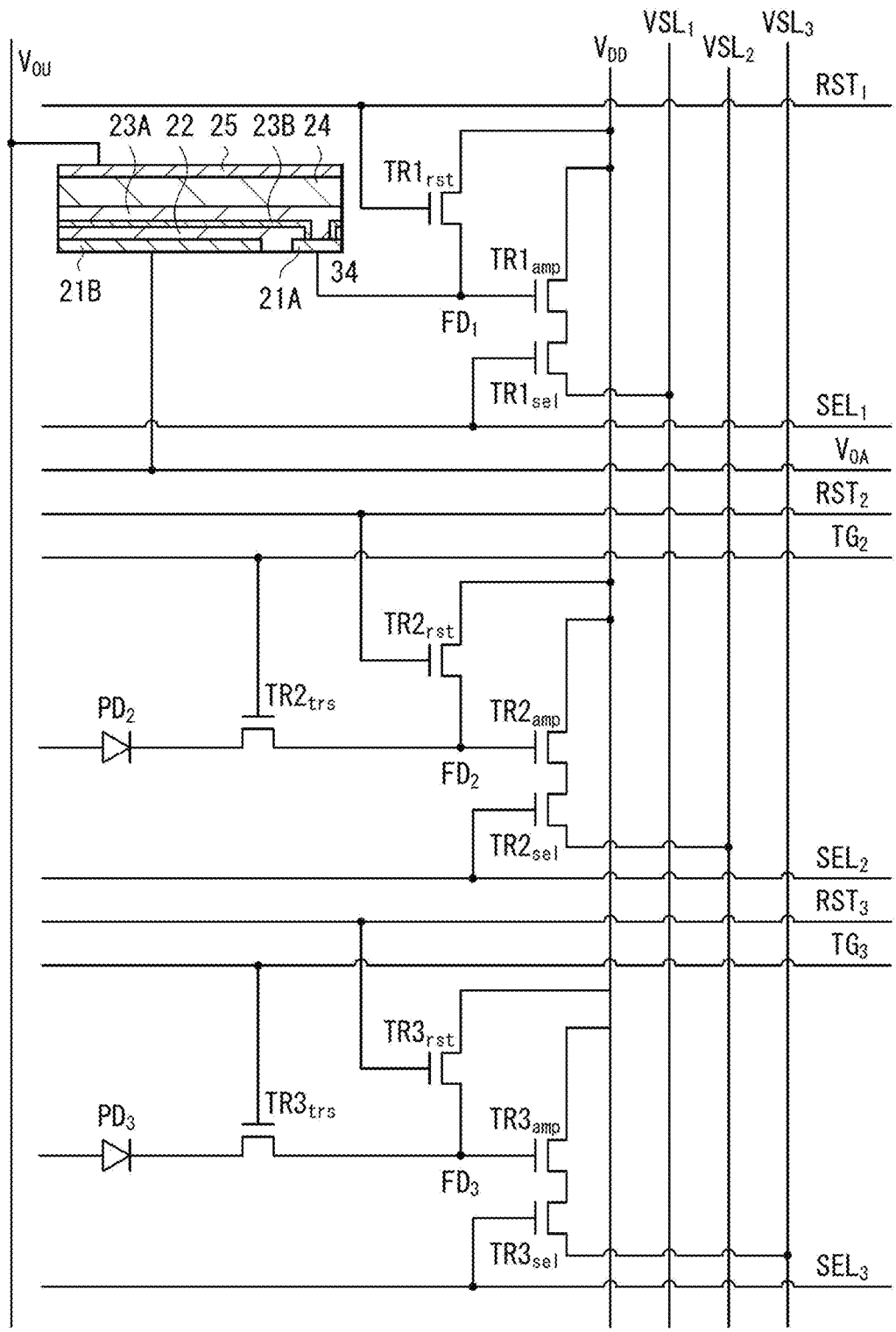

[FIG. 6]
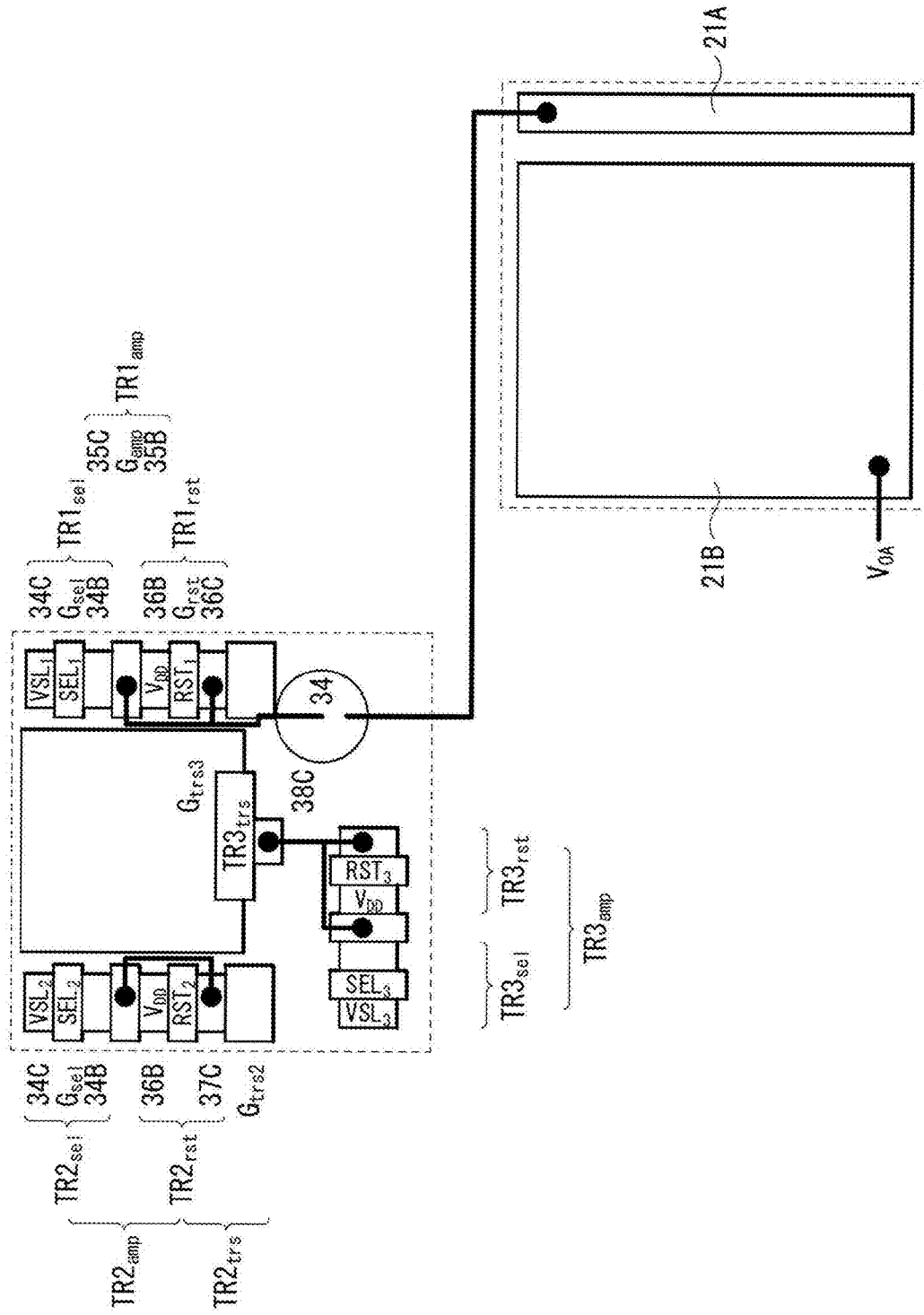

[FIG 7.]
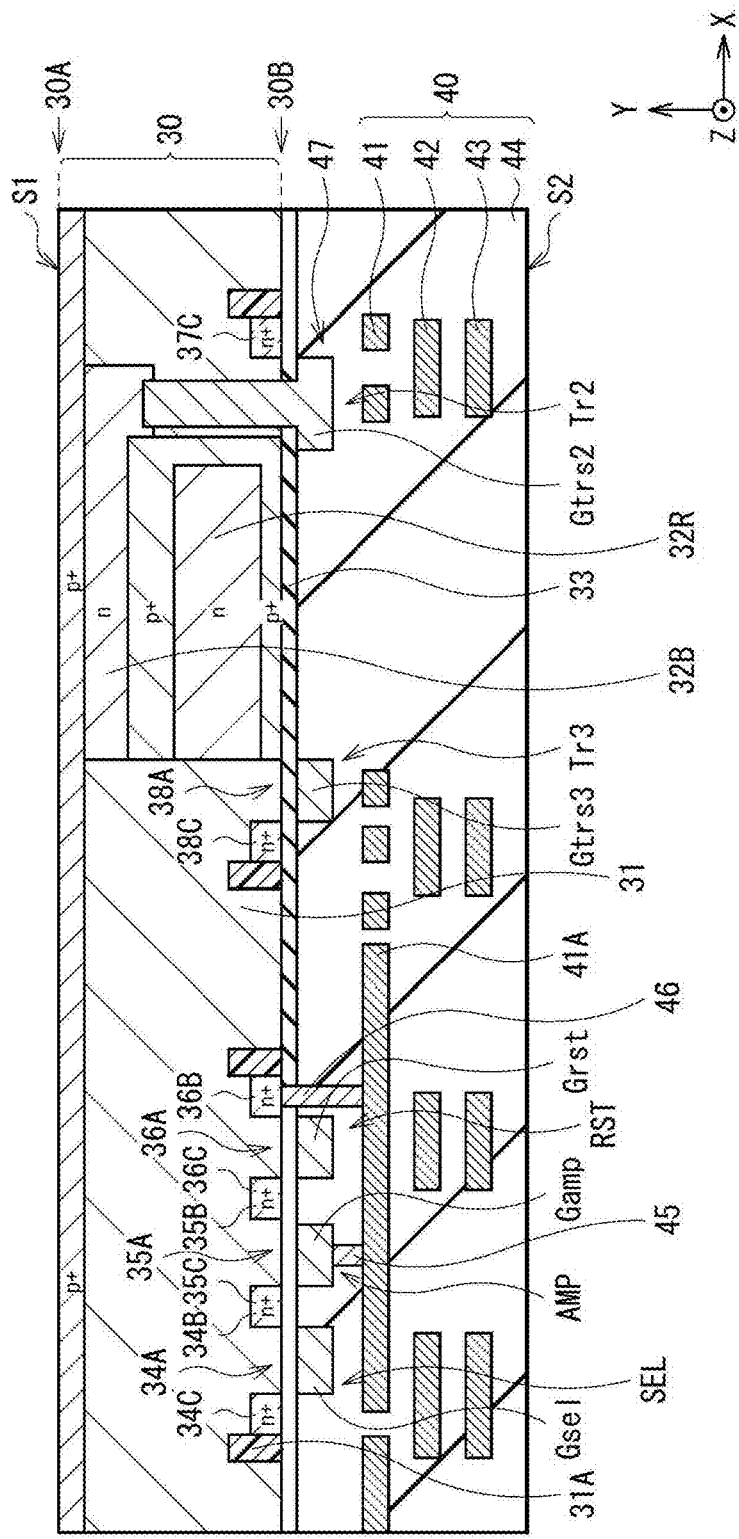

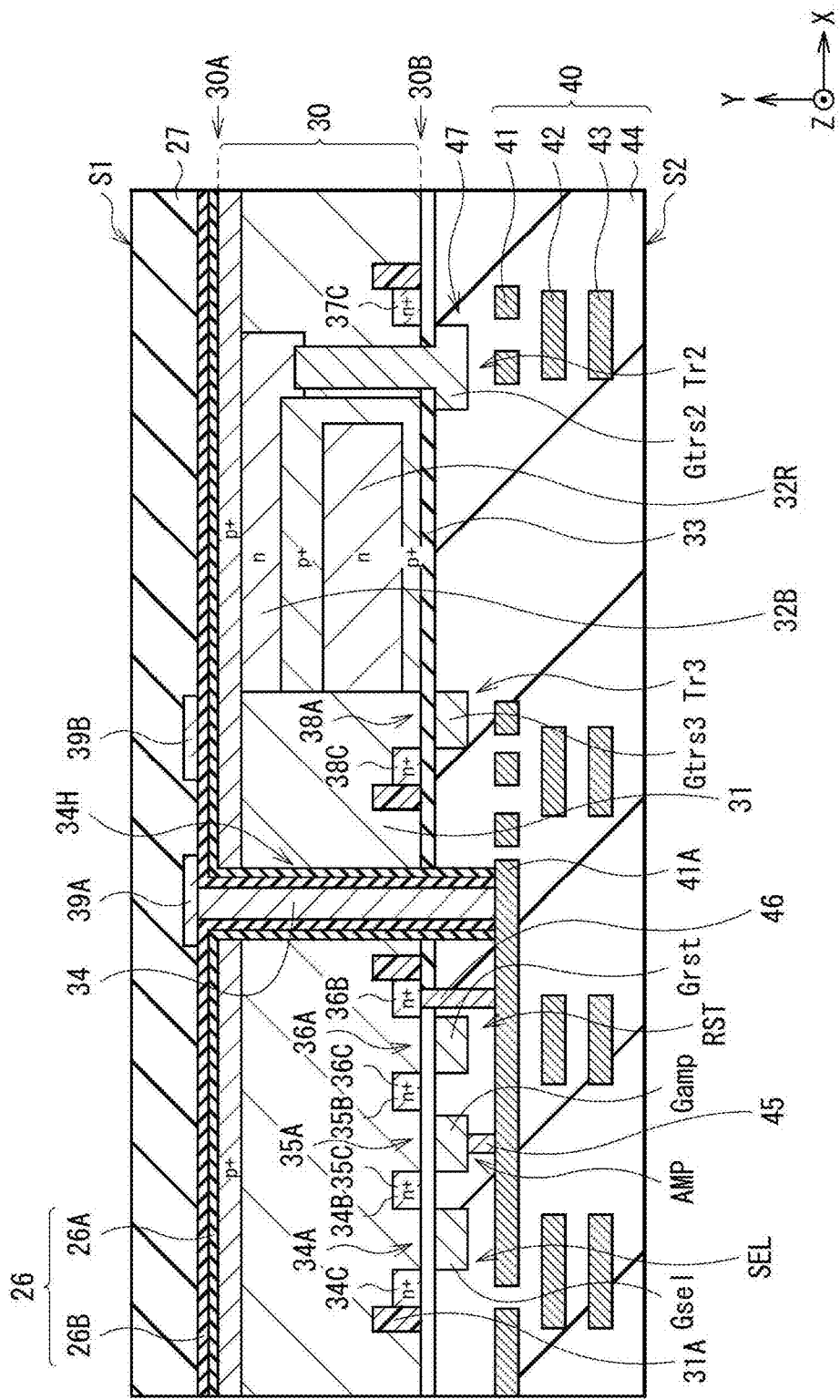
[FIG. 8]

[FIG. 9]
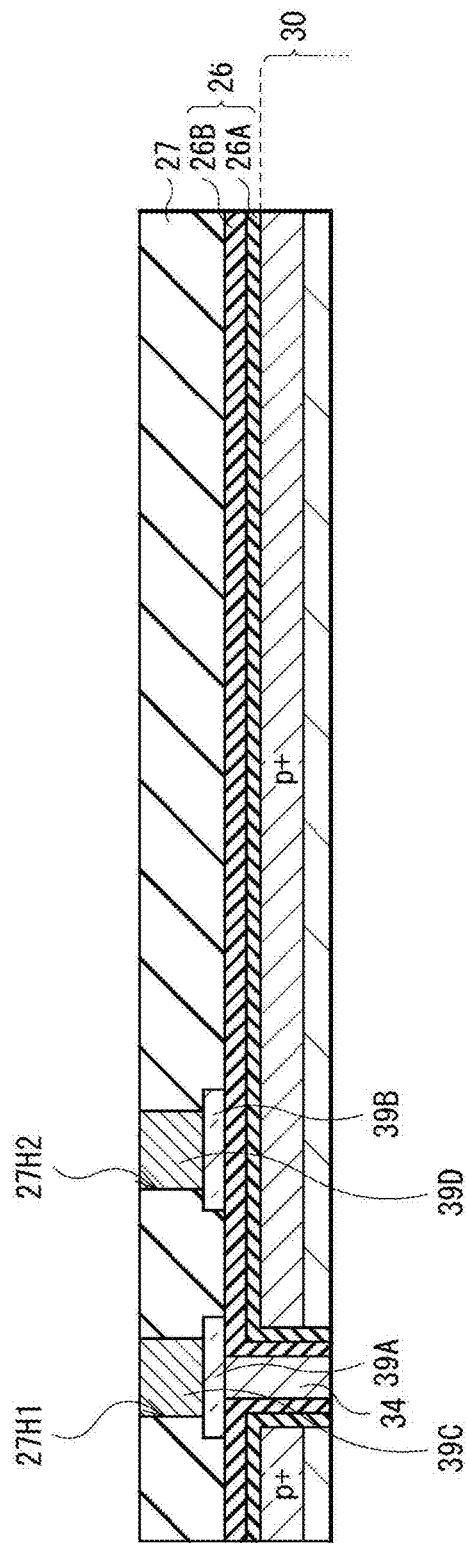

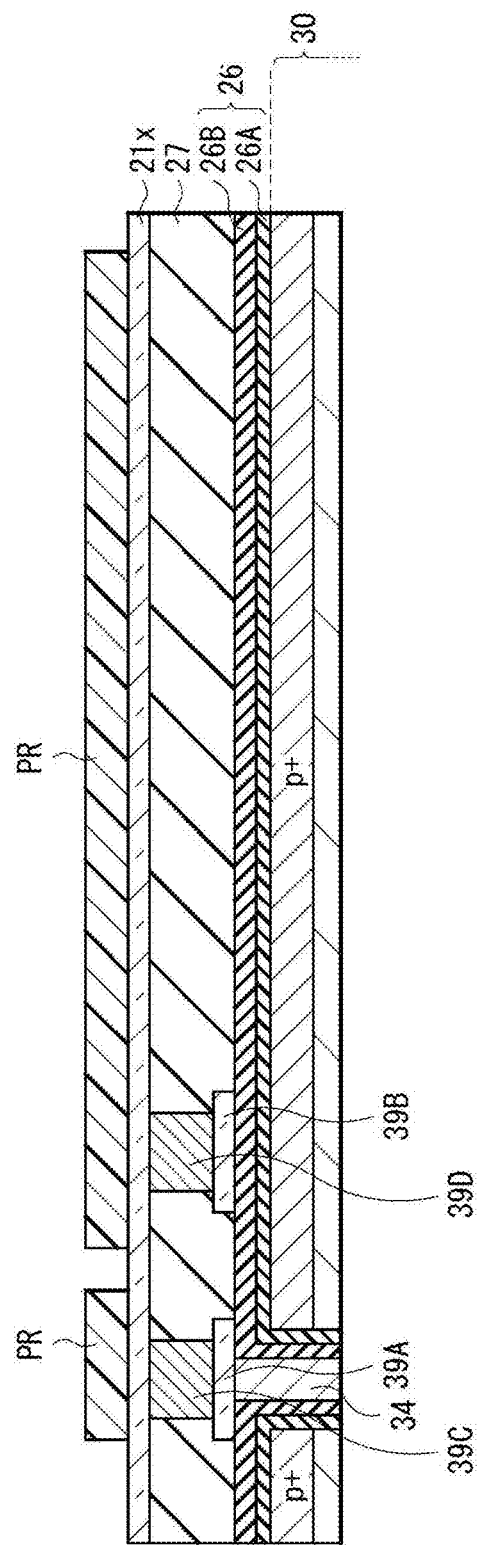
[FIG. 10]

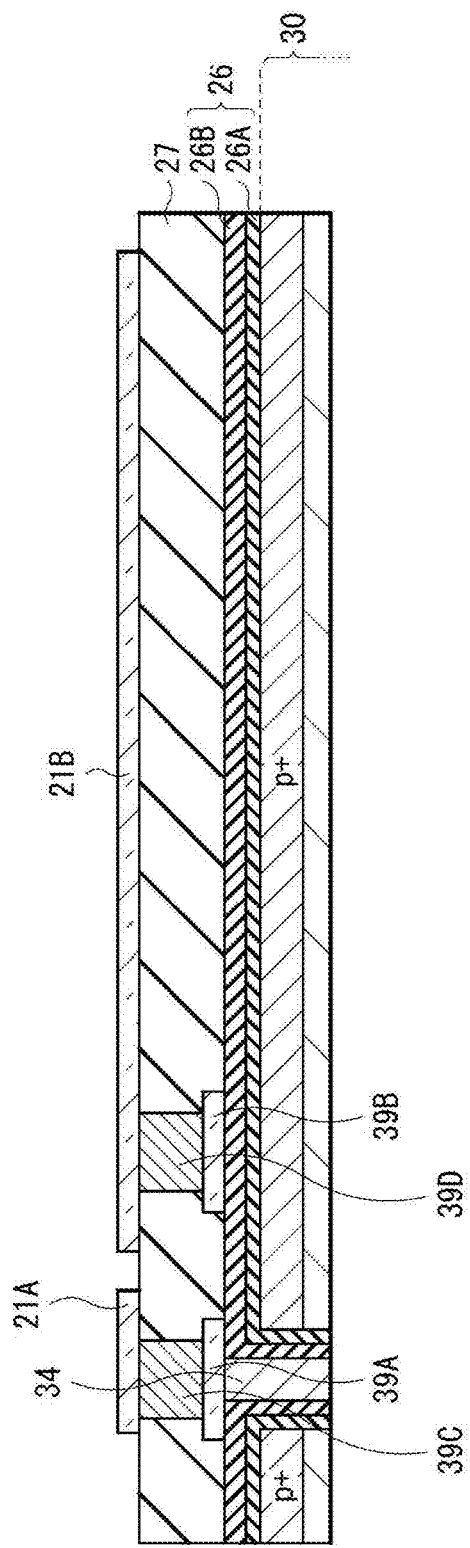
[FIG. 11]

[FIG. 12]
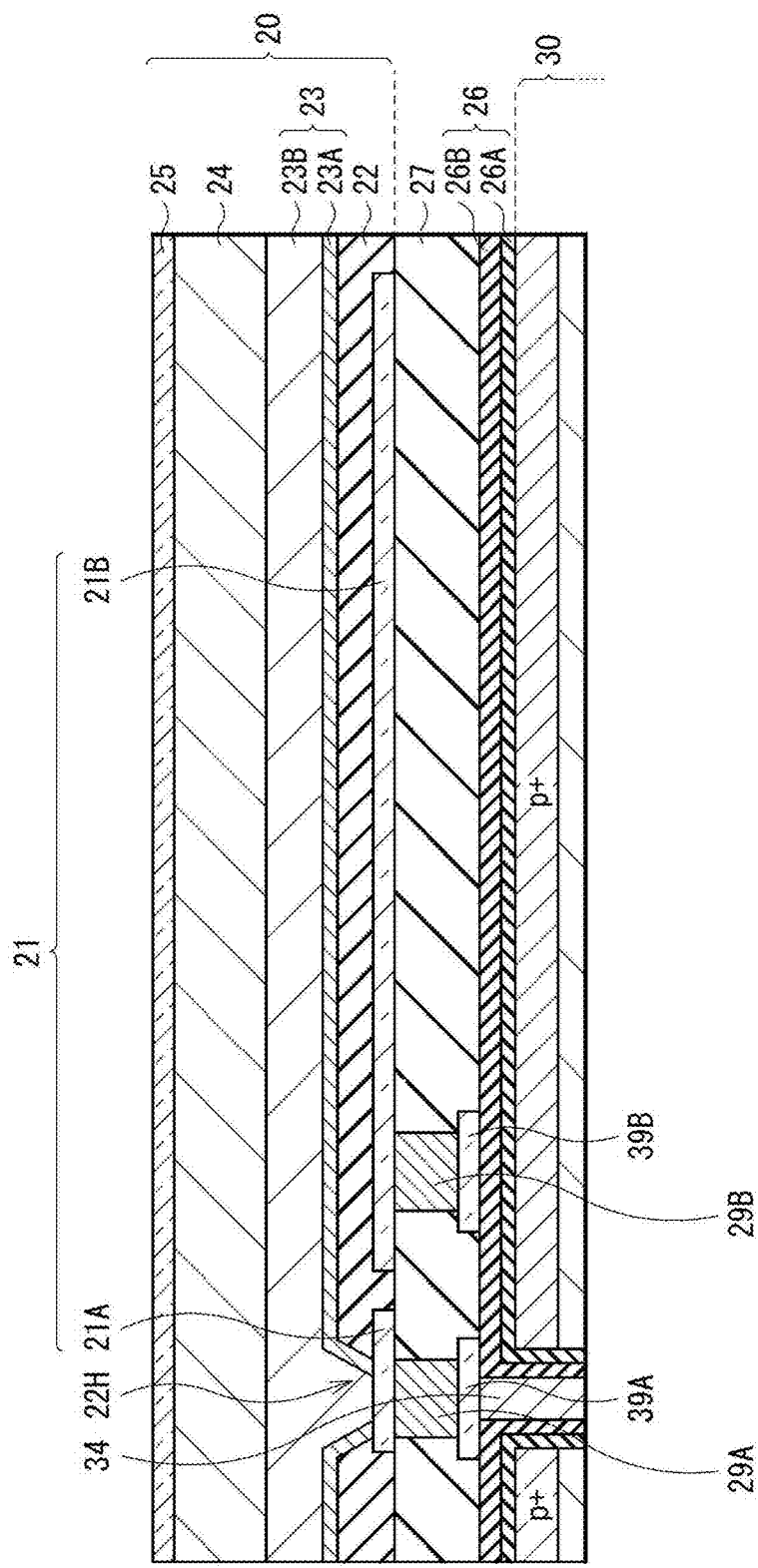

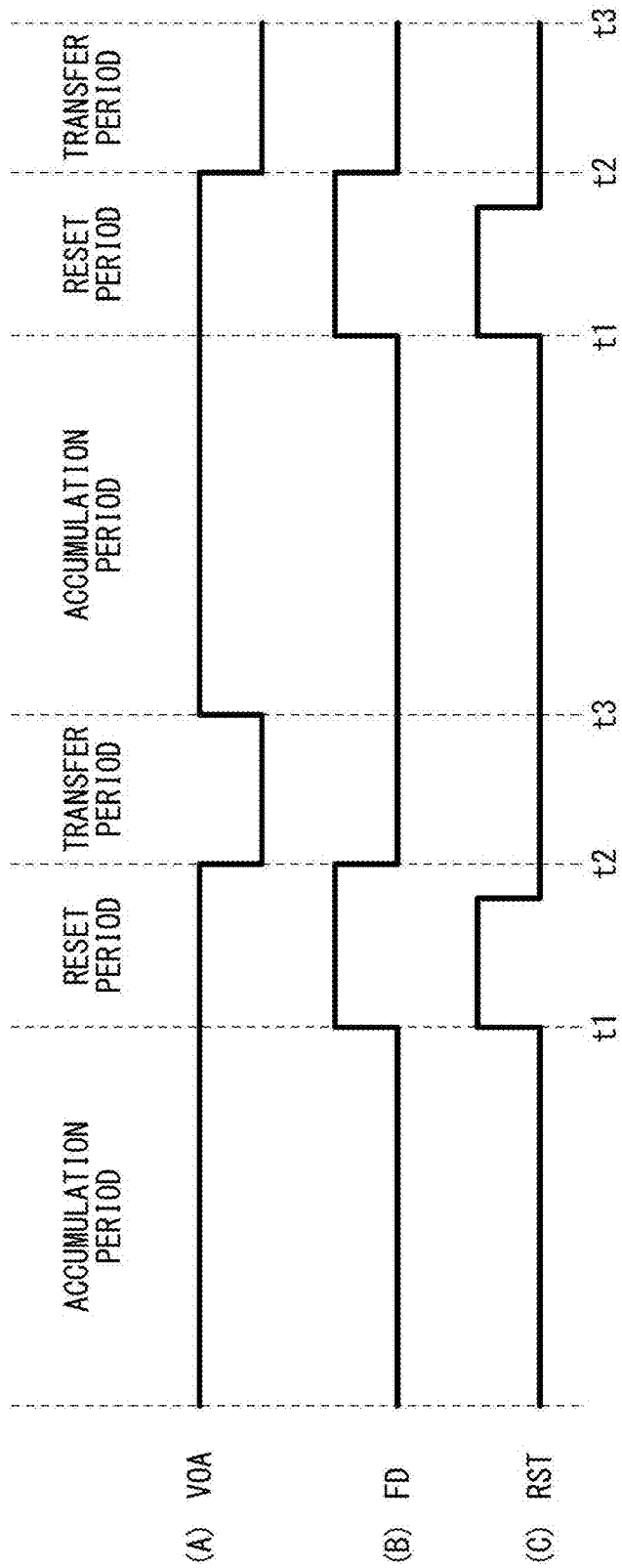
[FIG. 13]

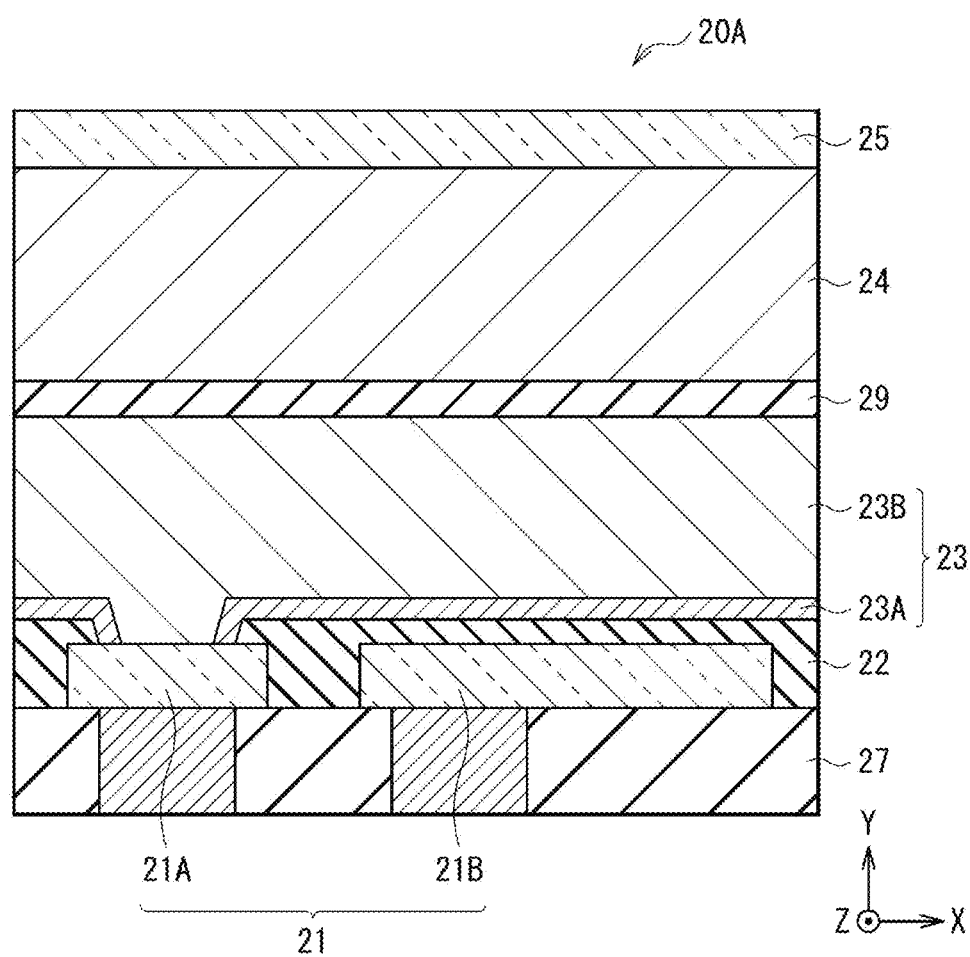
[FIG. 14]

[ FIG. 15A ]
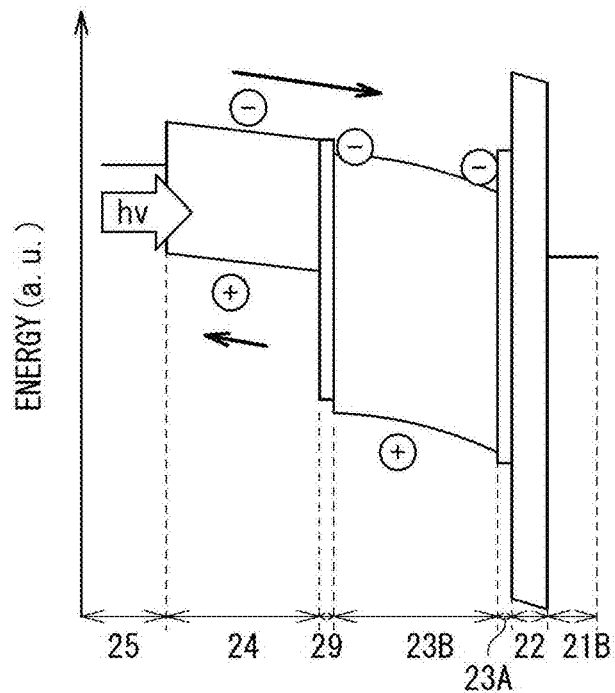
[ FIG. 15B ]
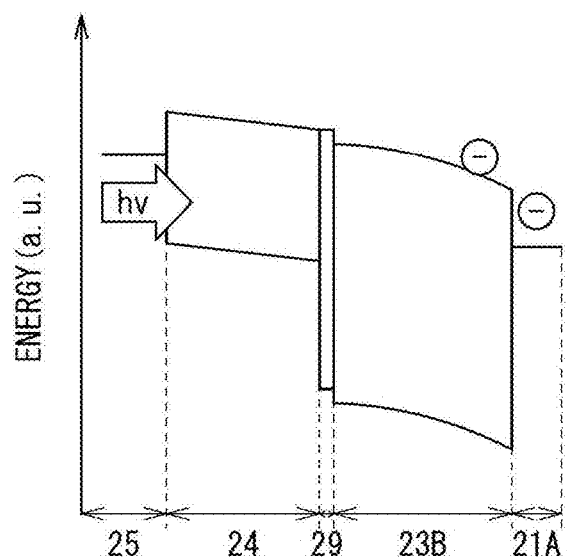

[ FIG. 16 ]
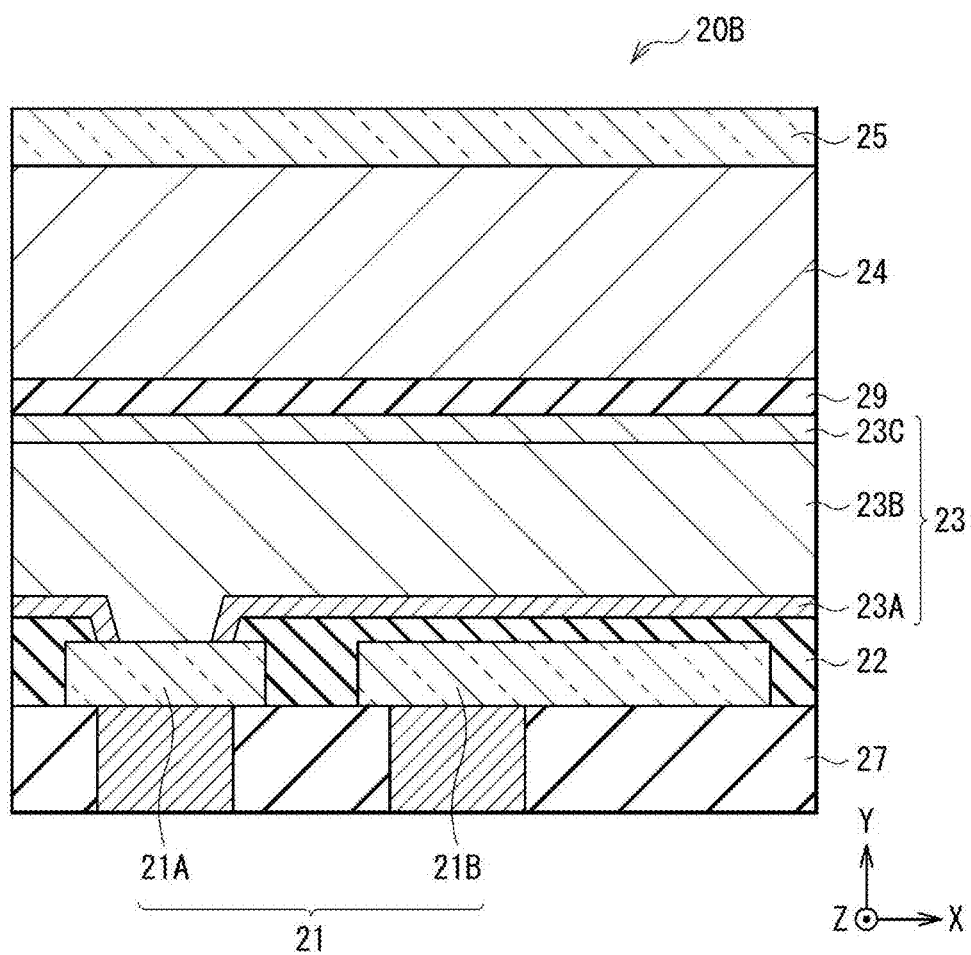

[FIG. 17]
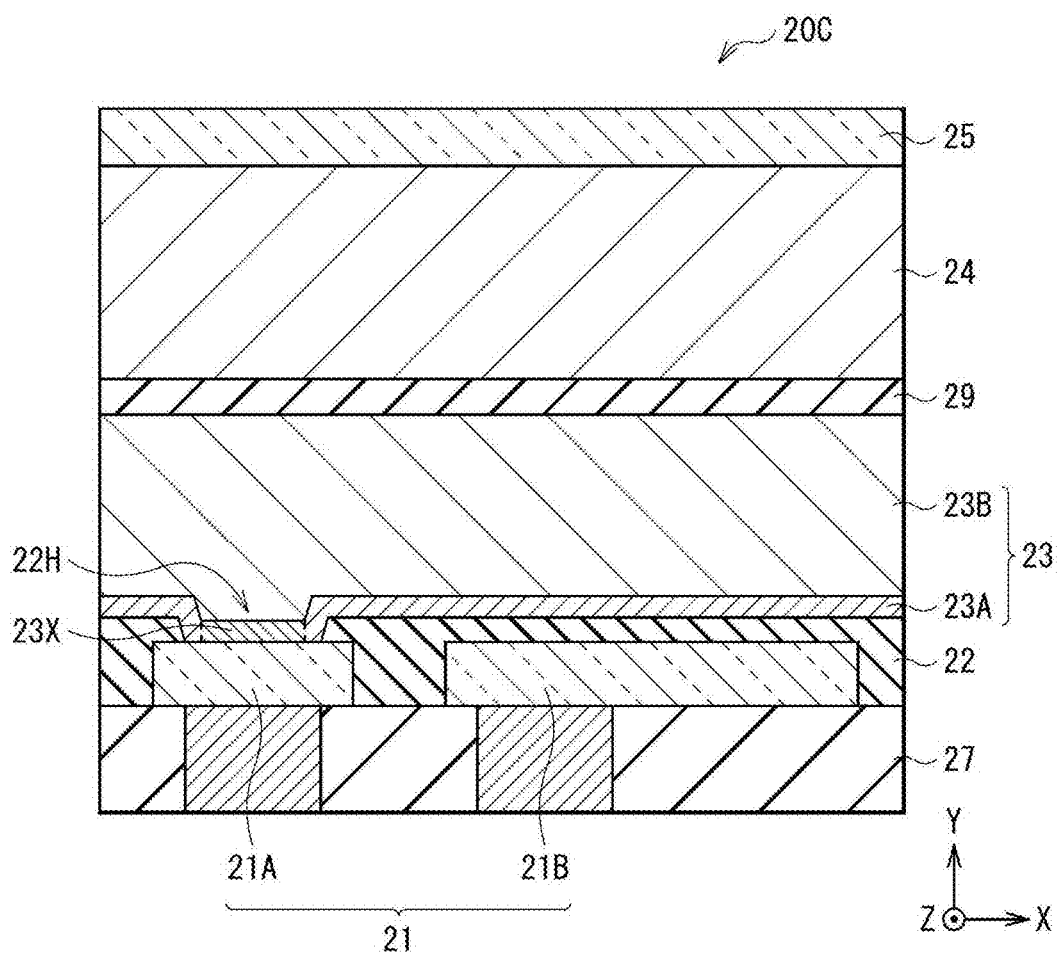

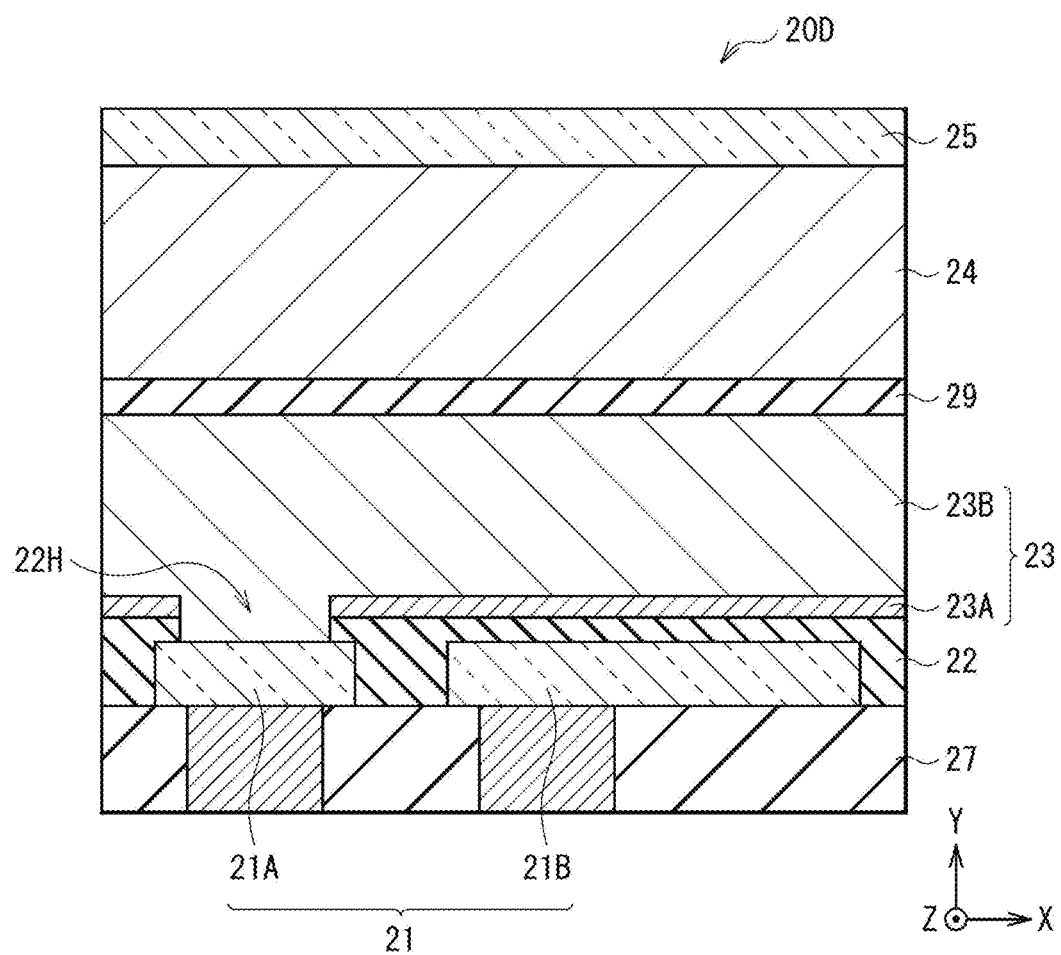
[FIG. 18]

[FIG. 19]
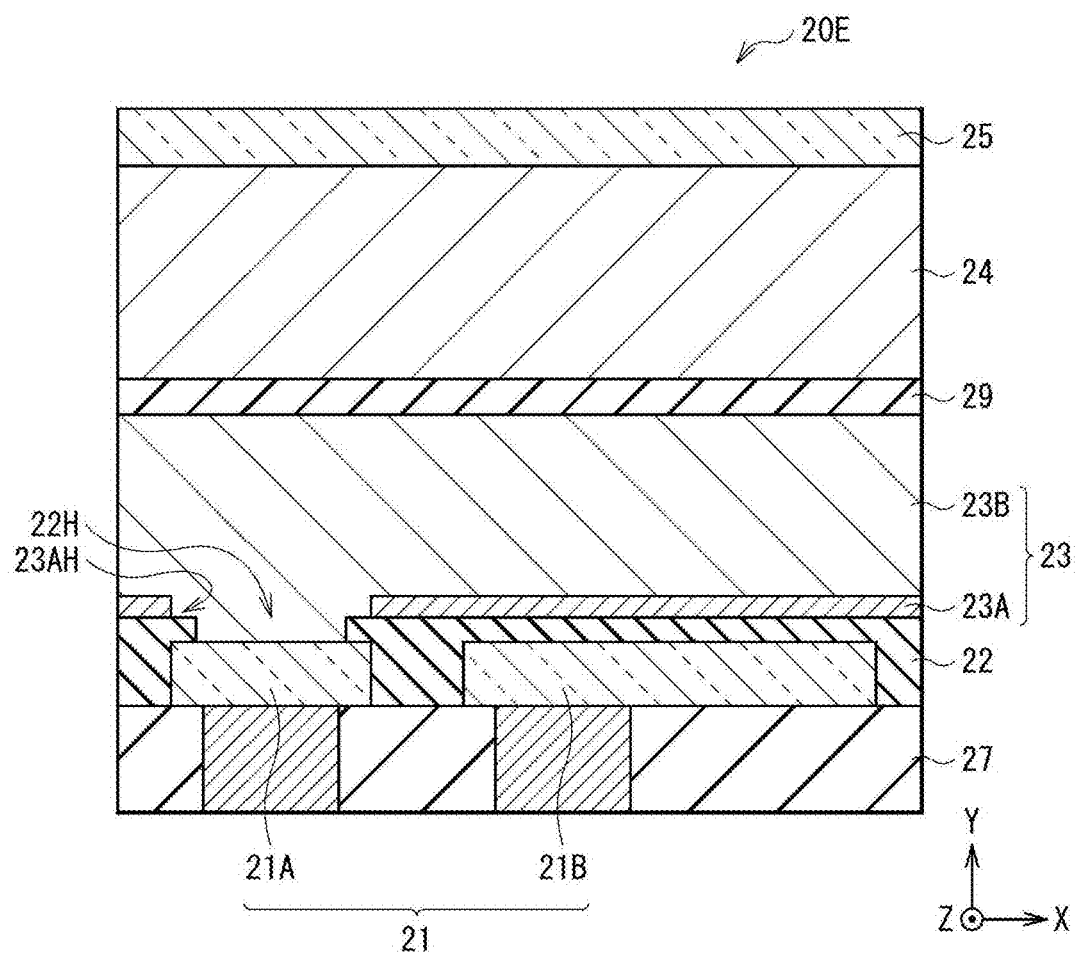

[ FIG. 20 ]
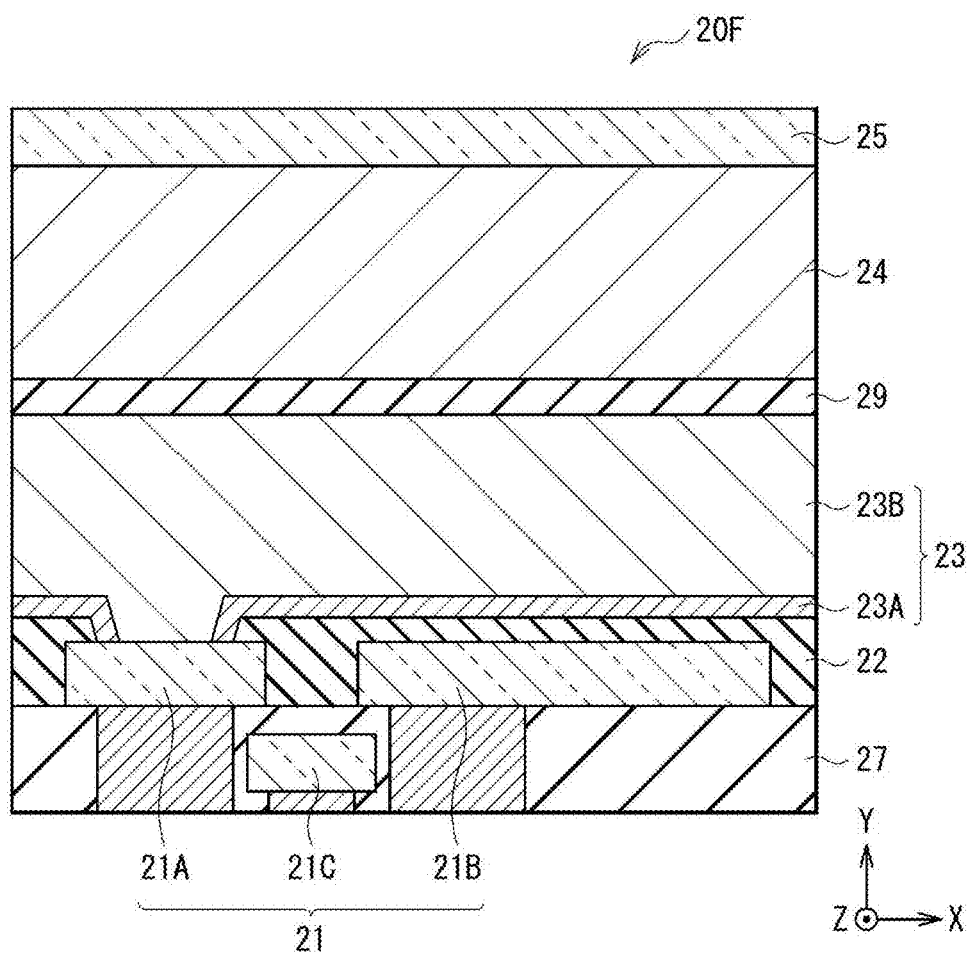

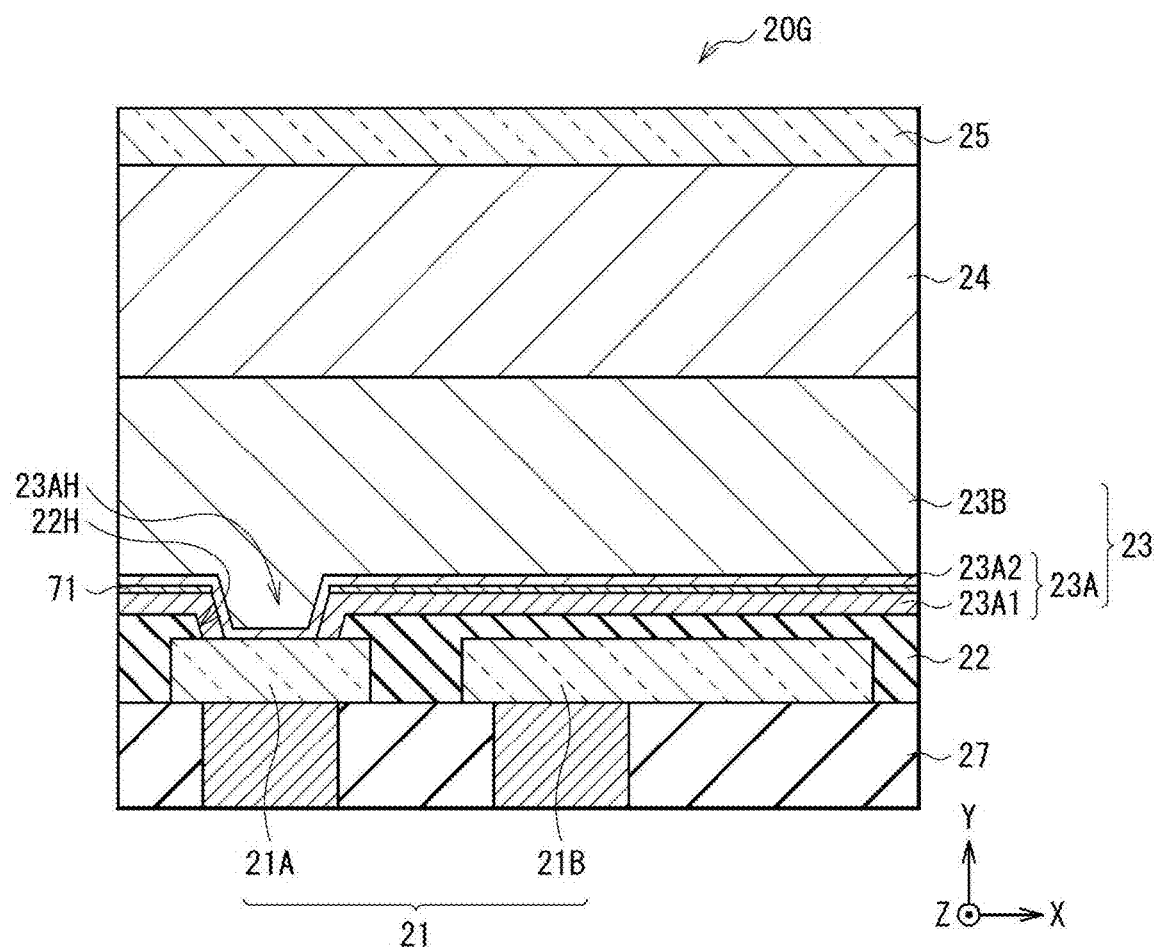
[FIG. 21]

[FIG. 22A]
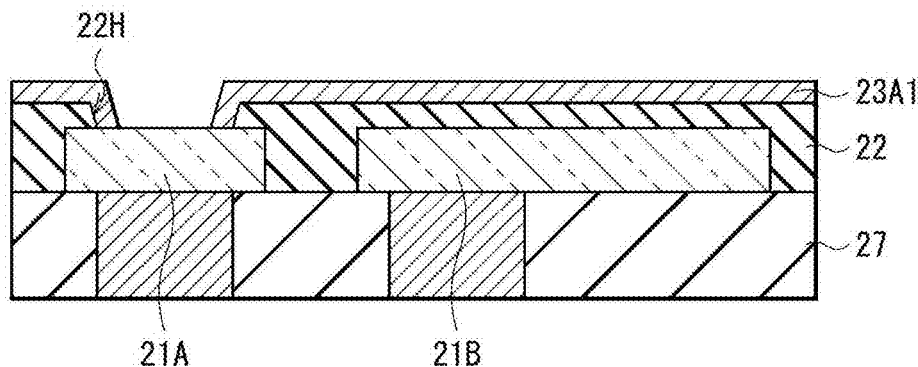
[FIG. 22B]
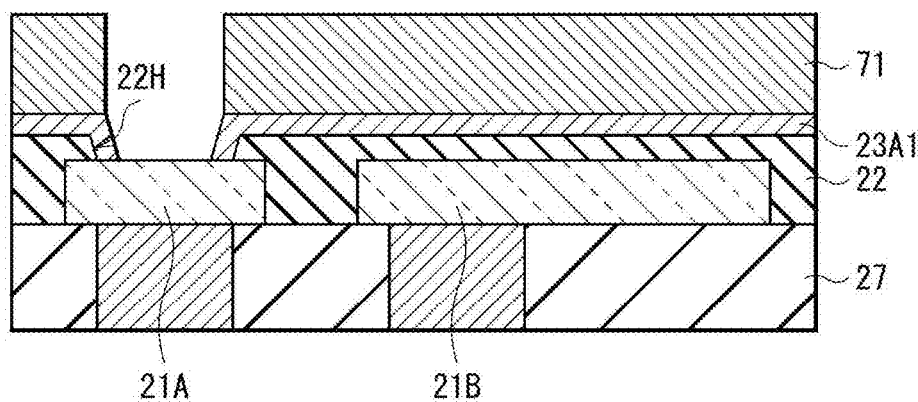
[FIG. 22C]
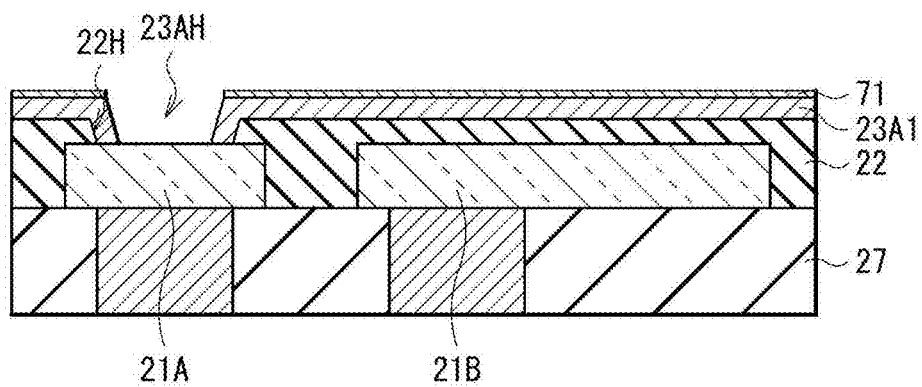

[ FIG. 22D ]
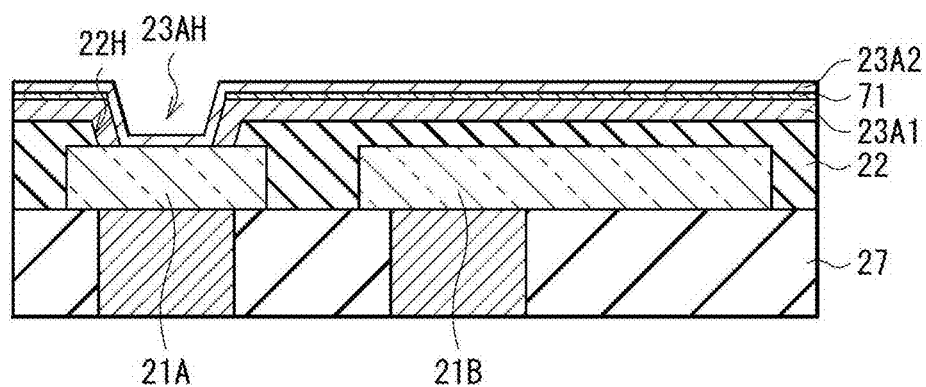
[ FIG. 22E ]
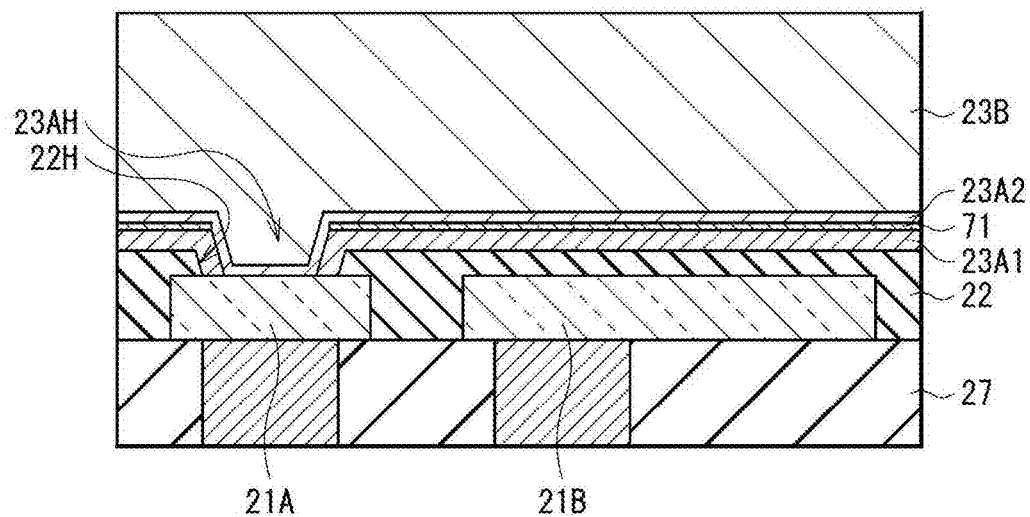

[ FIG. 23 ]
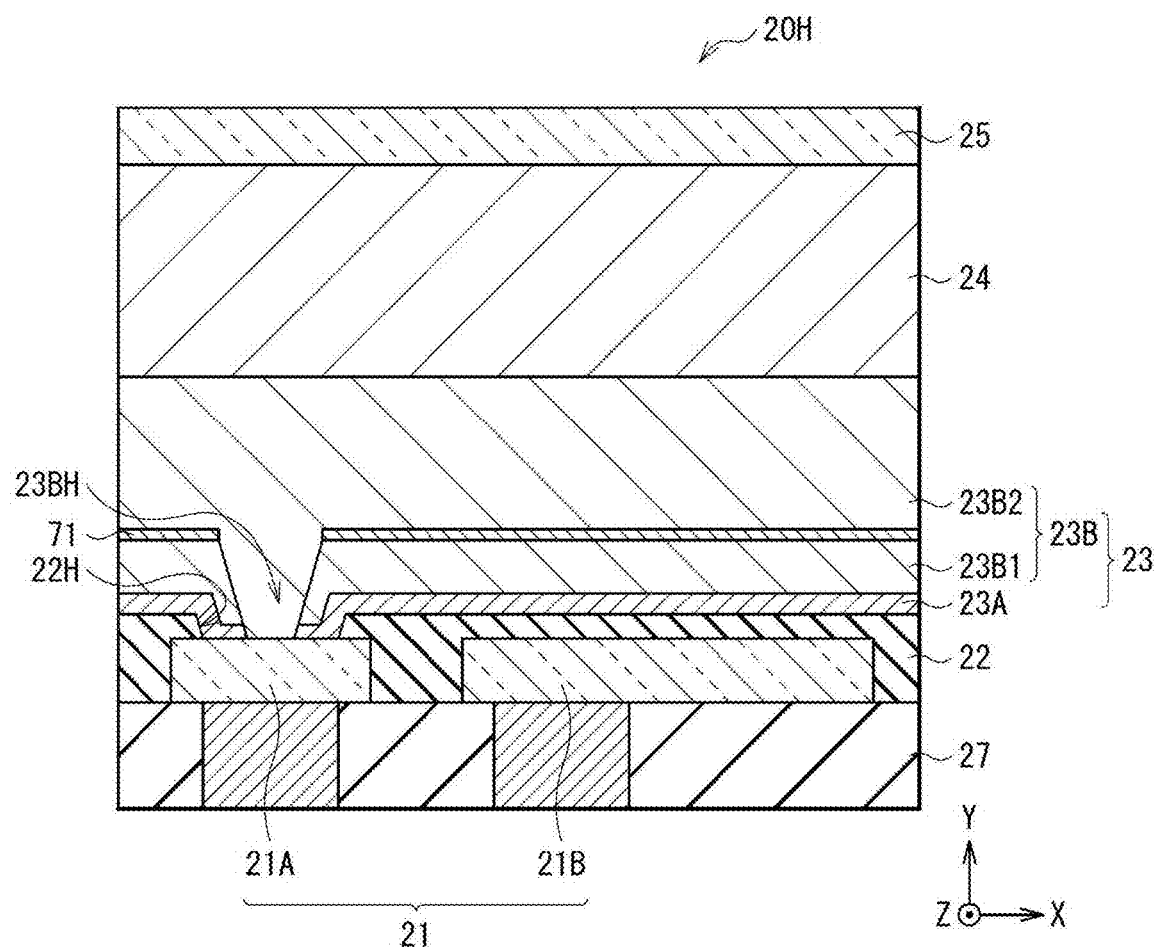

[ FIG. 24A ]
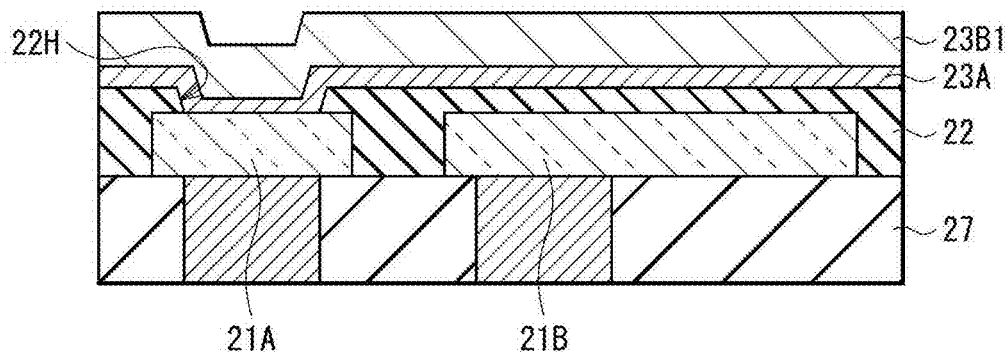
[ FIG. 24B ]
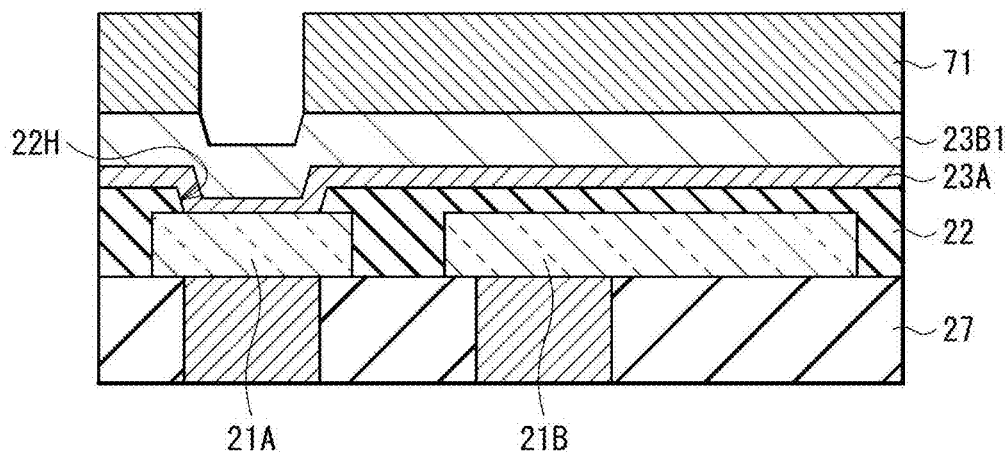
[ FIG. 24C ]
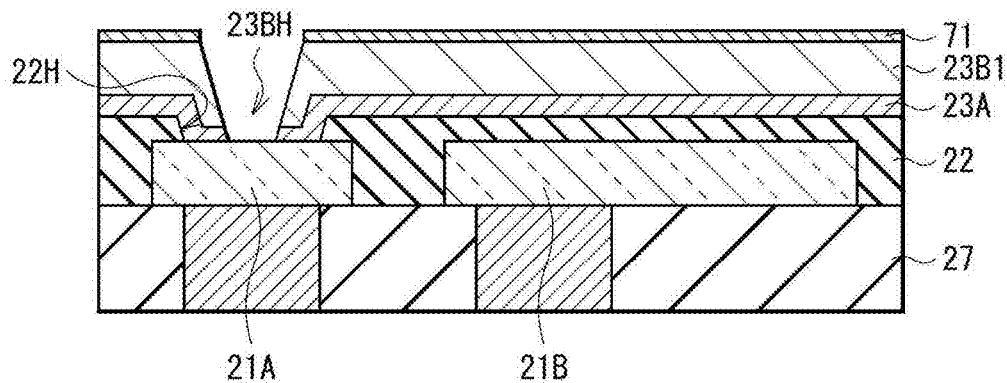

[ FIG. 24D ]
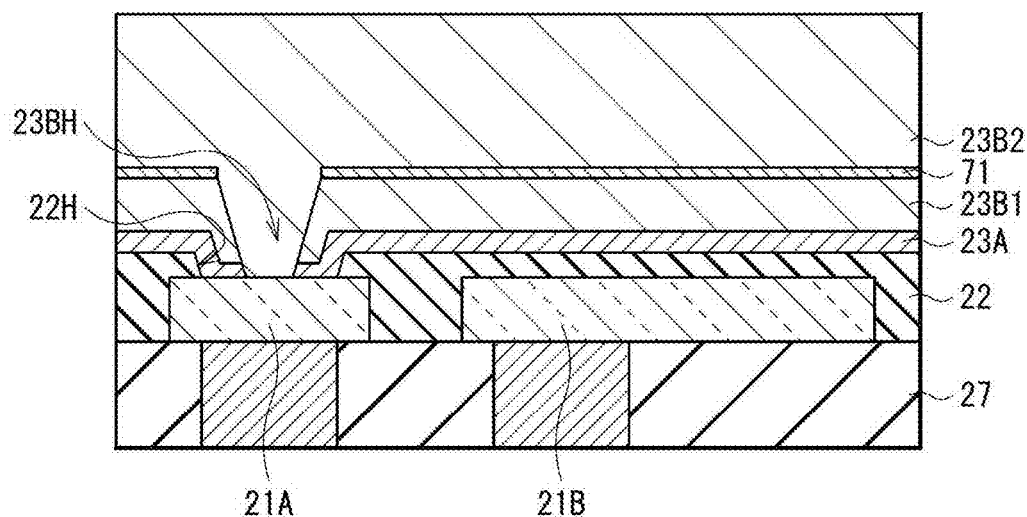

[FIG. 25]
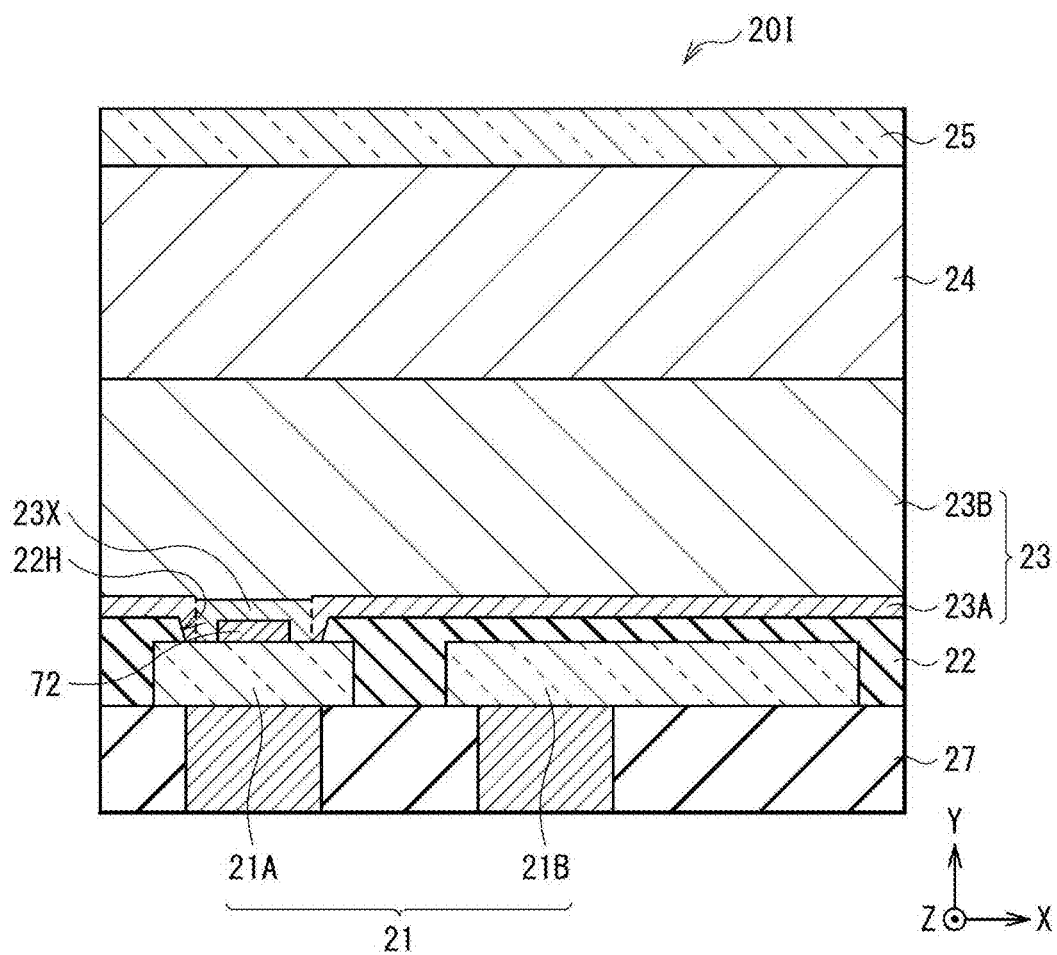

[FIG. 26A]
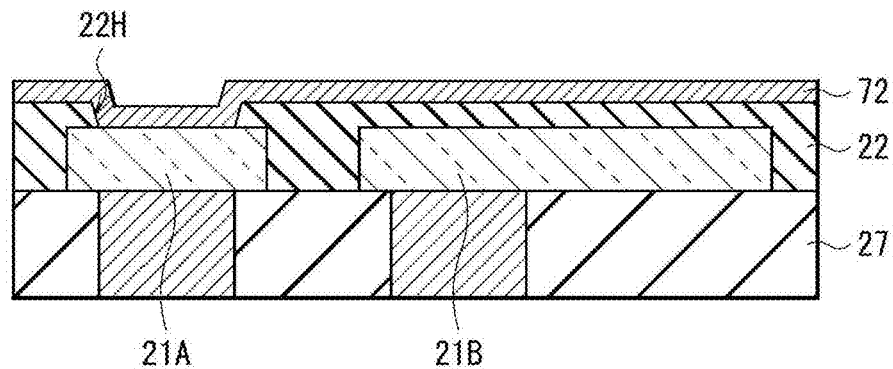
[FIG. 26B]
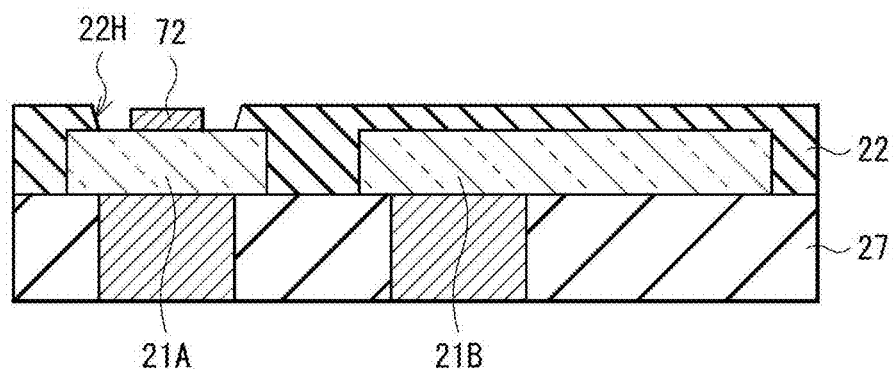
[FIG. 26C]
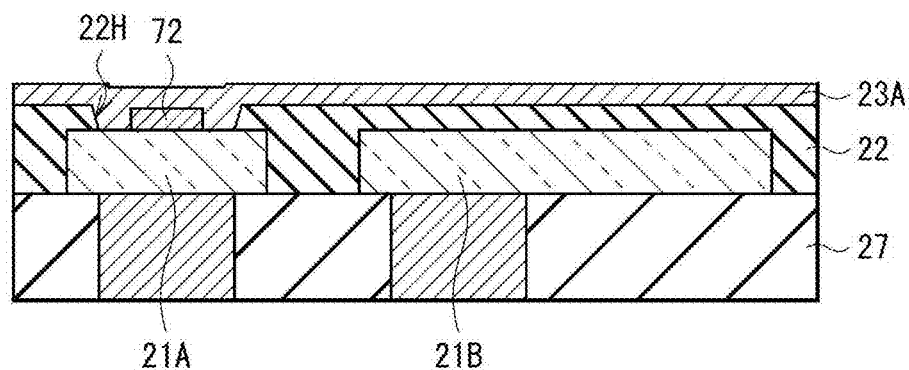

[FIG. 26D]
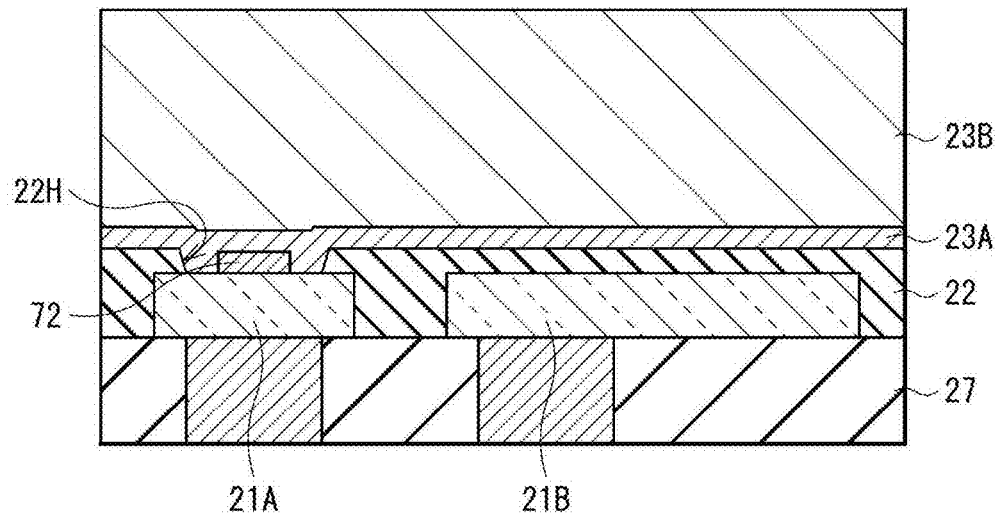
[FIG. 26E]
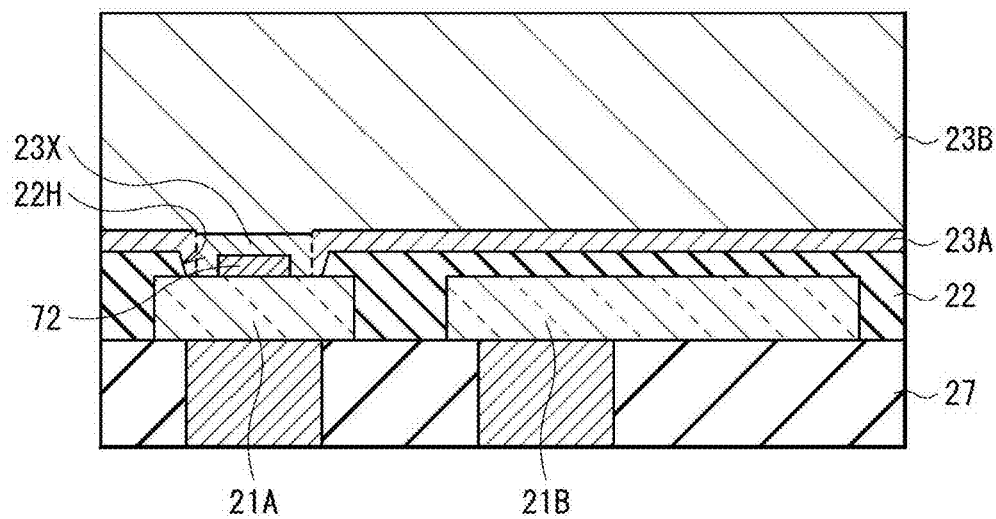

[FIG. 27]
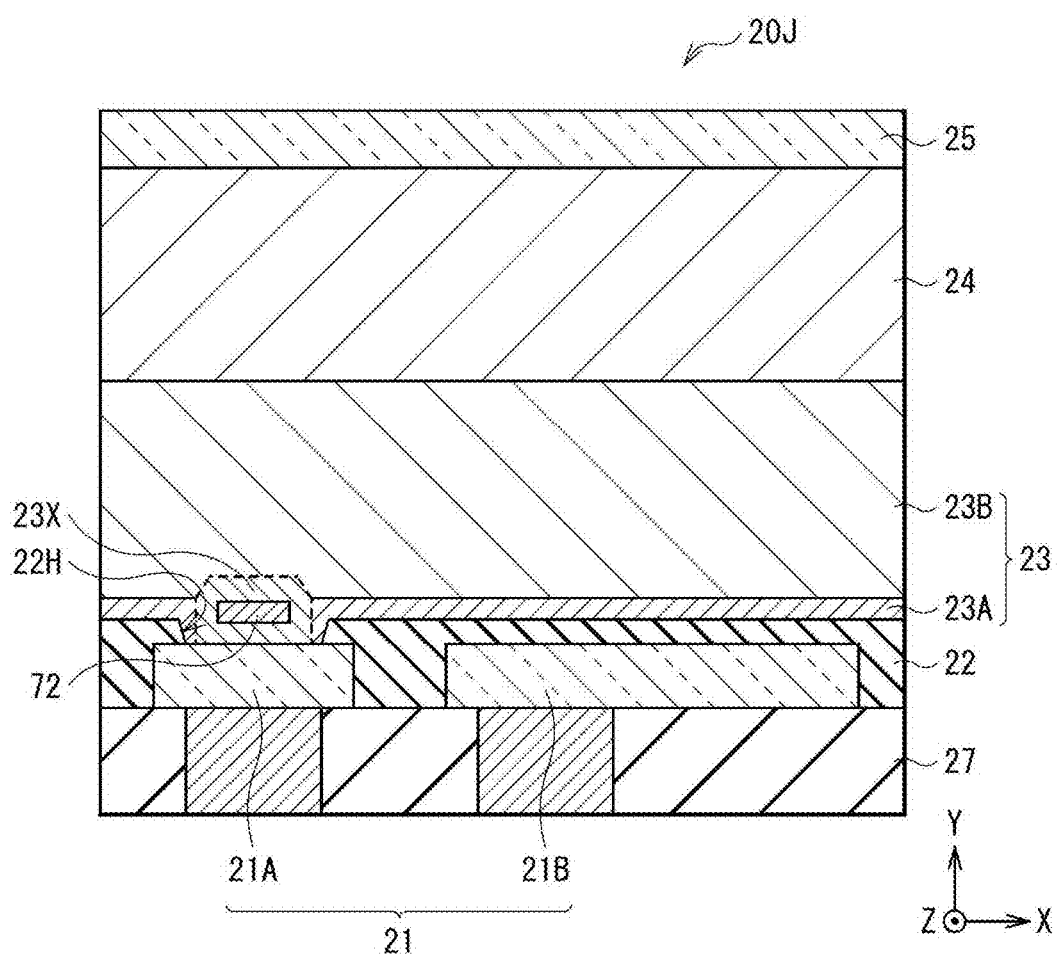

[FIG. 28]
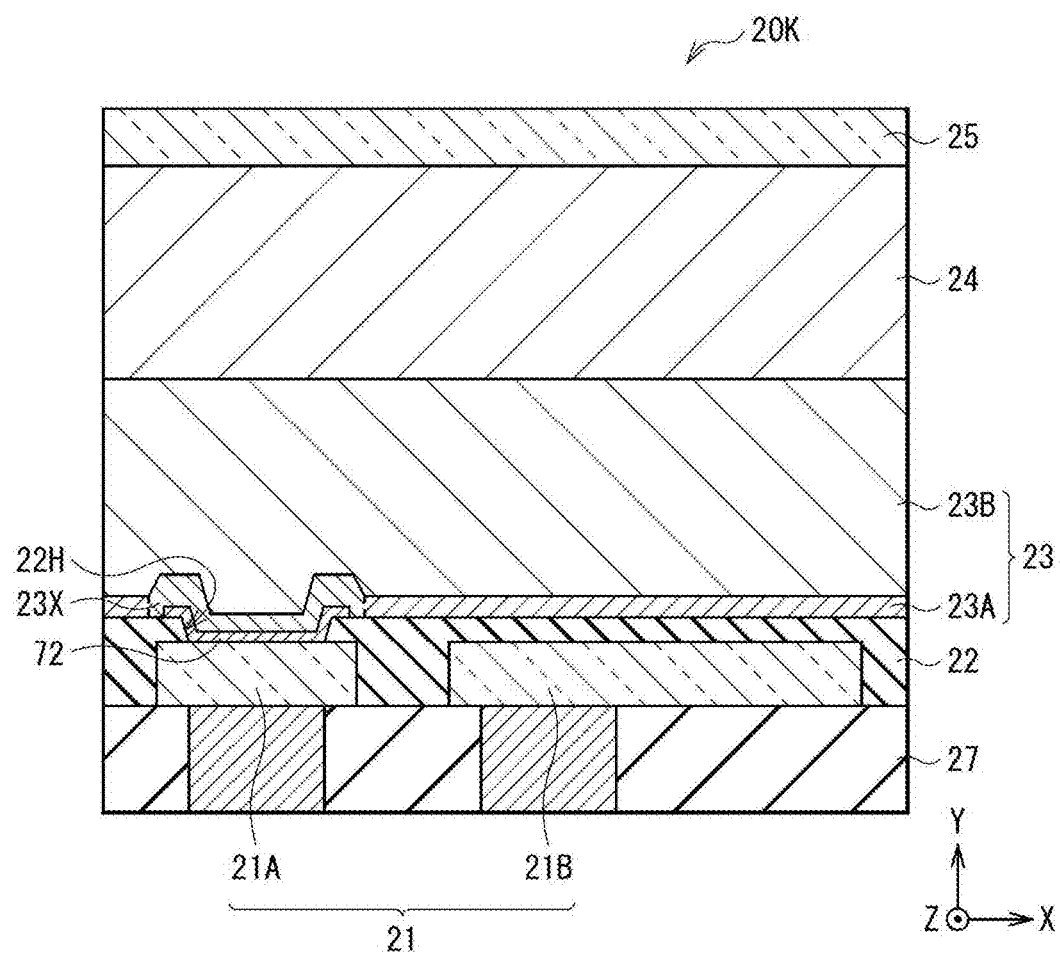

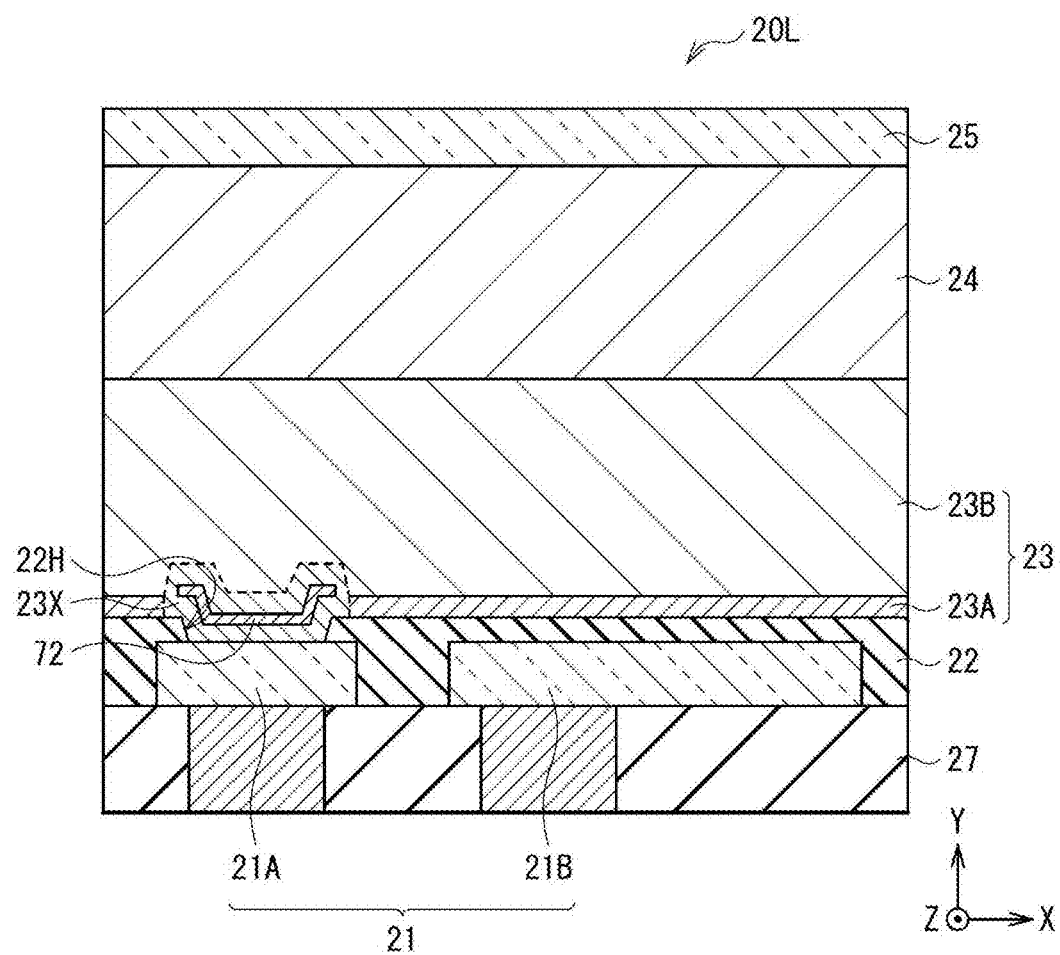
[FIG. 29]

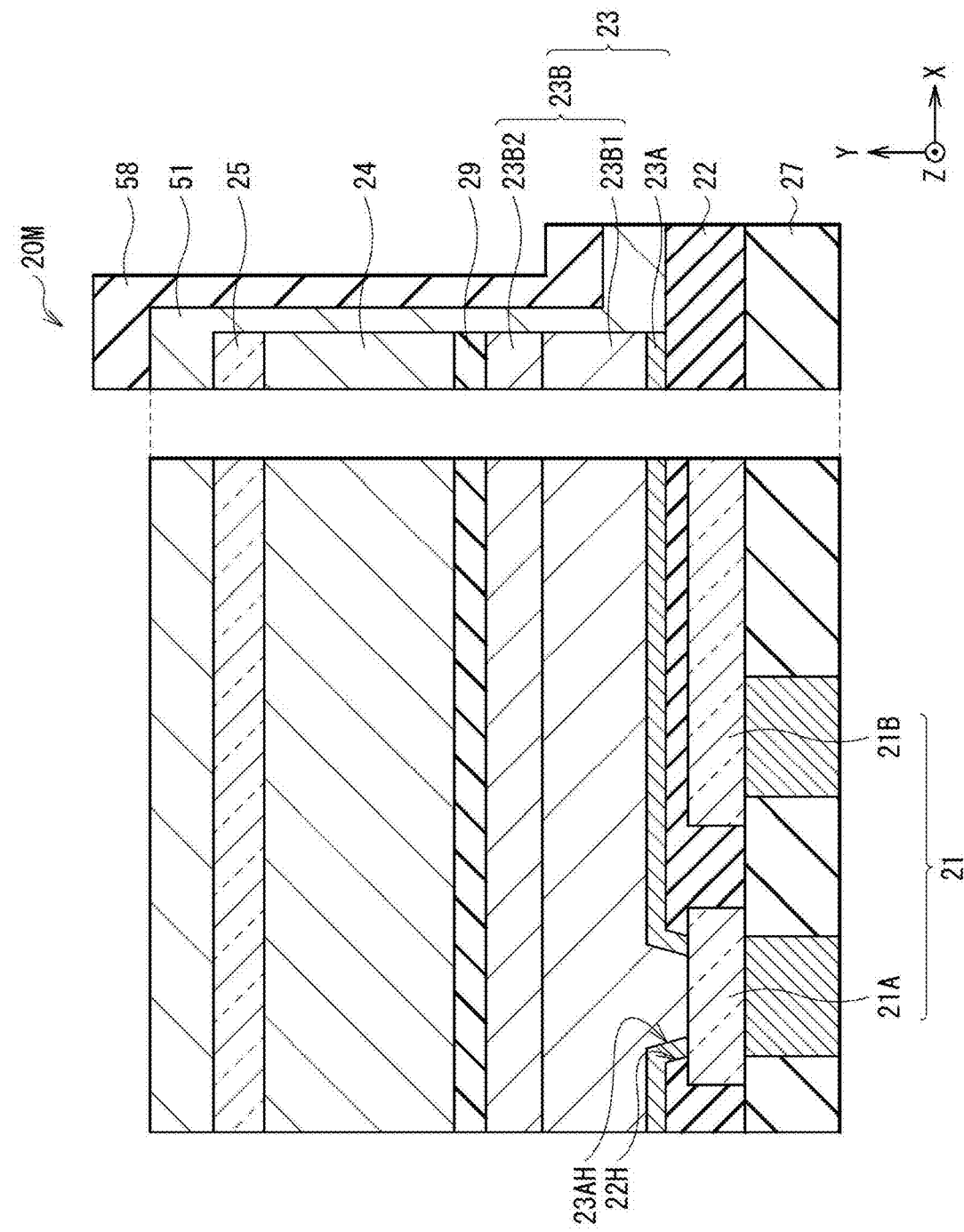
[FIG. 30]

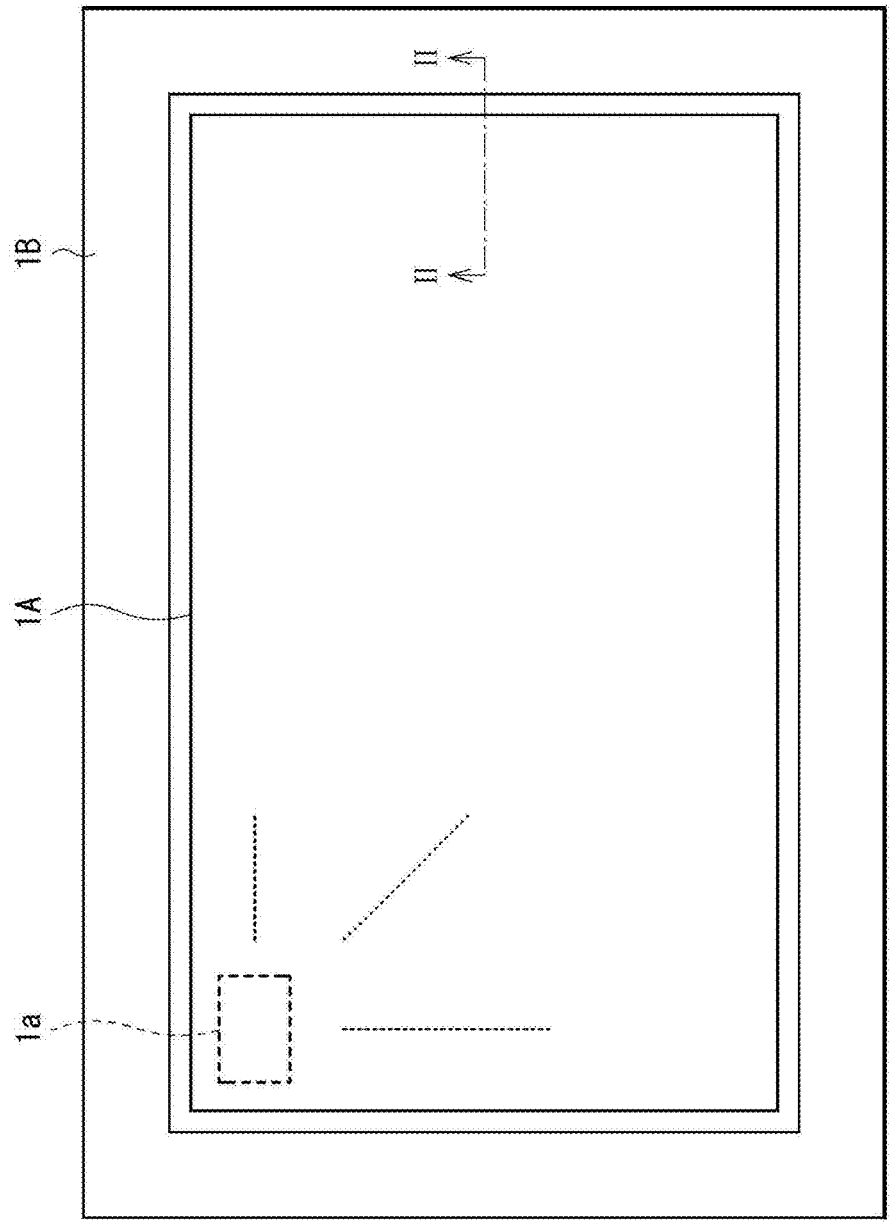

[ FIG. 32A ]
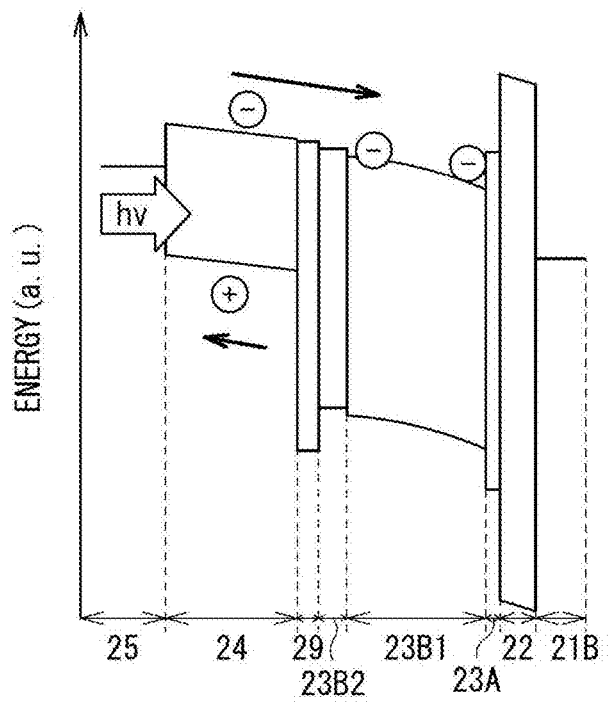
[ FIG. 32B ]
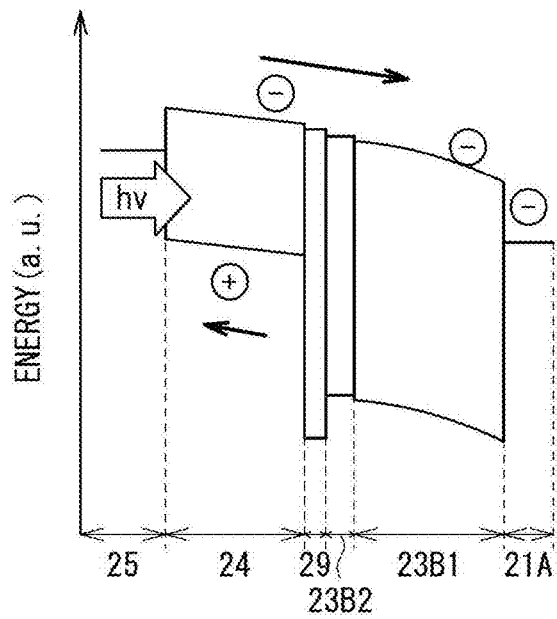

[FIG. 34]
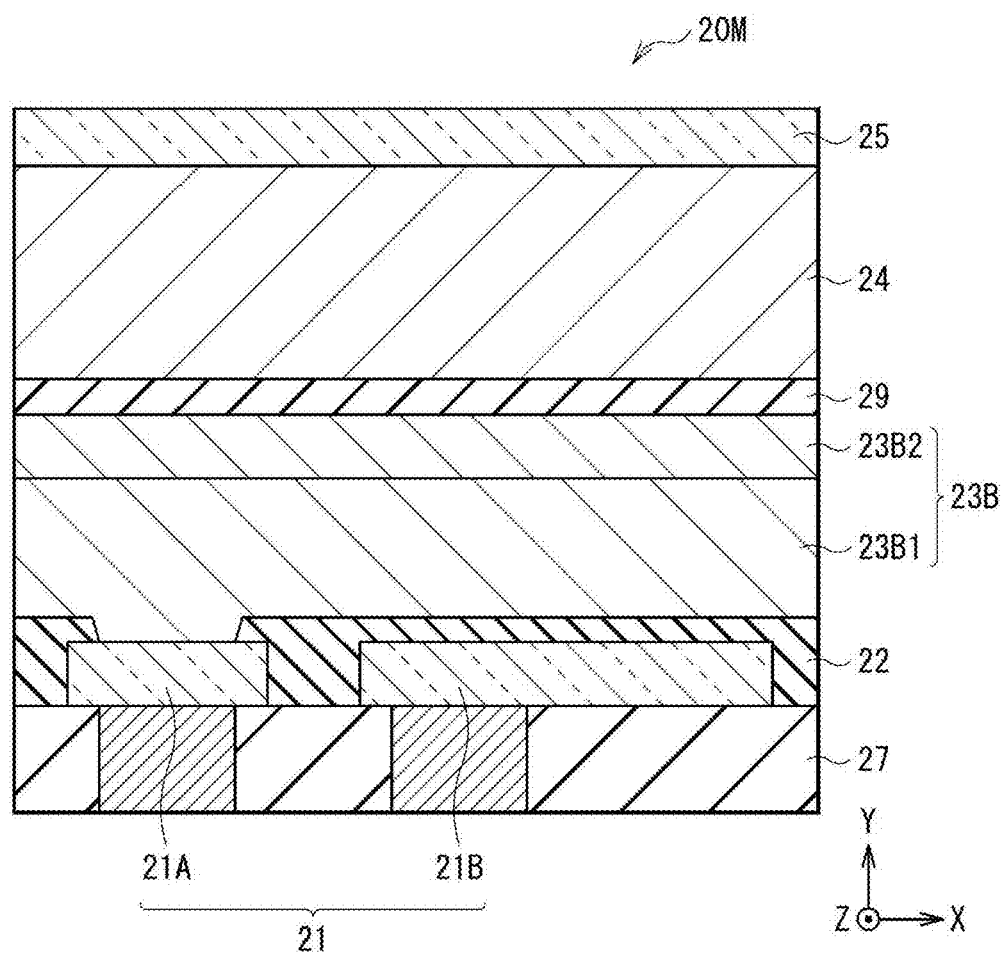

[ FIG. 35 ]
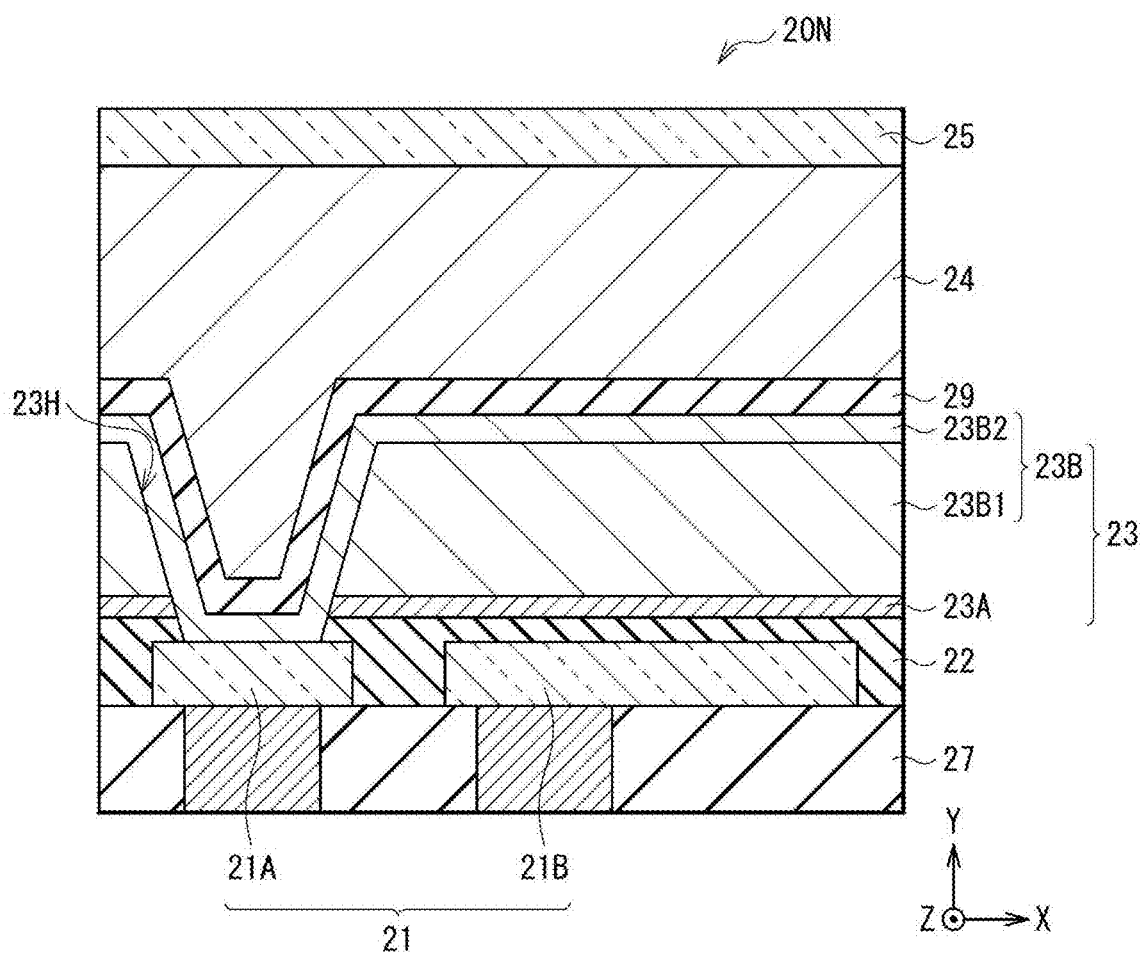

[FIG. 36A]
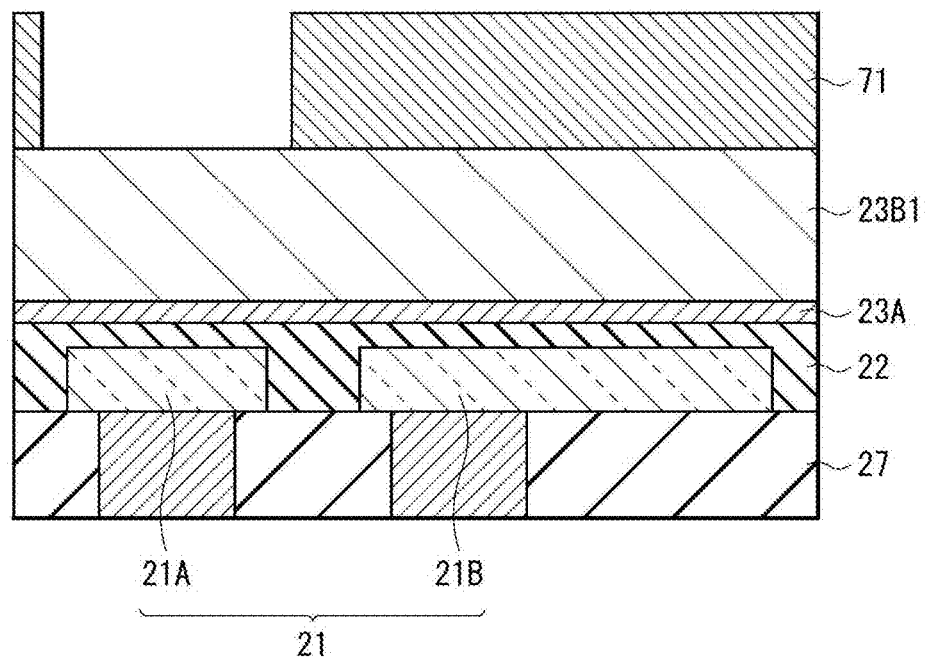
[FIG. 36B]
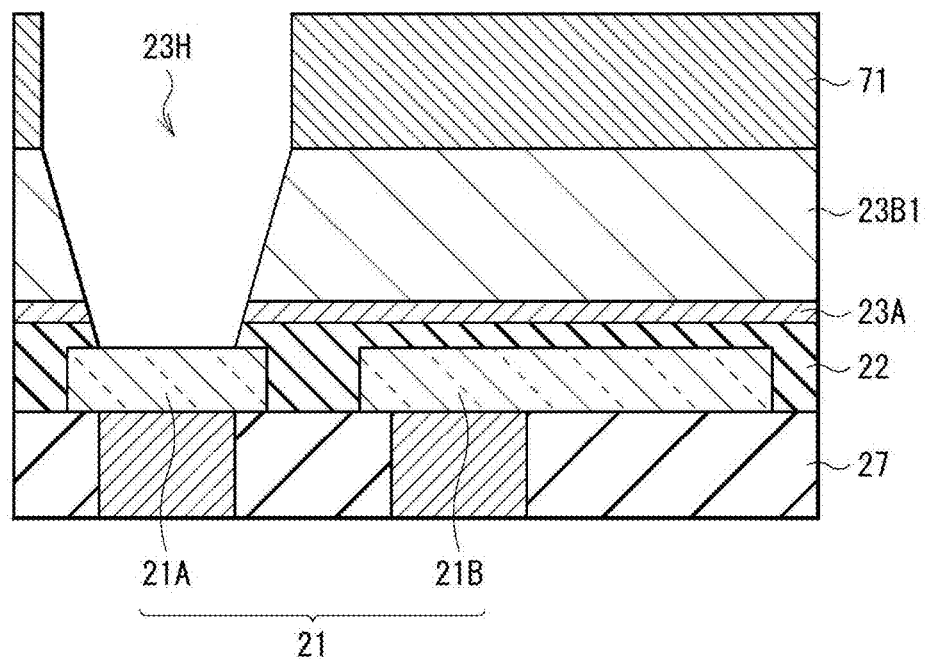

[FIG. 36C]
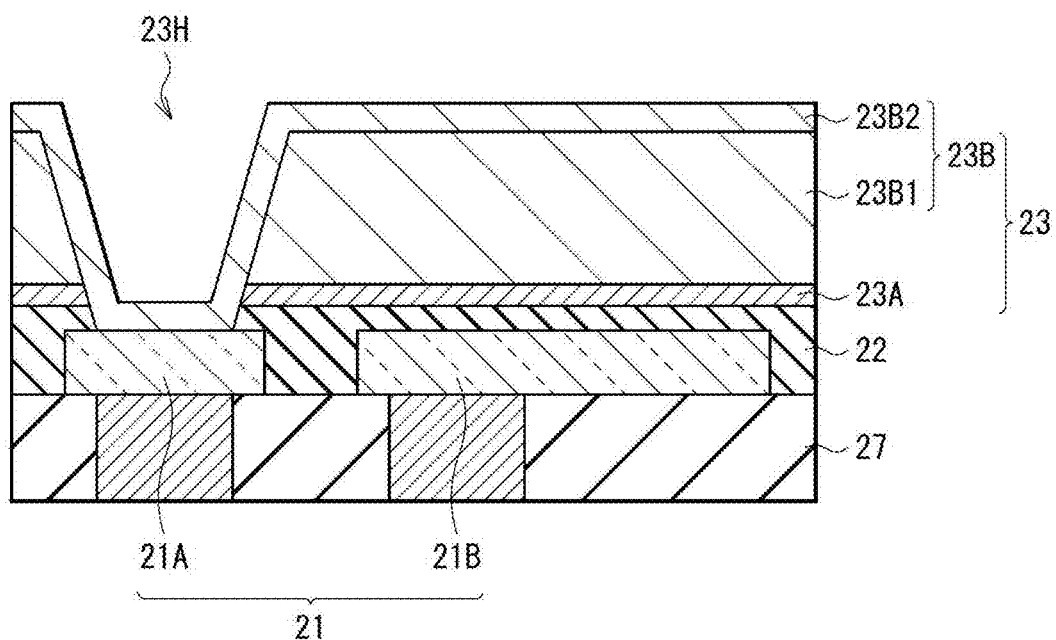
[FIG. 36D]
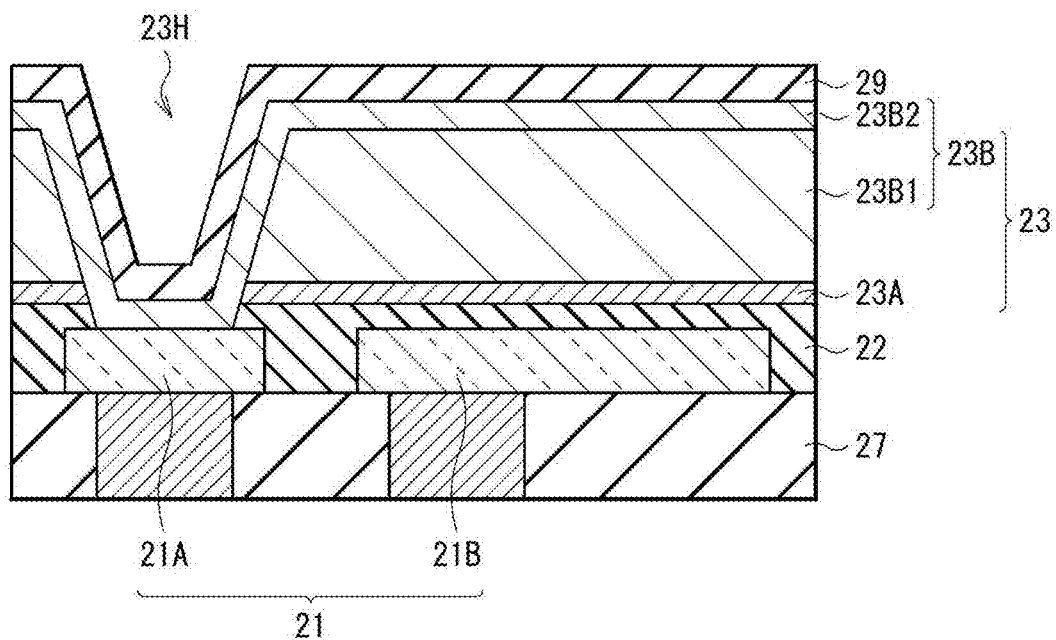

[FIG. 37]
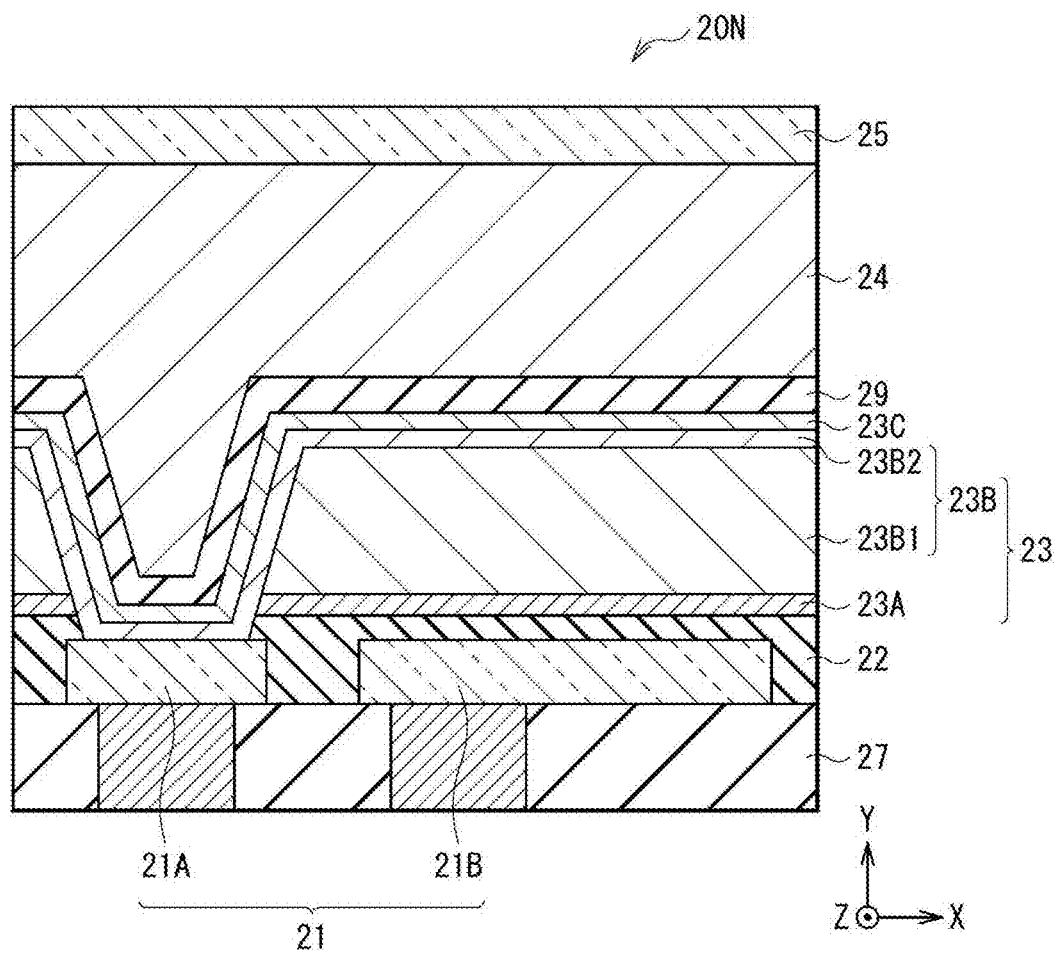

[ FIG. 38 ]
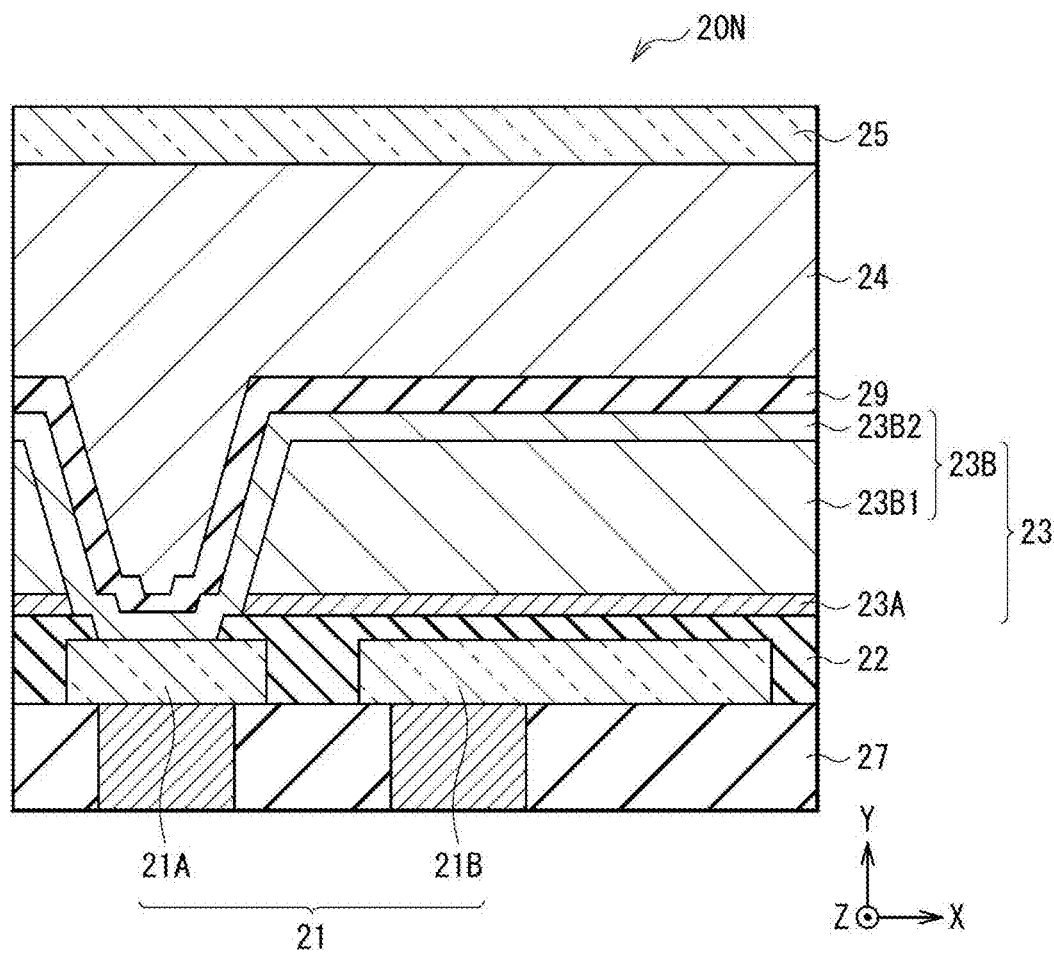

[FIG. 39]
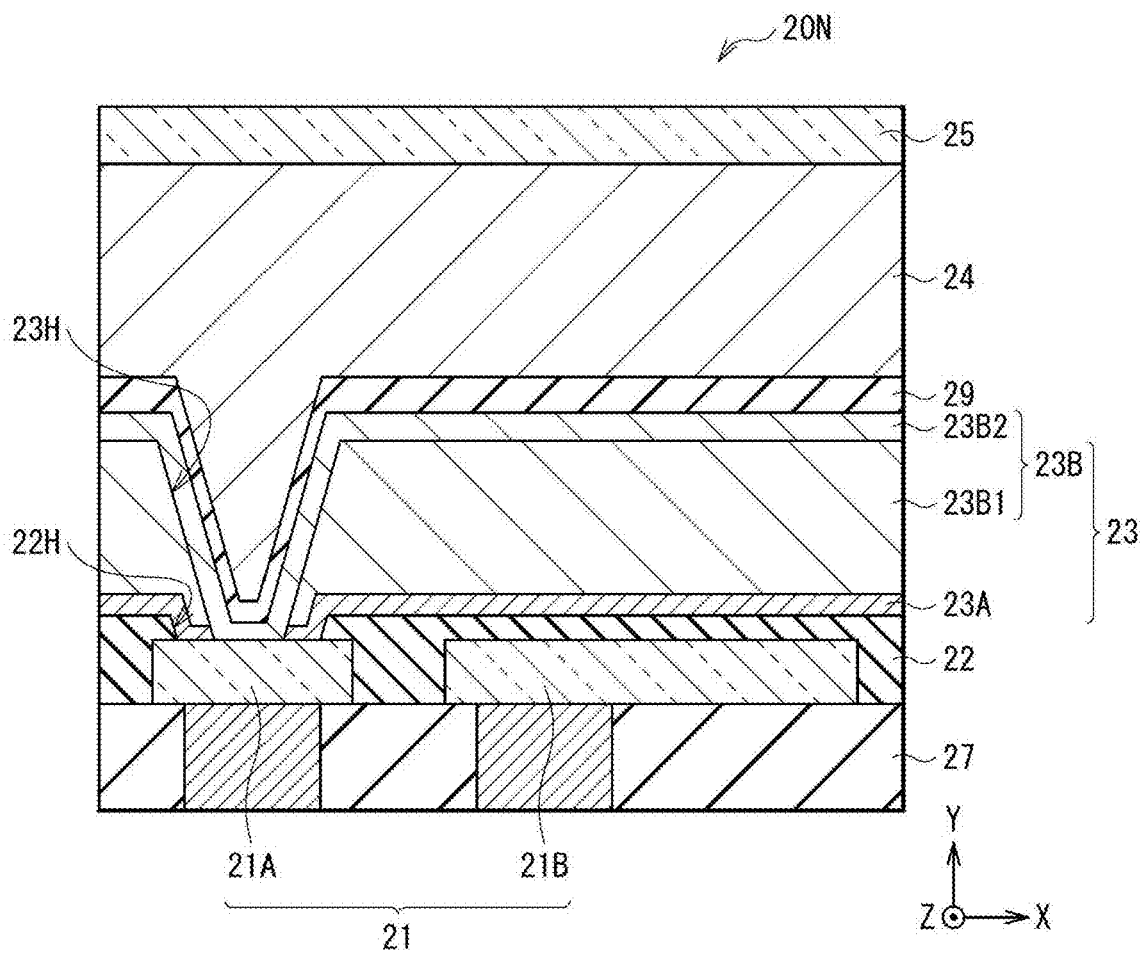

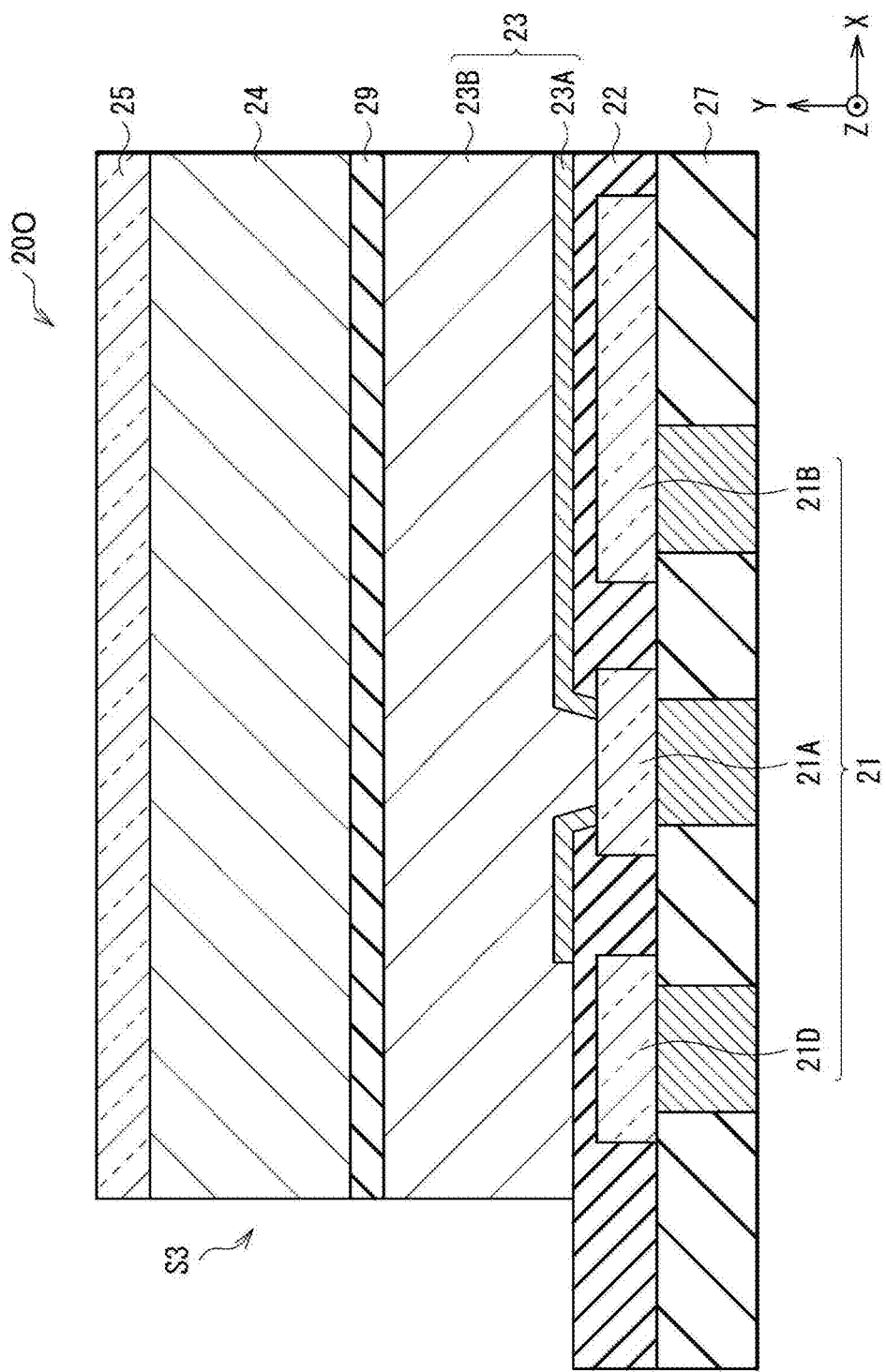
[FIG. 40]

[ FIG. 41A ]
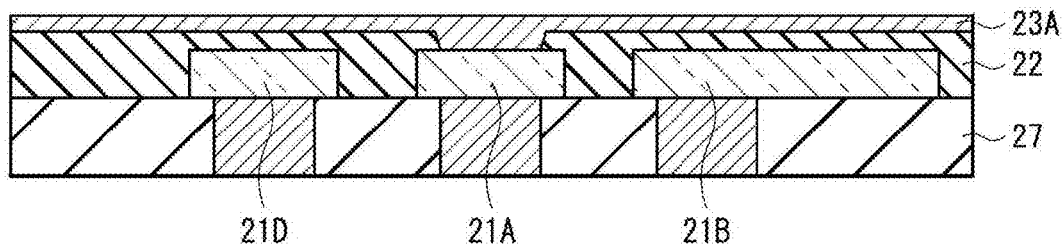
[ FIG. 41B ]
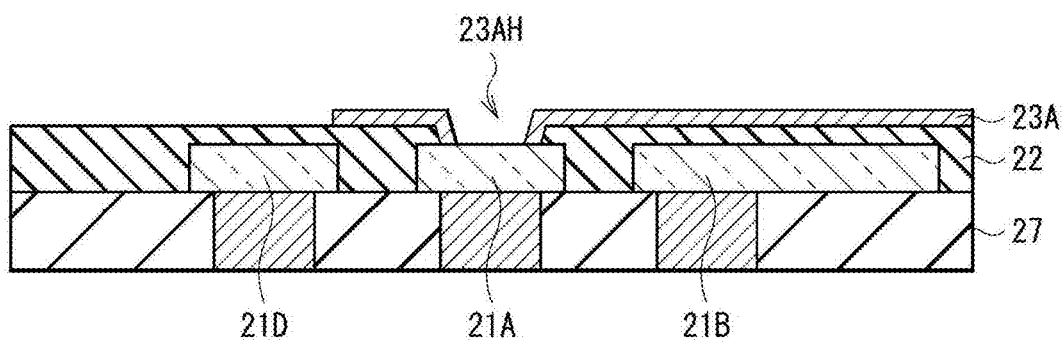
[ FIG. 41C ]
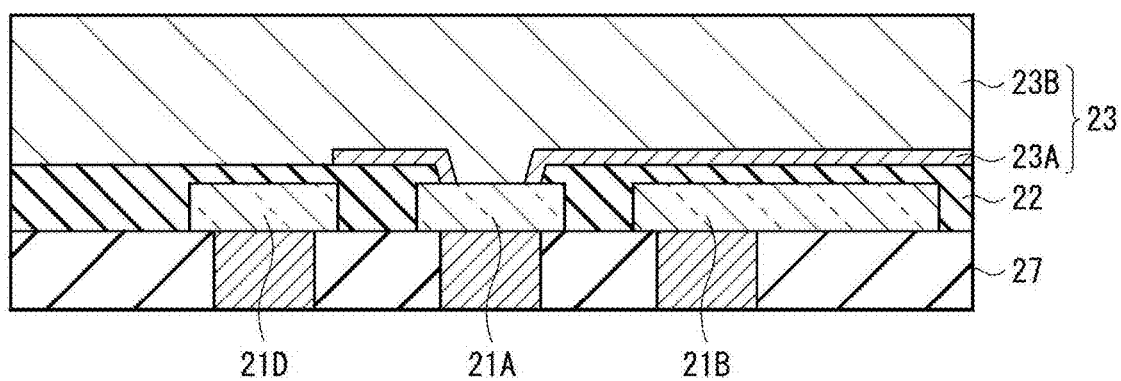

[ FIG. 41D ]
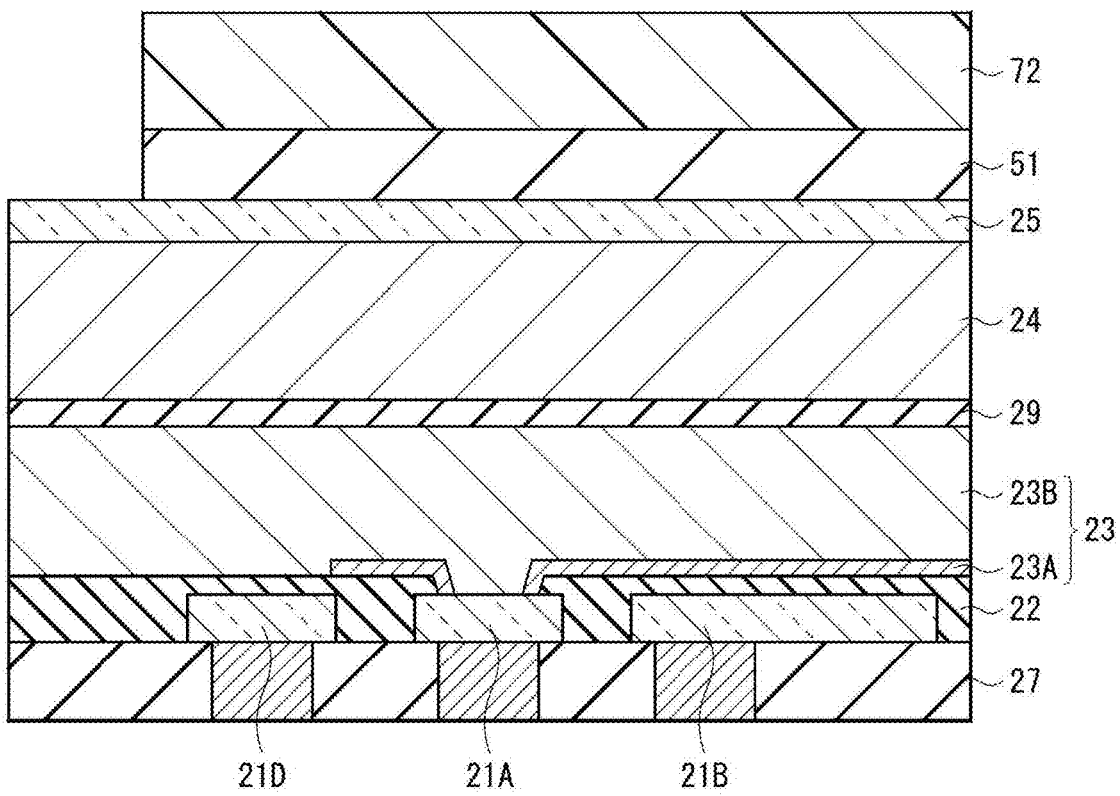
[ FIG. 41E ]
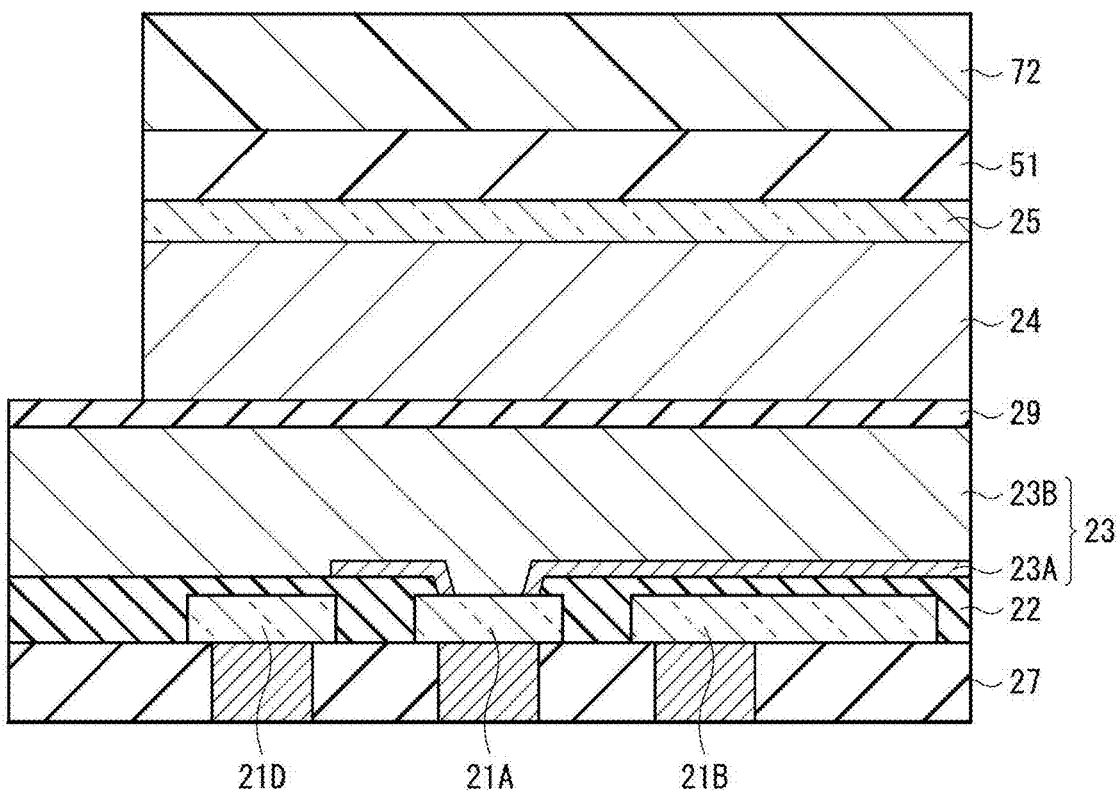

[ FIG. 41F ]
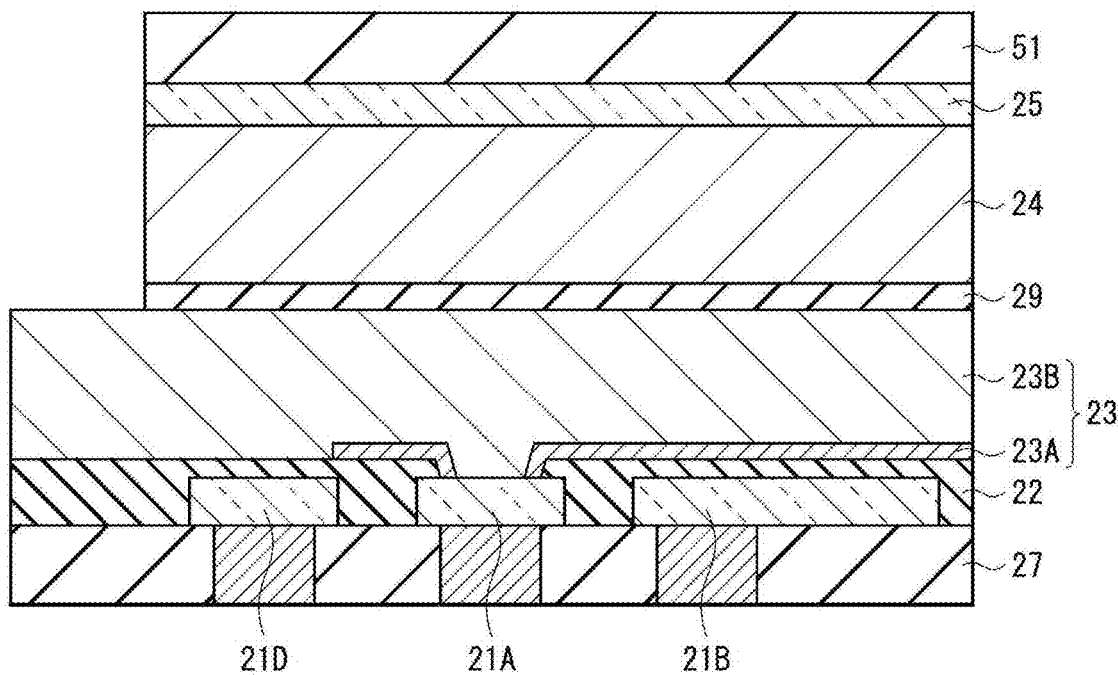
[ FIG. 41G ]
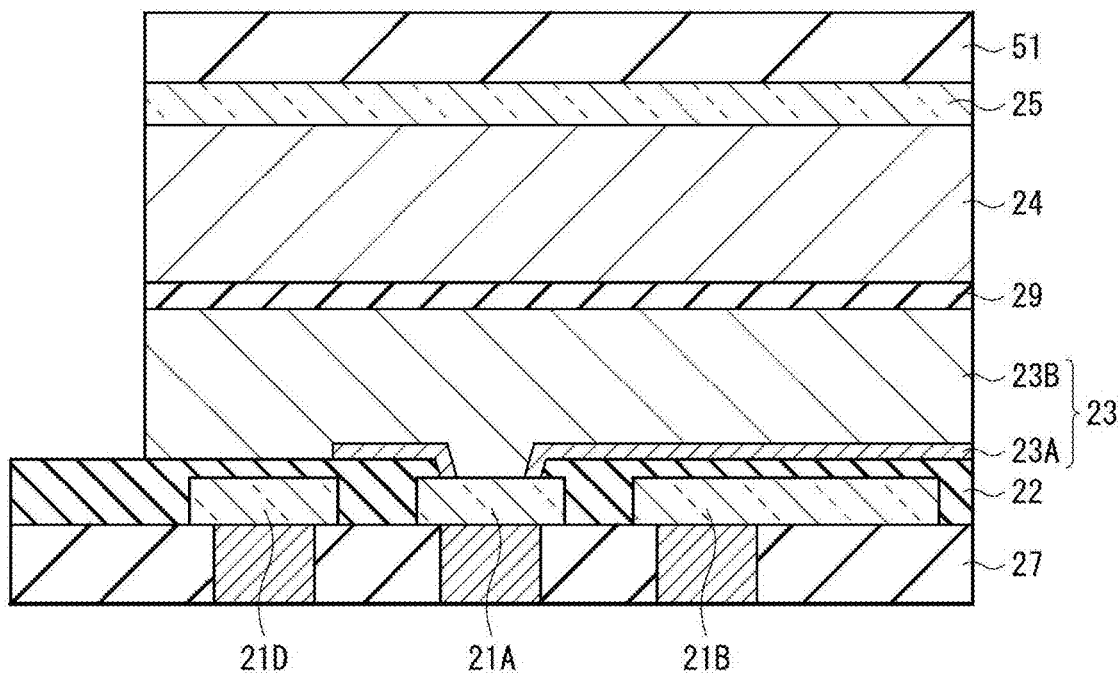

[ FIG. 42 ]
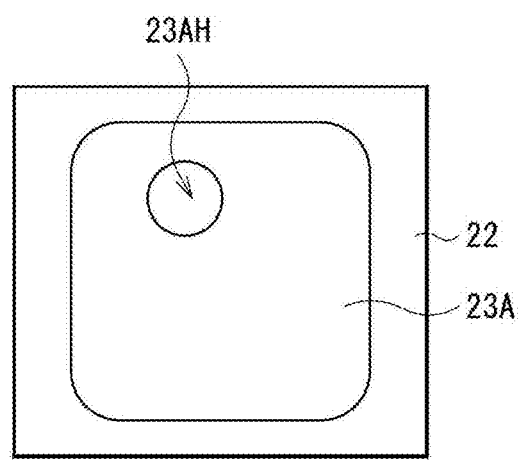
[ FIG. 43 ]
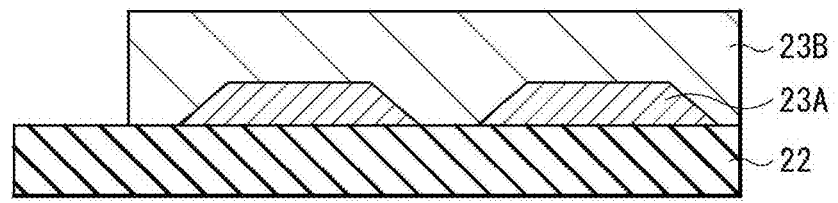

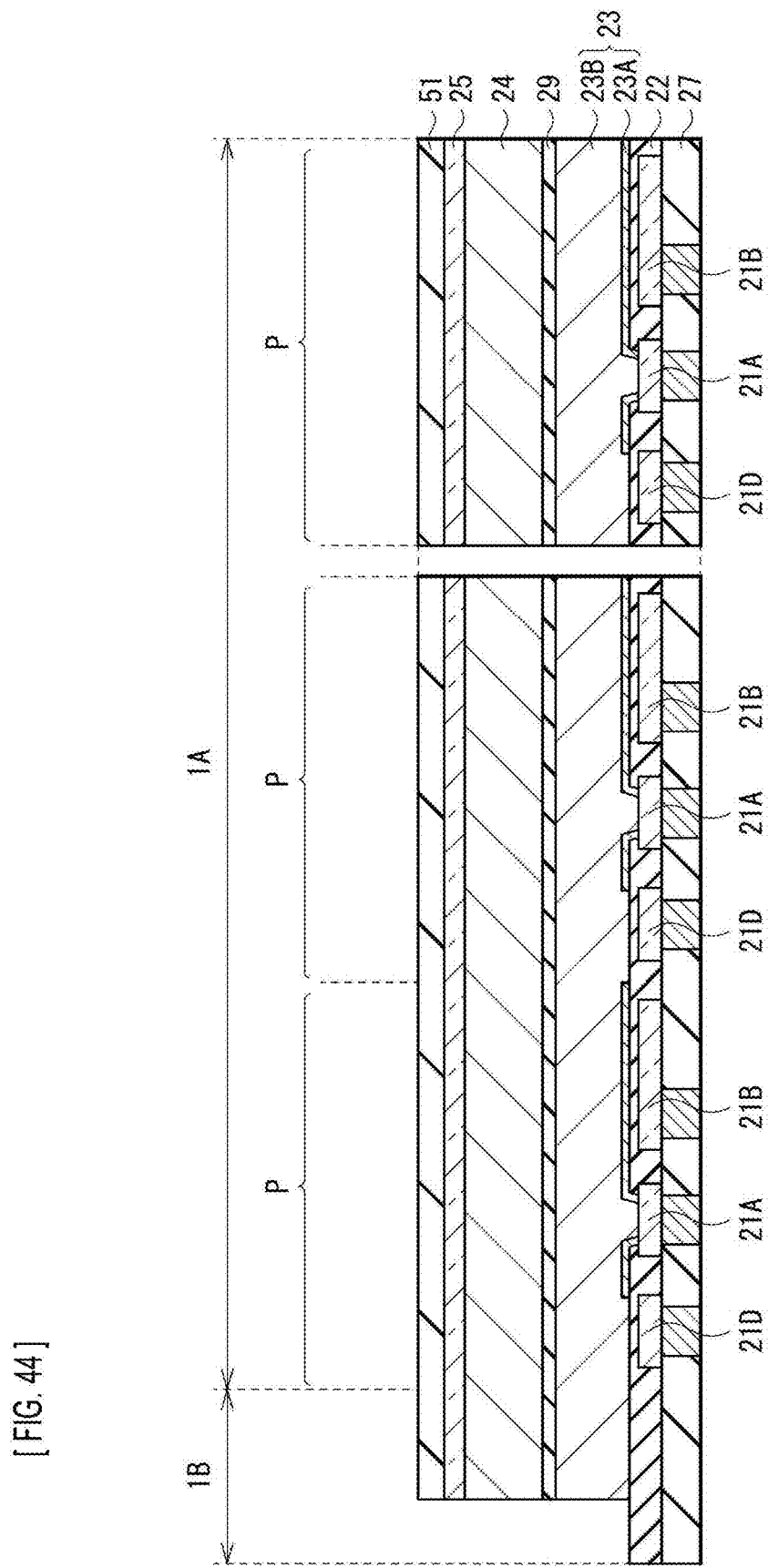
[FIG. 44]

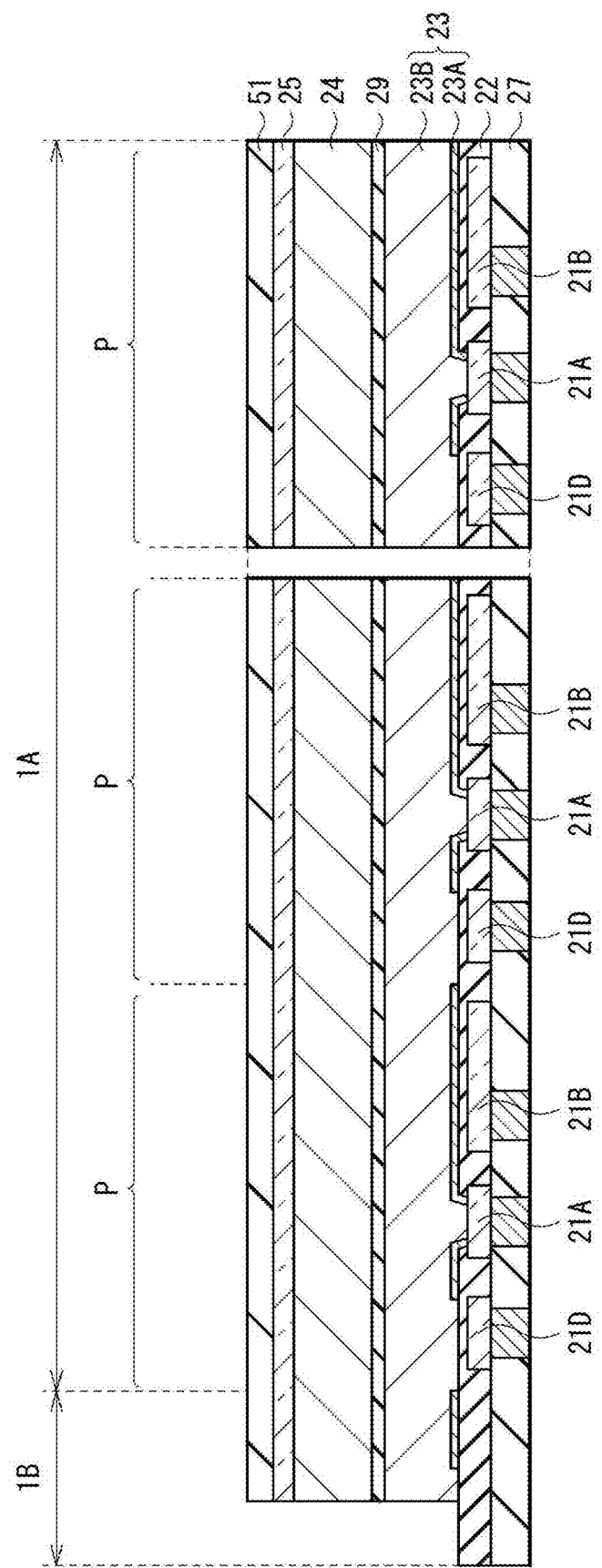
[FIG. 45]

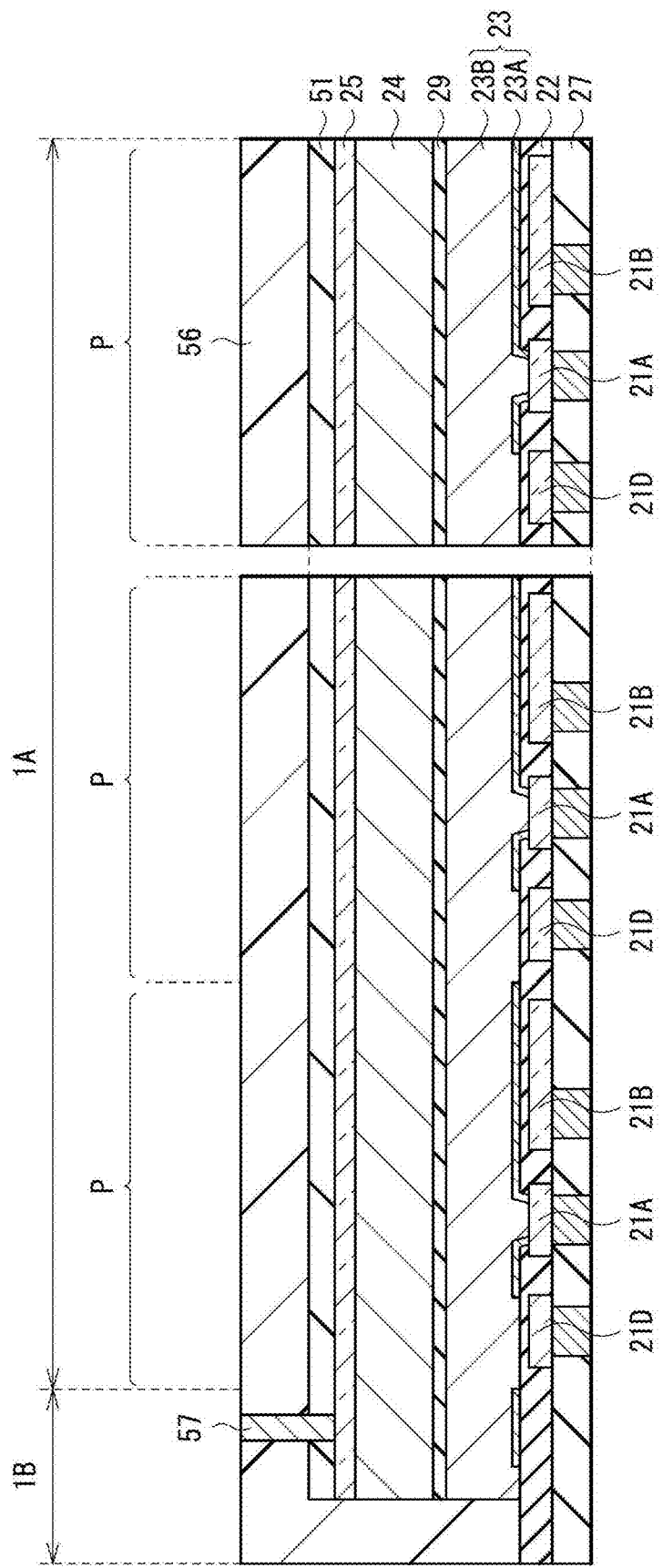
[FIG 46]

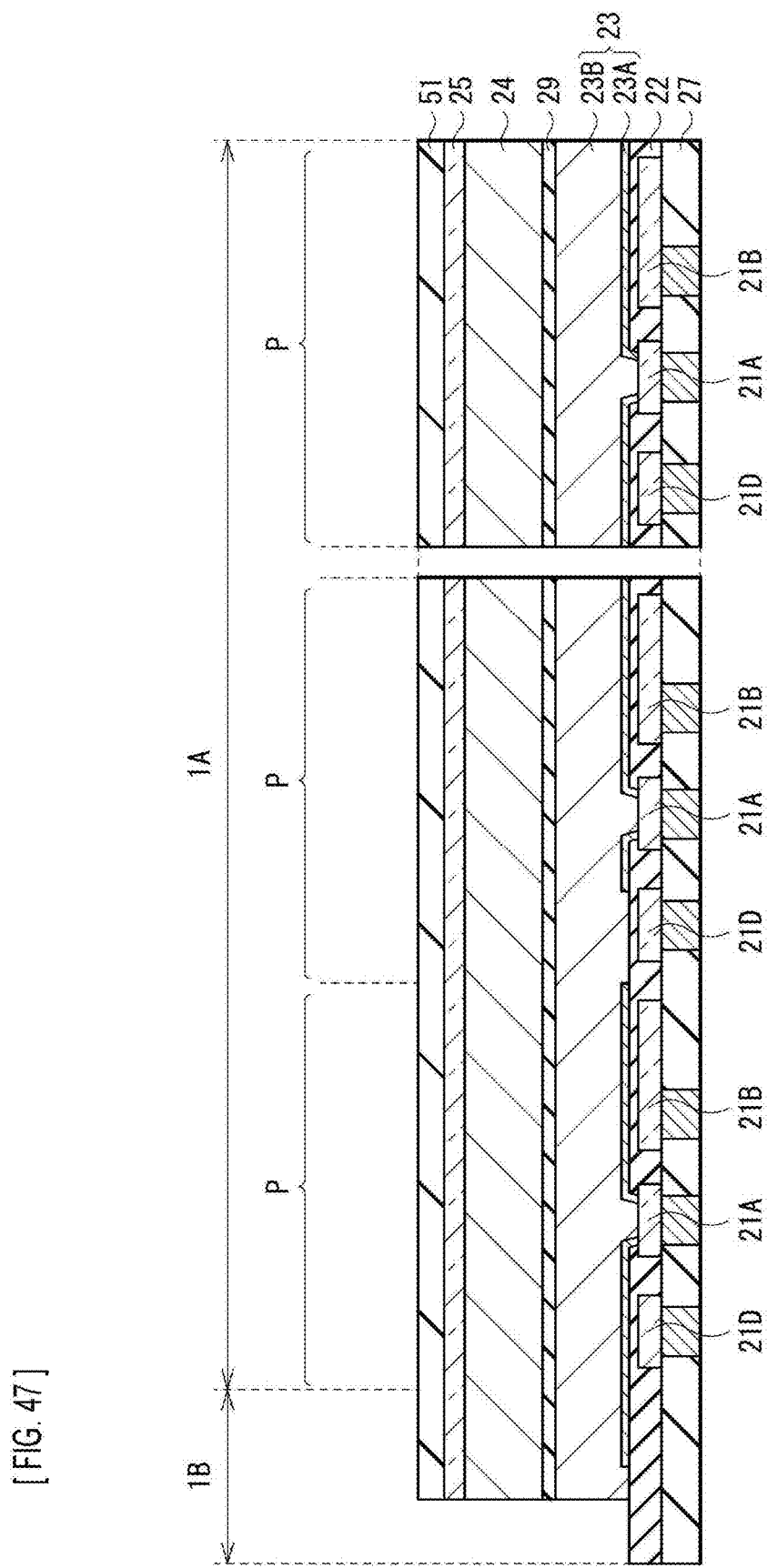
[FIG. 47]

[ FIG. 48A ]
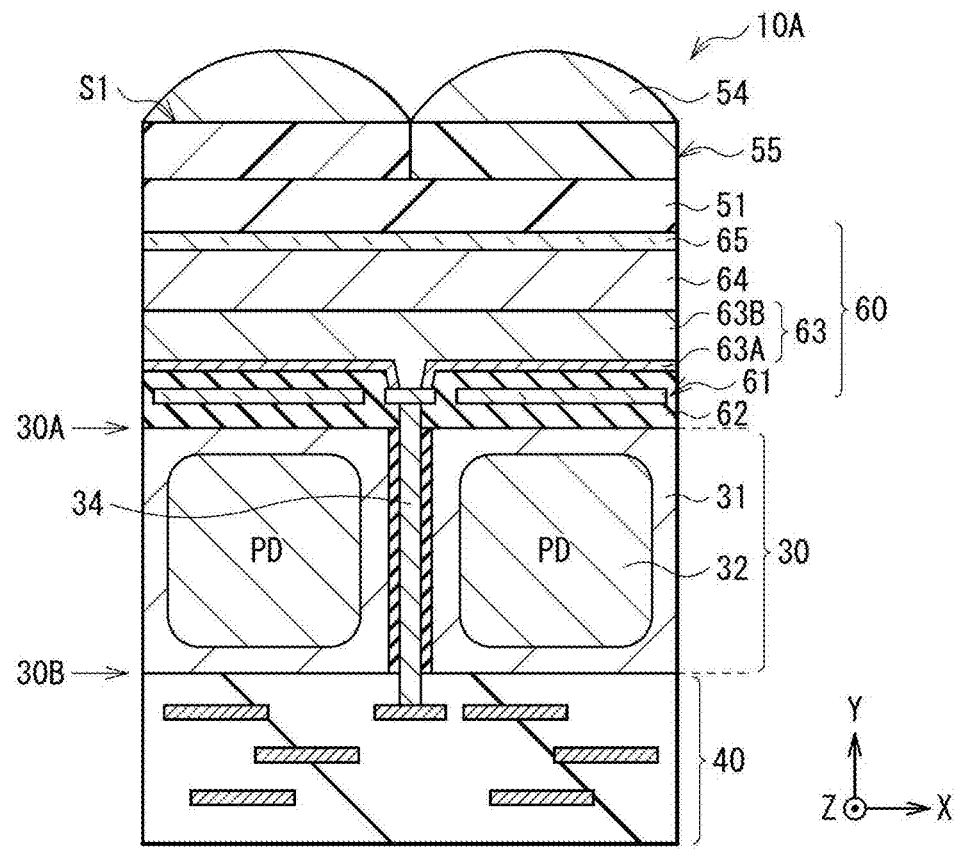
[ FIG. 48B ]
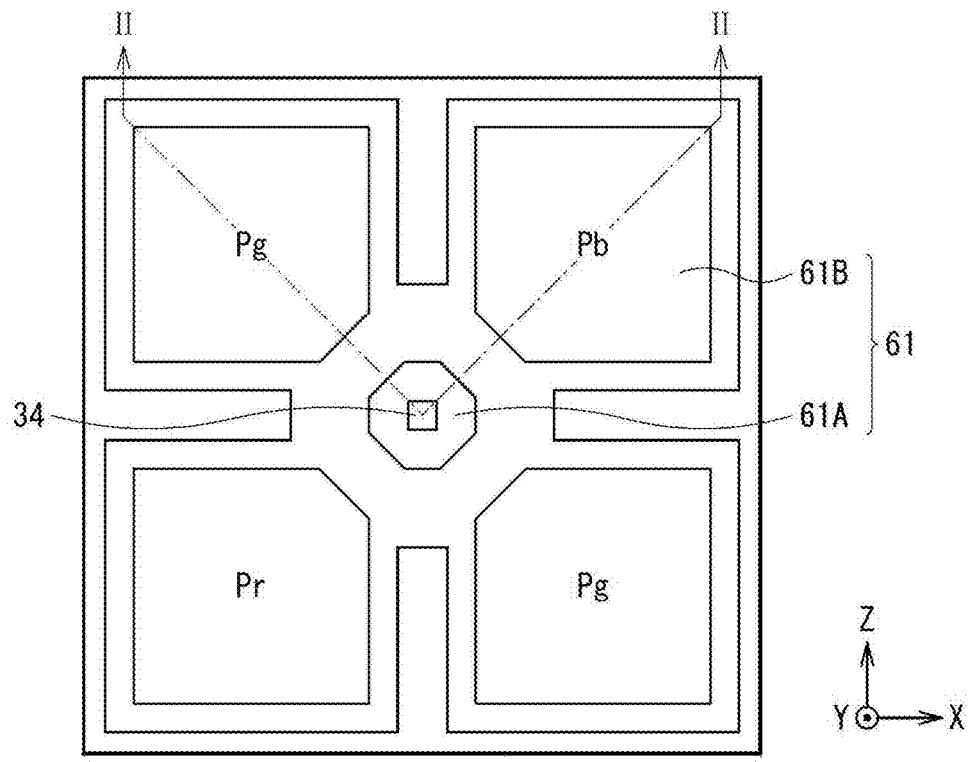

[ FIG. 49A ]
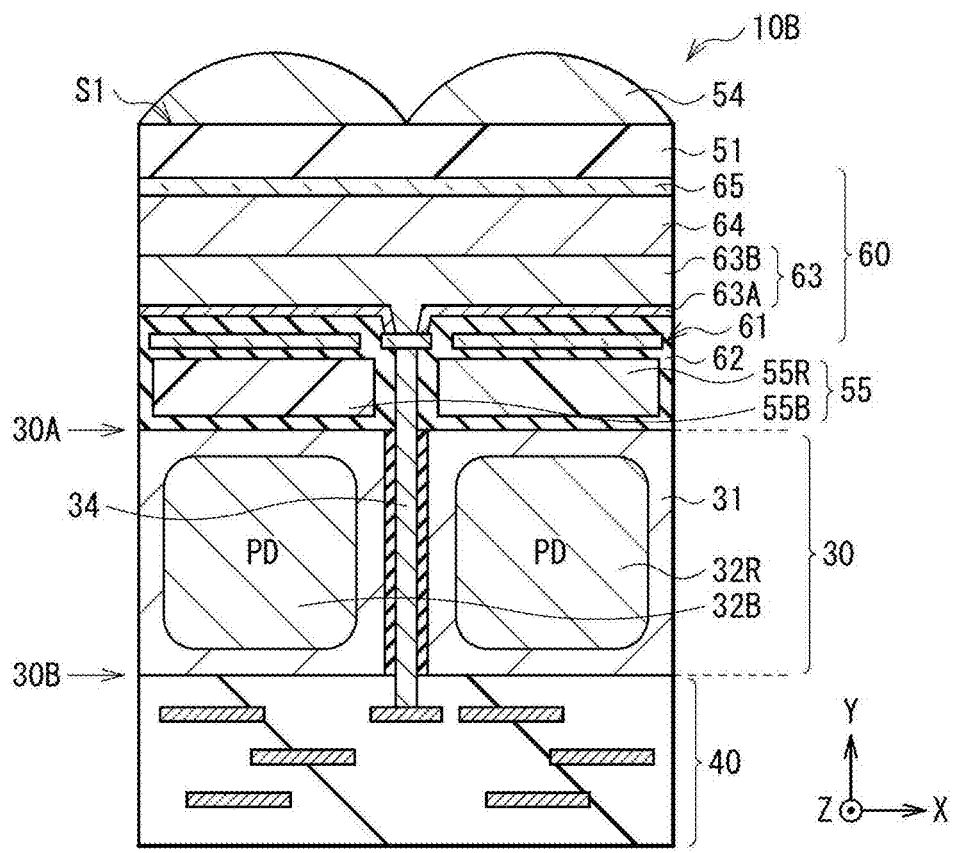
[ FIG. 49B ]
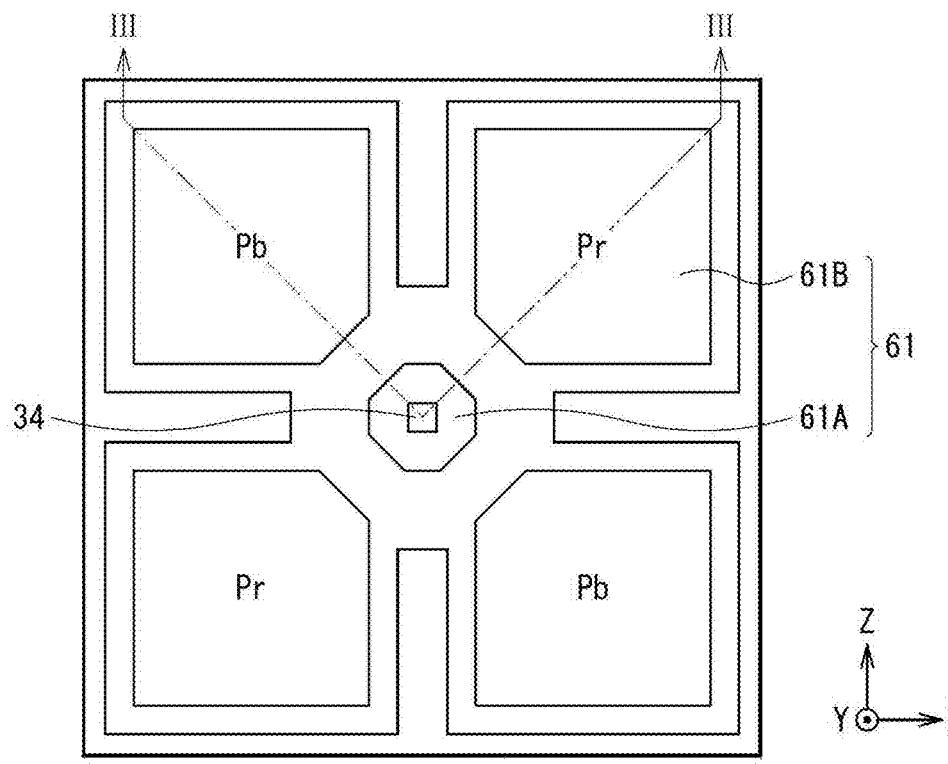

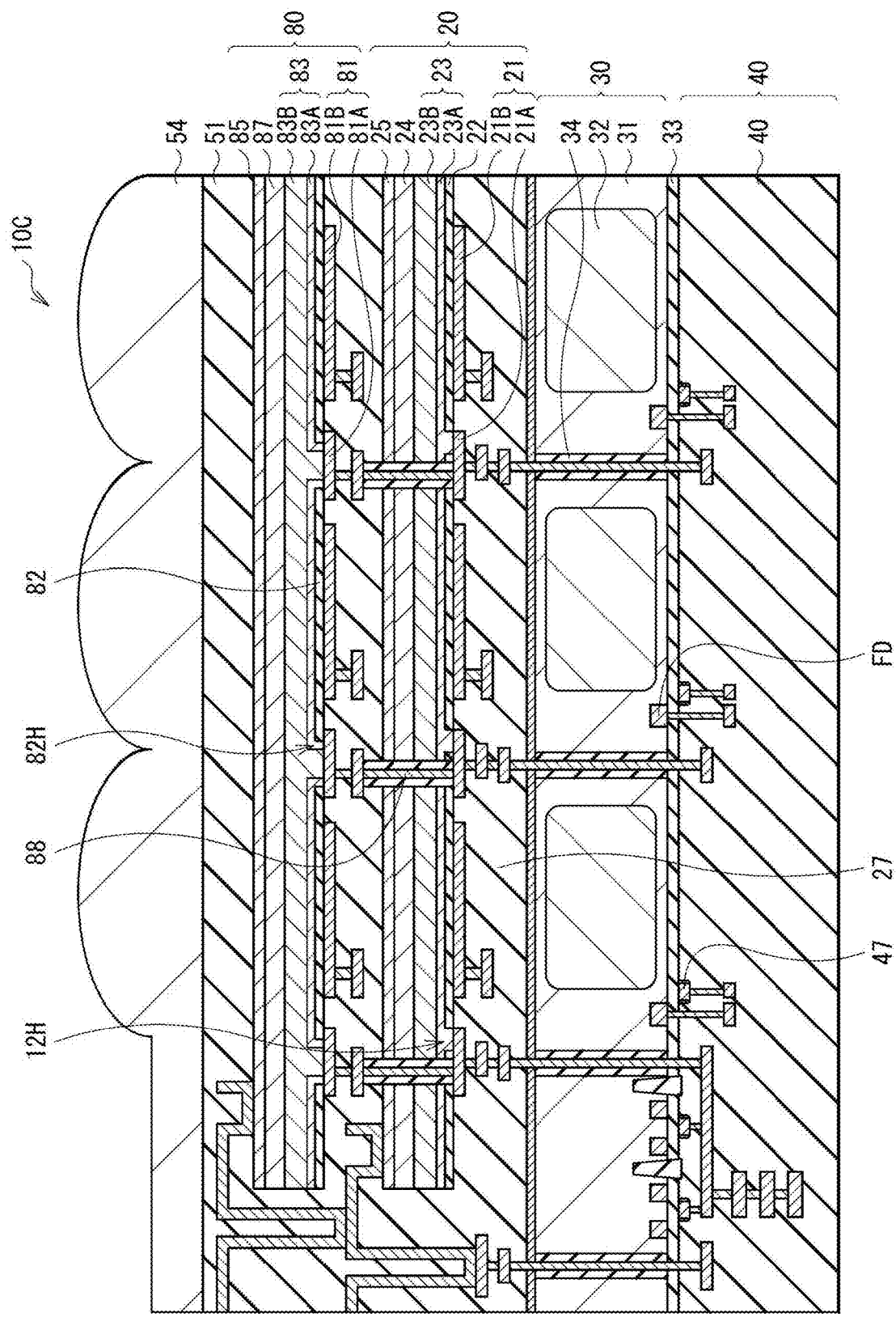
[FIG. 50]

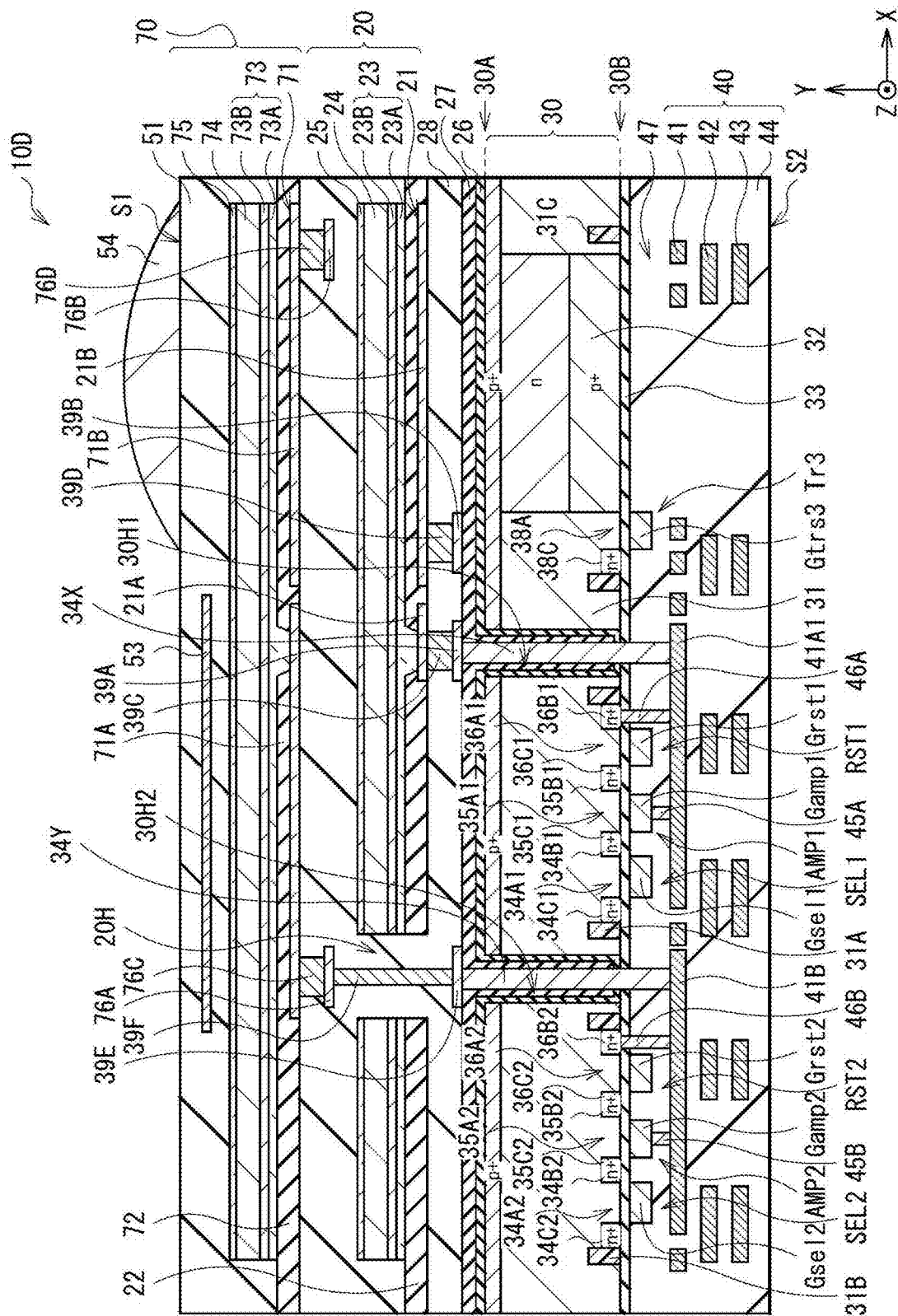
[FIG. 51]

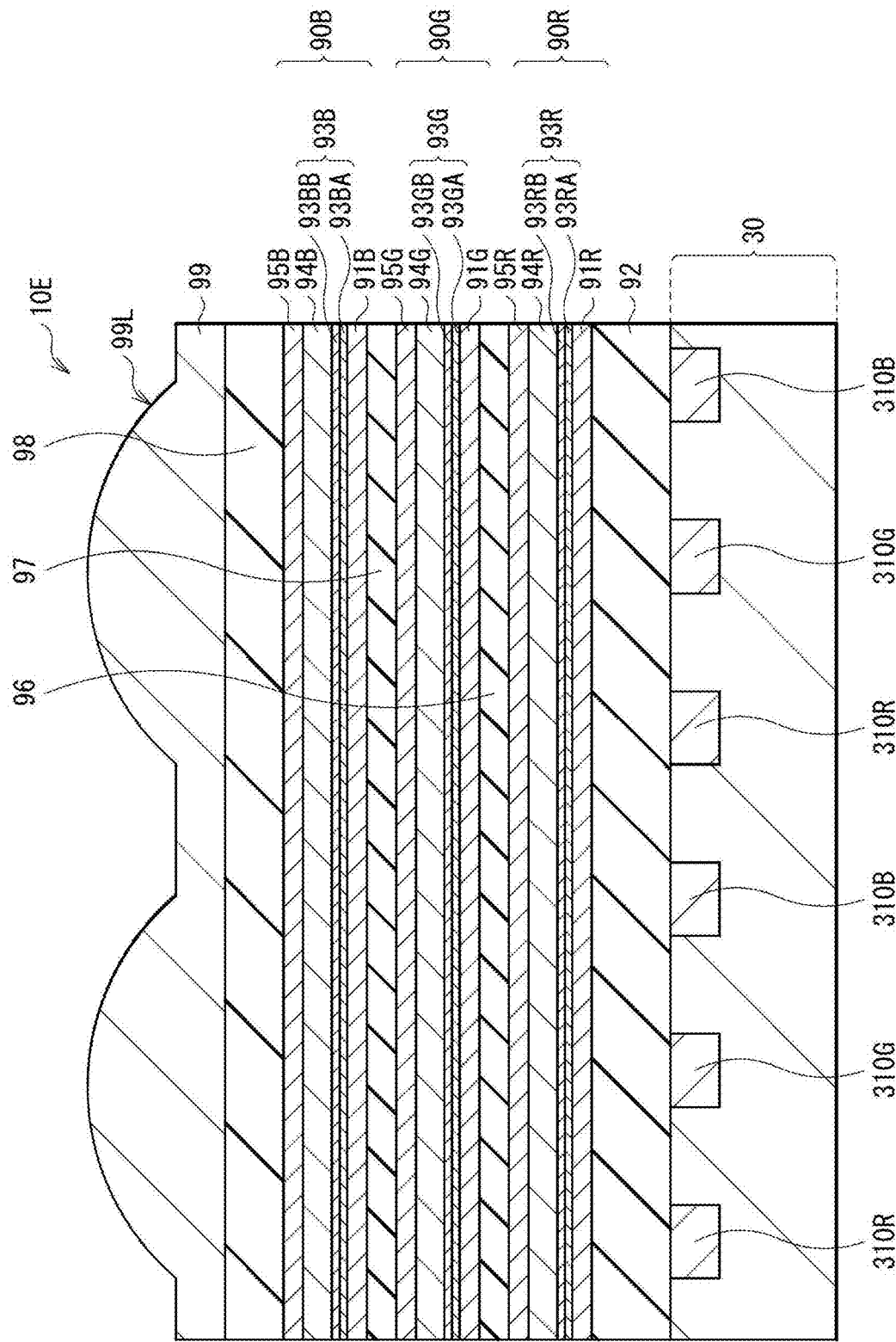
[FIG. 52]

[FIG. 53]
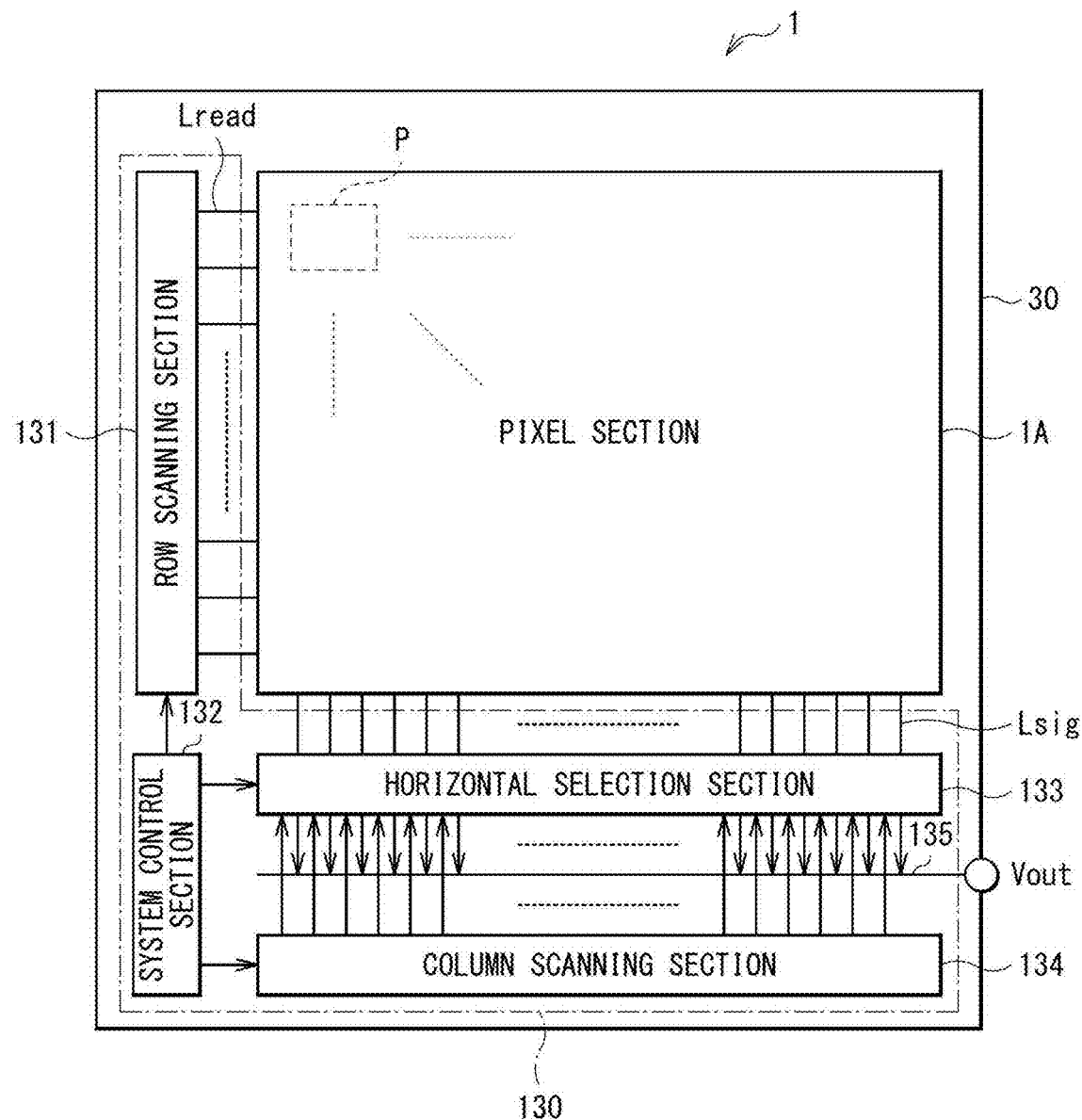

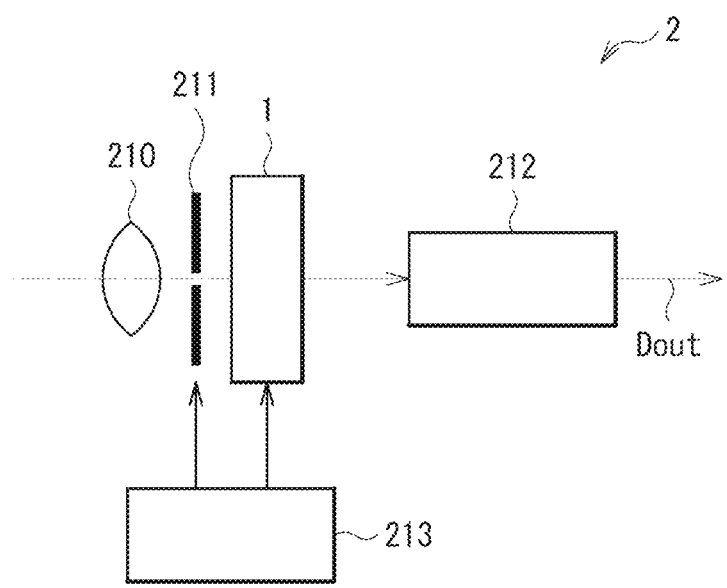
[FIG. 54]

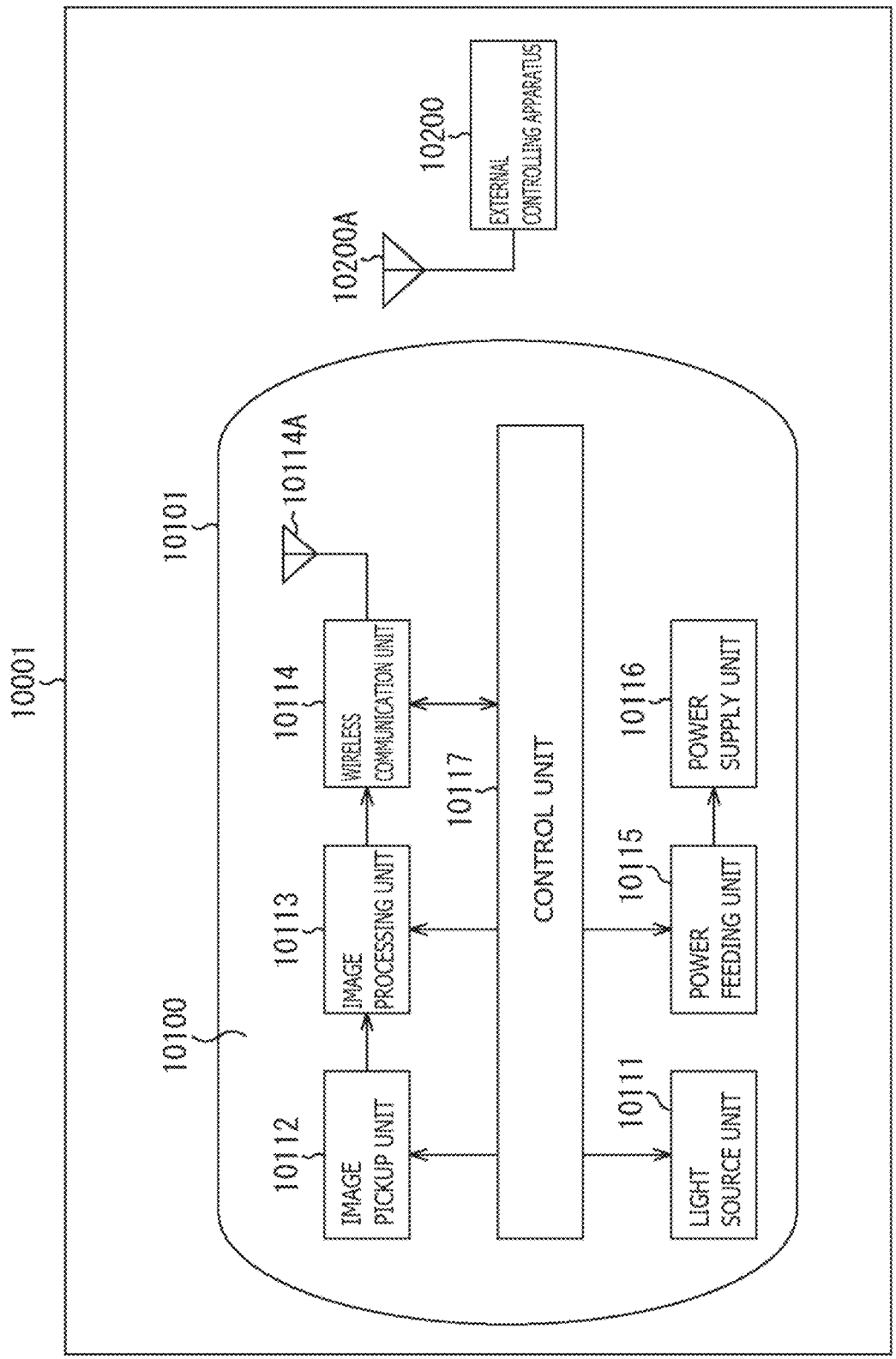

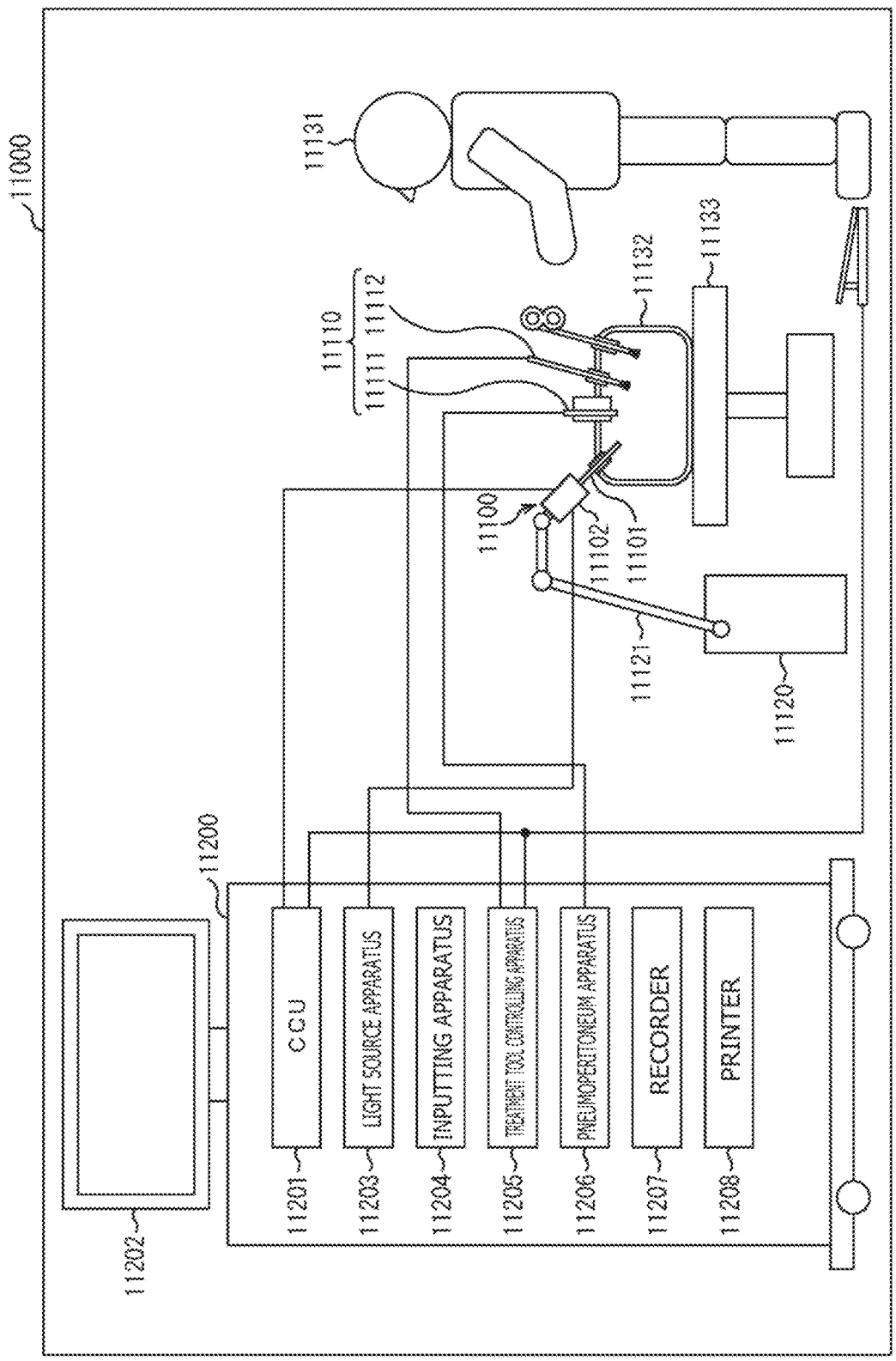

[FIG. 57]
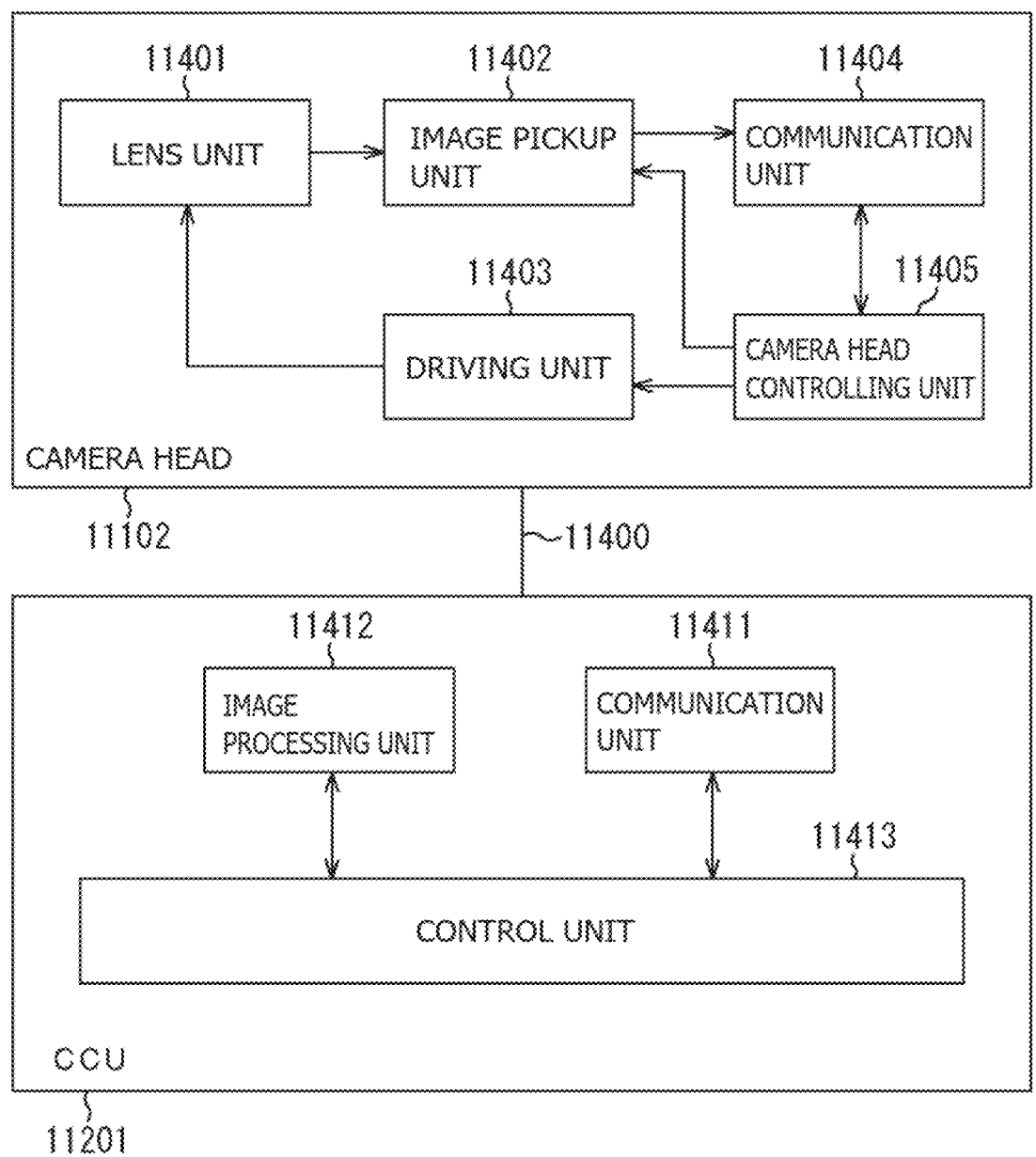

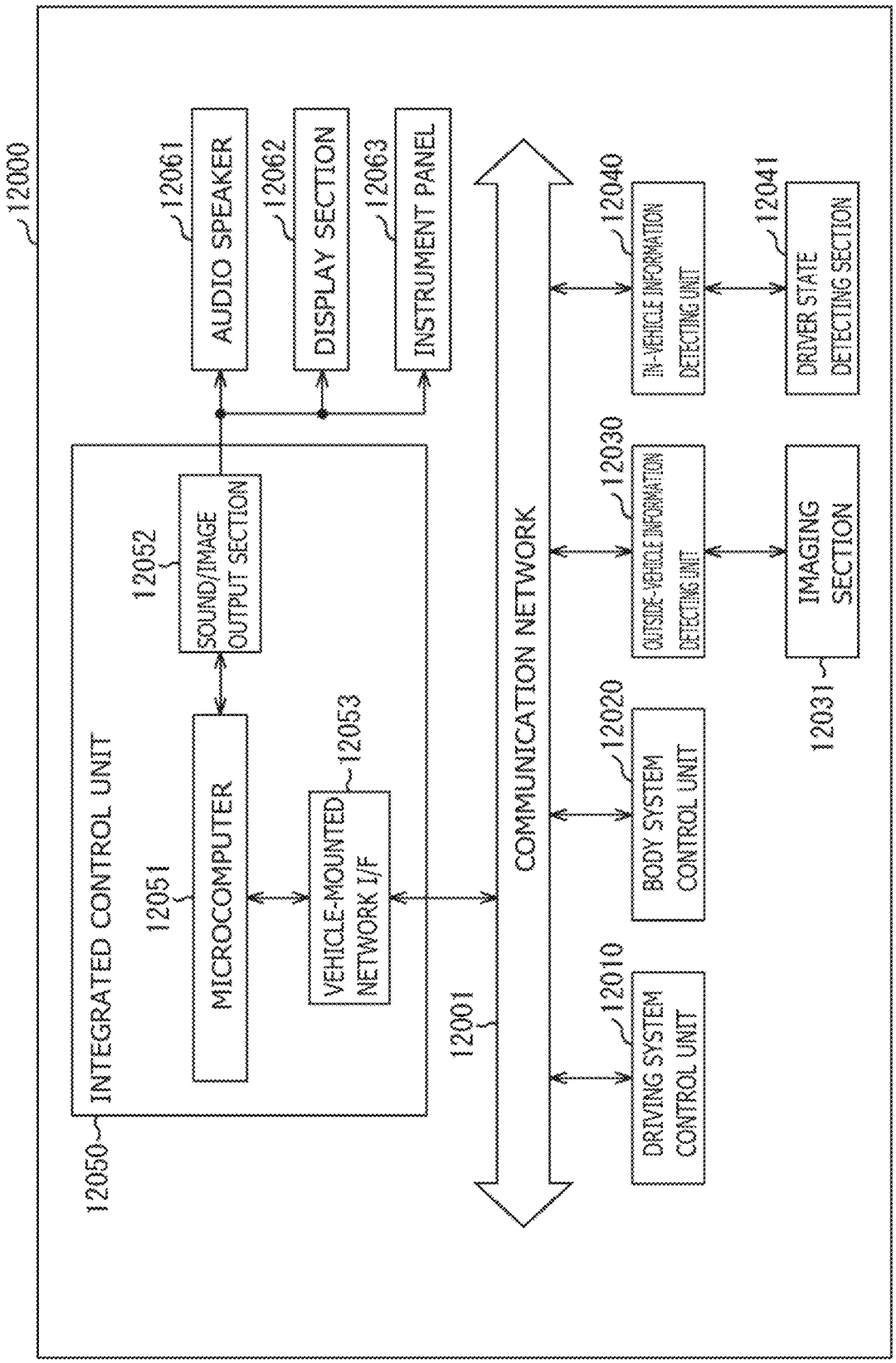

[ FIG. 59 ]
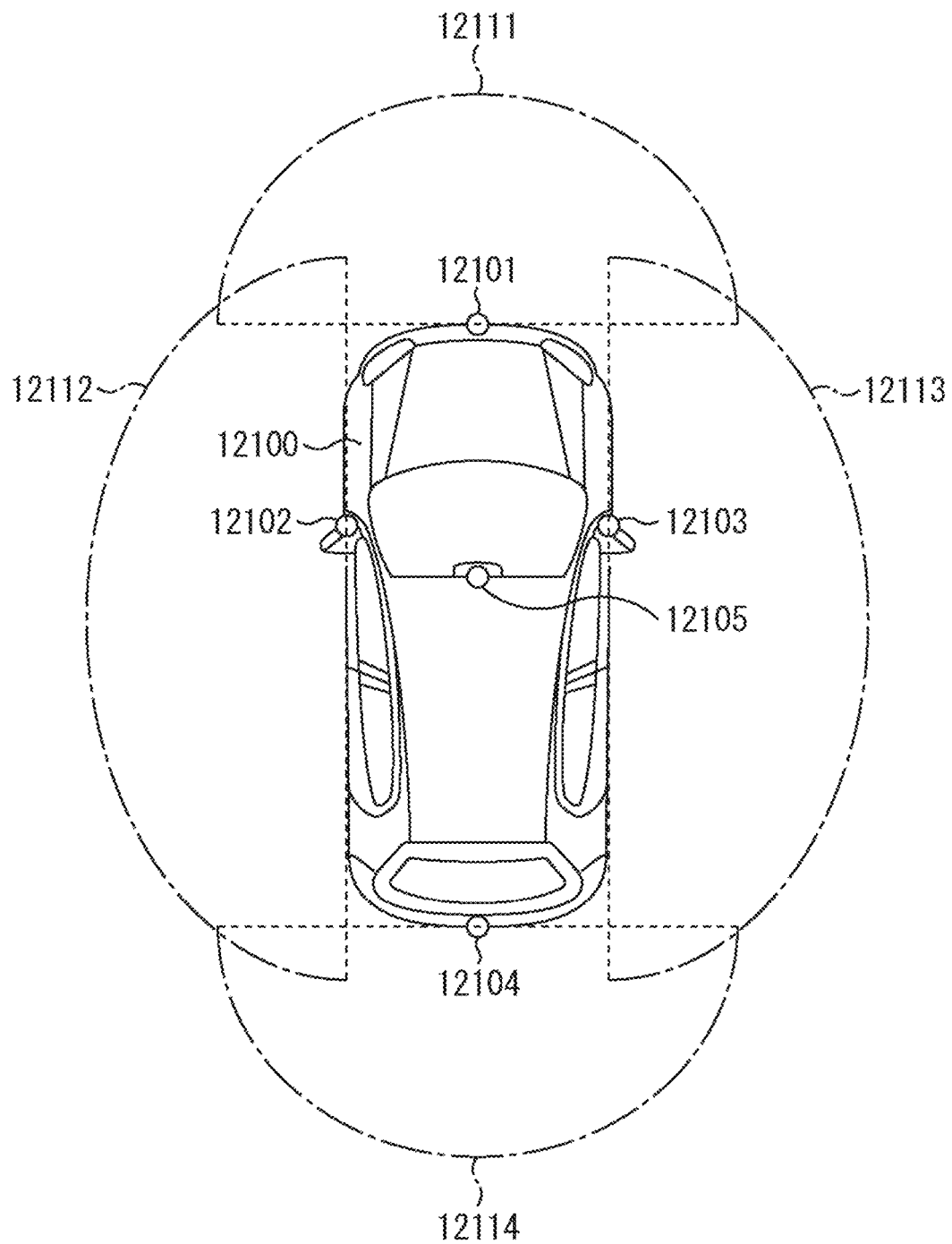

IMAGING ELEMENT AND IMAGING DEVICE

TECHNICAL FIELD

The present disclosure relates to an imaging element in which, for example, an organic material is used and an imaging device including the imaging element.

BACKGROUND ART

For example, PTL 1 discloses an imaging element in which a photoelectric conversion section having a first electrode, a photoelectric conversion layer, and a second electrode stacked therein is provided with a composite oxide layer including indium-gallium-zinc composite oxide (IGZO) between the first electrode and the photoelectric conversion layer, thereby achieving an improvement in photoresponsivity.

CITATION LIST

Patent Literature

PTL 1: International Publication No. WO 2019/035252

SUMMARY OF THE INVENTION

Incidentally, an imaging device is required to reduce noise.

It is desirable to provide an imaging element and an imaging device each of which makes it possible to reduce noise.

An imaging element according to an embodiment of the present disclosure includes: a first electrode and a second electrode; a third electrode; a photoelectric conversion layer; and a semiconductor layer. The first electrode and the second electrode are disposed in parallel. The third electrode is disposed to be opposed to the first electrode and the second electrode. The photoelectric conversion layer is provided between the first electrode and second electrode and the third electrode. The semiconductor layer is provided between the first electrode and second electrode and the photoelectric conversion layer. The semiconductor layer has a first layer and a second layer stacked therein in order from the photoelectric conversion layer side. The second layer has an energy level at a lowest edge of a conduction band that is shallower than an energy level of the first layer at a lowest edge of a conduction band.

An imaging device according to an embodiment of the present disclosure includes the one or more imaging elements according to the embodiment of the present disclosure described above for each of a plurality of pixels.

The imaging element according to the embodiment of the present disclosure and the imaging device according to the embodiment are each provided with the semiconductor layer between the first electrode and second electrode and the photoelectric conversion layer. The first electrode and the second electrode are disposed in parallel. In the semiconductor layer, the first layer and the second layer are stacked. The first layer is provided on the photoelectric conversion layer side. The second layer is provided on the first electrode and second electrode side. In addition, the second layer has the energy level at the lowest edge of the conduction band that is shallower than the energy level of the first layer at the lowest edge of the conduction band. This improves the characteristics of transporting electric charge to the second electrode.

BRIEF DESCRIPTION OF DRAWING

FIG. 2 is a plane schematic diagram illustrating an example of a pixel configuration of an imaging device including the imaging element illustrated in FIG. 1.

FIG. 3 is a cross-sectional schematic diagram illustrating an example of a configuration of an organic photoelectric conversion section illustrated in FIG. 1.

FIG. 4A is a diagram illustrating an energy level of each of layers on an accumulation electrode of the organic photoelectric conversion section illustrated in FIG. 3.

FIG. 4B is a diagram illustrating an energy level of each of layers on a readout electrode of the organic photoelectric conversion section illustrated in FIG. 3.

FIG. 5 is an equivalent circuit diagram of the imaging element illustrated in

FIG. 1.

FIG. 6 is a schematic diagram illustrating disposition of a lower electrode and a transistor included in a controller in the imaging element illustrated in FIG. 1.

FIG. 7 is a cross-sectional view for describing a method of manufacturing the imaging element illustrated in FIG. 1.

FIG. 8 is a cross-sectional view of a step subsequent to FIG. 7.

FIG. 9 is a cross-sectional view of a step subsequent to FIG. 8.

FIG. 10 is a cross-sectional view of a step subsequent to FIG. 9.

FIG. 11 is a cross-sectional view of a step subsequent to FIG. 10.

FIG. 12 is a cross-sectional view of a step subsequent to FIG. 11.

FIG. 13 is a timing chart illustrating an operation example of the imaging element illustrated in FIG. 1.

FIG. 14 is a cross-sectional schematic diagram illustrating a configuration of an organic photoelectric conversion section according to a modification example 1 of the present disclosure.

FIG. 15A is a diagram illustrating an energy level of each of layers on an accumulation electrode of the organic photoelectric conversion section illustrated in FIG. 14.

FIG. 15B is a diagram illustrating an energy level of each of layers on a readout electrode of the organic photoelectric conversion section illustrated in FIG. 14.

FIG. 16 is a cross-sectional schematic diagram illustrating a configuration of an organic photoelectric conversion section according to a modification example 2 of the present disclosure.

FIG. 17 is a cross-sectional schematic diagram illustrating a configuration of an organic photoelectric conversion section according to a modification example 3 of the present disclosure.

FIG. 18 is a cross-sectional schematic diagram illustrating a configuration of an organic photoelectric conversion section according to a modification example 4 of the present disclosure.

FIG. 19 is a cross-sectional schematic diagram illustrating a configuration of an organic photoelectric conversion section according to a modification example 5 of the present disclosure.

FIG. 20 is a cross-sectional schematic diagram illustrating a configuration of an organic photoelectric conversion section according to a modification example 6 of the present disclosure.

FIG. 21 is a cross-sectional schematic diagram illustrating an example of a configuration of an organic photoelectric conversion section according to a modification example 7 of the present disclosure.

FIG. 22A is a cross-sectional view for describing a method of manufacturing the organic photoelectric conversion section illustrated in FIG. 21.

FIG. 22B is a cross-sectional view of a step subsequent to FIG. 22A.

FIG. 22C is a cross-sectional view of a step subsequent to FIG. 22B.

FIG. 22D is a cross-sectional view of a step subsequent to FIG. 22C.

FIG. 22E is a cross-sectional view of a step subsequent to FIG. 22D.

FIG. 23 is a cross-sectional schematic diagram illustrating another example of the configuration of the organic photoelectric conversion section according to the modification example 7 of the present disclosure.

FIG. 24A is a cross-sectional view for describing a method of manufacturing the organic photoelectric conversion section illustrated in FIG. 23.

FIG. 24B is a cross-sectional view of a step subsequent to FIG. 24A.

FIG. 24C is a cross-sectional view of a step subsequent to FIG. 24B.

FIG. 24D is a cross-sectional view of a step subsequent to FIG. 24C.

FIG. 25 is a cross-sectional schematic diagram illustrating an example of a configuration of an organic photoelectric conversion section according to a modification example 8 of the present disclosure.

FIG. 26A is a cross-sectional view for describing a method of manufacturing the organic photoelectric conversion section illustrated in FIG. 25.

FIG. 26B is a cross-sectional view of a step subsequent to FIG. 26A.

FIG. 26C is a cross-sectional view of a step subsequent to FIG. 26B.

FIG. 26D is a cross-sectional view of a step subsequent to FIG. 26C.

FIG. 26E is a cross-sectional view of a step subsequent to FIG. 26D.

FIG. 27 is a cross-sectional schematic diagram illustrating another example of the configuration of the organic photoelectric conversion section according to the modification example 8 of the present disclosure.

FIG. 28 is a cross-sectional schematic diagram illustrating another example of the configuration of the organic photoelectric conversion section according to the modification example 8 of the present disclosure.

FIG. 29 is a cross-sectional schematic diagram illustrating another example of the configuration of the organic photoelectric conversion section according to the modification example 8 of the present disclosure.

FIG. 30 is a cross-sectional schematic diagram illustrating an example of a configuration of an organic photoelectric conversion section according to a modification example 9 of the present disclosure.

FIG. 31 is a schematic diagram illustrating an example of a planar configuration of an imaging device including the organic photoelectric conversion section illustrated in FIG. 30.

FIG. 32A is a diagram illustrating an energy level of each of layers on an accumulation electrode of the organic photoelectric conversion section illustrated in FIG. 30.

FIG. 32B is a diagram illustrating an energy level of each of layers on a readout electrode of the organic photoelectric conversion section illustrated in FIG. 30.

FIG. 34 is a cross-sectional schematic diagram illustrating another example of the configuration of the organic photoelectric conversion section according to the modification example 9 of the present disclosure.

FIG. 35 is a cross-sectional schematic diagram illustrating an example of a configuration of an organic photoelectric conversion section according to a modification example 10 of the present disclosure.

FIG. 36A is a cross-sectional view for describing a method of manufacturing the organic photoelectric conversion section illustrated in FIG. 35.

FIG. 36B is a cross-sectional view of a step subsequent to FIG. 36A.

FIG. 36C is a cross-sectional view of a step subsequent to FIG. 36B.

FIG. 36D is a cross-sectional view of a step subsequent to FIG. 36C.

FIG. 37 is a cross-sectional schematic diagram illustrating another example of the configuration of the organic photoelectric conversion section according to the modification example 10 of the present disclosure.

FIG. 38 is a cross-sectional schematic diagram illustrating another example of the configuration of the organic photoelectric conversion section according to the modification example 10 of the present disclosure.

FIG. 39 is a cross-sectional schematic diagram illustrating another example of the configuration of the organic photoelectric conversion section according to the modification example 10 of the present disclosure.

FIG. 40 is a cross-sectional schematic diagram illustrating an example of a configuration of an organic photoelectric conversion section according to a modification example 11 of the present disclosure.

FIG. 41A is a cross-sectional view for describing a method of manufacturing the organic photoelectric conversion section illustrated in FIG. 40.

FIG. 41B is a cross-sectional view of a step subsequent to FIG. 41A.

FIG. 41C is a cross-sectional view of a step subsequent to FIG. 41B.

FIG. 41D is a cross-sectional view of a step subsequent to FIG. 41C.

FIG. 41E is a cross-sectional view of a step subsequent to FIG. 41D.

FIG. 41F is a cross-sectional view of a step subsequent to FIG. 41E.

FIG. 41G is a cross-sectional view of a step subsequent to FIG. 41F.

FIG. 42 is a schematic diagram illustrating an example of a planar layout of a first semiconductor layer illustrated in FIG. 40.

FIG. 43 is a schematic diagram illustrating an example of a shape of a side surface of the organic photoelectric conversion section illustrated in FIG. 40.

FIG. 44 is a cross-sectional schematic diagram illustrating an example of a configuration of the first semiconductor layer in a pixel section and a peripheral region in a case where the organic photoelectric conversion section illustrated in FIG. 40 is used for the imaging element.

FIG. 45 is a cross-sectional schematic diagram illustrating another example of the configuration of the first semiconductor layer in the pixel section and the peripheral region in a case where the organic photoelectric conversion section illustrated in FIG. 40 is used for the imaging element.

FIG. 46 is a cross-sectional schematic diagram illustrating another example of the configuration of the first semiconductor layer in the pixel section and the peripheral region in a case where the organic photoelectric conversion section illustrated in FIG. 40 is used for the imaging element.

FIG. 47 is a cross-sectional schematic diagram illustrating an example of a configuration of a top of the organic photoelectric conversion section in the pixel section and the peripheral region illustrated in FIG. 44 or the like.

FIG. 48A is a cross-sectional schematic diagram illustrating an example of a configuration of an imaging element according to a modification example 12 of the present disclosure.

FIG. 48B is a plane schematic diagram illustrating an example of a pixel configuration of an imaging device including the imaging element illustrated in FIG. 48A.

FIG. 49A is a cross-sectional schematic diagram illustrating an example of a configuration of an imaging element according to a modification example 13 of the present disclosure.

FIG. 49B is a plane schematic diagram illustrating an example of a pixel configuration of an imaging device including the imaging element illustrated in FIG. 49A.

FIG. 50 is a cross-sectional schematic diagram illustrating an example of a configuration of an imaging element according to a modification example 14 of the present disclosure.

FIG. 51 is a cross-sectional schematic diagram illustrating an example of a configuration of an imaging element according to a modification example 15 of the present disclosure.

FIG. 52 is a cross-sectional schematic diagram illustrating an example of a configuration of an imaging element according to a modification example 16 of the present disclosure.

FIG. 53 is a block diagram illustrating a configuration of an imaging device in which the imaging element illustrated in FIG. 1 or the like is used as a pixel.

FIG. 54 is a functional block diagram illustrating an example of an electronic apparatus (camera) in which the imaging device illustrated in FIG. 53 is used.

FIG. 55 is a block diagram depicting an example of a schematic configuration of an in-vivo information acquisition system.

FIG. 56 is a view depicting an example of a schematic configuration of an endoscopic surgery system.

FIG. 57 is a block diagram depicting an example of a functional configuration of a camera head and a camera control unit (CCU).

FIG. 58 is a block diagram depicting an example of schematic configuration of a vehicle control system.

FIG. 59 is a diagram of assistance in explaining an example of installation positions of an outside-vehicle information detecting section and an imaging section.

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is not also limited to the disposition, dimensions, dimension ratios, and the like of the respective components illustrated in the respective diagrams. It is to be noted that description is given in the following order.

Figure 1:
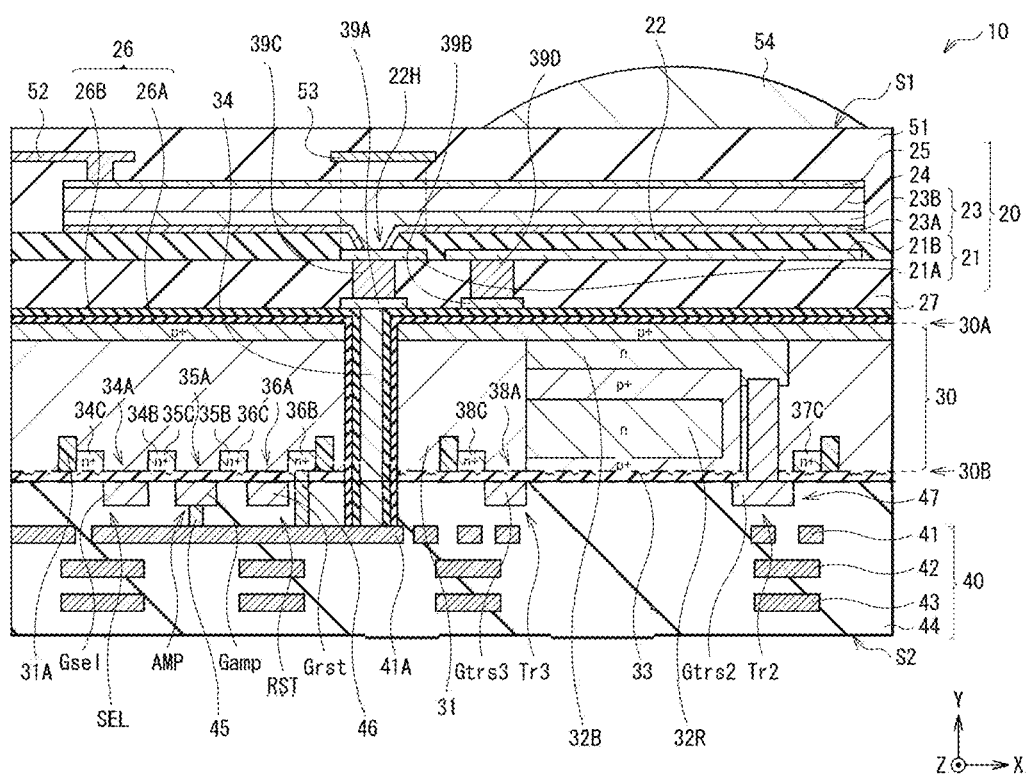
FIG. 1 is a cross-sectional schematic diagram illustrating an example of a configuration of an imaging element according to an embodiment of the present disclosure.

1. Embodiment (an example of an imaging element including a semiconductor layer including two layers each having a predetermined energy level (Ec) at a lowest edge of a conduction band between a lower electrode and a photoelectric conversion layer)
1-1. Configuration of Imaging Element
1-2. Method of Manufacturing Imaging Element
1-3. Signal Acquisition Operation of Imaging Element
1-4. Workings and Effects
2. Modification Examples
2-1. Modification Example 1 (an example in which a protective layer is further provided between a semiconductor layer and a photoelectric conversion layer)
2-2. Modification Example 2 (an example in which a semiconductor layer having a three-layer structure is provided between a lower electrode and a photoelectric conversion layer)
2-3. Modification Example 3 (an example in which a high carrier region is provided in a coupling section with a readout electrode)
2-4. Modification Example 4 (another example of a coupling portion between a readout electrode and a first semiconductor layer)
2-5. Modification Example 5 (another example of a coupling portion between a readout electrode and a first semiconductor layer)
2-6. Modification Example 6 (an example in which a transfer electrode is further provided as a lower electrode)
2-7. Modification Example 7 (an example in which a first semiconductor layer or a second semiconductor layer is stacked)
2-8. Modification Example 8 (an example in which a metal film is provided above a readout electrode)
2-9. Modification Example 9 (an example in which a second semiconductor layer is used as a stacked film of a crystal layer and an amorphous layer)
2-10. Modification Example 10 (an example in which a second semiconductor layer on a readout electrode is decreased in film thickness)
2-11. Modification Example 11 (an example in which an end surface of a first semiconductor layer is formed inside an end surface of an organic photoelectric conversion section)
2-12. Modification Example 12 (an example of an imaging element that uses a color filter to disperse light)
2-13. Modification Example 13 (another example of an imaging element that uses a color filter to disperse light)
2-14. Modification Example 14 (an example of an imaging element in which a plurality of organic photoelectric conversion sections is stacked)
2-15. Modification Example 15 (another example of an imaging element in which a plurality of organic photoelectric conversion sections is stacked)
2-16. Modification Example 16 (another example of an imaging element in which a plurality of organic photoelectric conversion sections is stacked)
3. Application Examples
4. Practical Application Examples 1. Embodiment FIG. 1 illustrates a cross-sectional configuration of an imaging element (imaging element 10) according to an embodiment of the present disclosure. FIG. 2 schematically illustrates an example of a planar configuration of the imaging element 10 illustrated in FIG. 1. FIG. 1 illustrates a cross section taken along the I-I line illustrated in FIG. 2. FIG. 3 is a schematic enlarged view of an example of a cross-sectional configuration of the main portion (organic photoelectric conversion section 20) of the imaging element 10 illustrated in FIG. 1. The imaging element 10 is included, for example, in one of pixels (unit pixels P) that are repeatedly disposed in an array in a pixel section 1A of an imaging device (e.g., an imaging device 1; see FIG. 53) such as a CMOS (Complementary Metal Oxide Semiconductor) image sensor used for an electronic apparatus such as a digital still camera or a video camera. In the pixel section 1A, pixel units 1a are repeatedly disposed as repeating units in an array having the row direction and the column direction. Each of the pixel units 1a includes the four unit pixels P that are disposed, for example, in two rows and two columns as illustrated in FIG. 2.

The imaging element 10 according to the present embodiment is provided with a semiconductor layer 23 having a stacked structure between a lower electrode 21 and the photoelectric conversion layer 24 in the organic photoelectric conversion section 20 provided on a semiconductor substrate 30. The lower electrode 21 includes a readout electrode 21A and an accumulation electrode 21B. The semiconductor layer 23 includes, for example, a first semiconductor layer 23A and a second semiconductor layer 23B. The first semiconductor layer 23A is provided on the lower electrode 21 side and has an energy level (Ec1) at the lowest edge of the conduction band that is shallower than an energy level (Ec2) of the second semiconductor layer 23B at the lowest edge of the conduction band. This readout electrode 21A corresponds to a specific example of a "second electrode" according to the present disclosure and the accumulation electrode 21B corresponds to a specific example of a "first electrode" according to the present disclosure. In addition, the first semiconductor layer 23A corresponds to a specific example of a "second layer" according to the present disclosure and the second semiconductor layer 23B corresponds to a specific example of a "first layer" according to the present disclosure.

1-1. Configuration of Imaging Element

The imaging element 10 is a so-called vertical spectroscopic imaging element in which the one organic photoelectric conversion section 20 and two inorganic photoelectric conversion sections 32B and 32R are stacked in the vertical direction. The organic photoelectric conversion section 20 is provided on the back surface (first surface 30A) side of the semiconductor substrate 30. The inorganic photoelectric conversion sections 32B and 32R are formed to be buried in the semiconductor substrate 30 and stacked in the thickness direction of the semiconductor substrate 30.

The organic photoelectric conversion section 20 and the inorganic photoelectric conversion sections 32B and 32R perform photoelectric conversion by selectively detecting respective pieces of light in different wavelength ranges. For example, the organic photoelectric conversion section 20 acquires a color signal of green (G). The inorganic photoelectric conversion sections 32B and 32R respectively acquire a color signal of blue (B) and a color signal of red (R) by using a difference between absorption coefficients. This allows the imaging element 10 to acquire a plurality of types of color signals in one pixel without using any color filter.

It is to be noted that, in the present embodiment, a case is described where the electron of a pair (exciton) of an electron and a hole generated through photoelectric conversion is read out as signal charge (a case where the n-type semiconductor region is used as a photoelectric conversion layer). In addition, in the drawings, "+(plus)" attached to "p" and "n" indicates a high p-type or n-type impurity concentration.

The front surface (second surface 30B) of the semiconductor substrate 30 is provided, for example, with floating diffusions (floating diffusion layers) FD1 (a region 36B in the semiconductor substrate 30), FD2 (a region 37C in the semiconductor substrate 30), and FD3 (a region 38C in the semiconductor substrate 30), transfer transistors Tr2 and Tr3, an amplifier transistor (modulation element) AMP, a reset transistor RST, and a selection transistor SEL. The second surface 30B of the semiconductor substrate 30 is further provided with a multilayer wiring layer 40 with a gate insulating layer 33 interposed in between. The multilayer wiring layer 40 has, for example, a configuration in which wiring layers 41, 42, and 43 are stacked in an insulating layer 44. A peripheral portion of the semiconductor substrate 30 or the periphery of the pixel section 1A is provided with a peripheral circuit portion 130 (see FIG. 53) including a logic circuit or the like.

It is to be noted that the diagram illustrates the first surface 30A side of the semiconductor substrate 30 as a light incidence side S1, and the second surface 30B side thereof as a wiring layer side S2.

In the organic photoelectric conversion section 20, the semiconductor layer 23 and the photoelectric conversion layer 24 are stacked in this order from the lower electrode 21 side between the lower electrode 21 and an upper electrode 25 that are disposed to be opposed to each other. The photoelectric conversion layer 24 is formed by using an organic material. As described above, the first semiconductor layer 23A and the second semiconductor layer 23B are stacked in this order from the lower electrode 21 side in the semiconductor layer 23. The first semiconductor layer 23A has the energy level (Ec1) at the lowest edge of the conduction band that is shallower than the energy level (Ec2) of the second semiconductor layer 23B at the lowest edge of the conduction band. The photoelectric conversion layer 24 includes a p-type semiconductor and an n-type semiconductor and has a bulk heterojunction structure therein. The bulk heterojunction structure is a p/n junction surface formed by mixing a p-type semiconductor and an n-type semiconductor.

The organic photoelectric conversion section 20 further includes an insulating layer 22 between the lower electrode 21 and the semiconductor layer 23. The insulating layer 22 is provided, for example, over the whole of the pixel section 1A. In addition, the insulating layer 22 has an opening 22H on the readout electrode 21A included in the lower electrode 21. The readout electrode 21A is electrically coupled to the semiconductor layer 23 through this opening 22H. Specifically, the first semiconductor layer 23A is formed from the top of the insulating layer 22 to a side surface of the opening 22H. The readout electrode 21A and the second semiconductor layer 23B are directly coupled on the bottom surface of the opening 22H. In other words, the first semiconductor layer 23A has an opening 23AH for exposing the readout electrode 21A, for example, in the opening 22H. The second semiconductor layer 23B is directly coupled to the readout electrode 21A through these openings 22H and 23AH. This opening 22H corresponds to a specific example of a "first opening" according to the present disclosure and the opening 23AH corresponds to a specific example of a "second opening" according to the present disclosure.

It is to be noted that FIG. 1 illustrates an example in which the semiconductor layers 23, the photoelectric conversion layers 24, and the upper electrodes 25 are separately formed for the respective imaging elements 10, but the semiconductor layer 23, the photoelectric conversion layer 24, and the upper electrode 25 may be provided, for example, as continuous layers that are common to the plurality of imaging elements 10.

For example, an insulating layer 26 and an interlayer insulating layer 27 are stacked between the first surface 30A of the semiconductor substrate 30 and the lower electrode 21. In the insulating layer 26, a layer (fixed electric charge layer) 26A having fixed electric charge and a dielectric layer 26B having an insulation property are stacked in this order from the semiconductor substrate 30 side.

The inorganic photoelectric conversion sections 32B and 32R each allow light to be dispersed in the vertical direction by using the fact that pieces of light to be absorbed have different wavelengths in accordance with the light incidence depth in the semiconductor substrate 30 including a silicon substrate. The inorganic photoelectric conversion sections 32B and 32R each have a pn junction in a predetermined region in the semiconductor substrate 30.

There is provided a through electrode 34 between the first surface 30A and the second surface 30B of the semiconductor substrate 30. The through electrode 34 is electrically coupled to the readout electrode 21A. The organic photoelectric conversion section 20 is coupled to a gate Gamp of the amplifier transistor AMP and the one source/drain region 36B of the reset transistor RST (reset transistor Trlrst) also serving as the floating diffusion FD1 through the through electrode 34. This allows the imaging element 10 to favorably transfer the electric charge (electrons here) generated by the organic photoelectric conversion section 20 provided on the first surface 30A side of the semiconductor substrate 30 to the second surface 30B side of the semiconductor substrate 30 through the through electrode 34 and increase the characteristics.

The lower end of the through electrode 34 is coupled to a wiring line (coupling section 41A) in the wiring layer 41 and the coupling section 41A and the gate Gamp of the amplifier transistor AMP are coupled through a lower first contact 45. The coupling section 41A and the floating diffusion FD1 (region 36B) are coupled, for example, through a lower second contact 46. The upper end of the through electrode 34 is coupled to the readout electrode 21A, for example, through a pad section 39A and an upper first contact 39C.

There is provided a protective layer 51 above the organic photoelectric conversion section 20. There are provided a wiring line 52 and a light shielding film 53 in the protective layer 51. The wiring line 52 electrically couples the upper electrode 25 and the peripheral circuit portion 130, for example, around the pixel section 1A. There is further provided an optical member such as a planarization layer (not illustrated) or an on-chip lens 54 above the protective layer 51.

In the imaging element 10 according to the present embodiment, light having entered the organic photoelectric conversion section 20 from the light incidence side S1 is absorbed by the photoelectric conversion layer 24. The excitons generated by this move to the interface between an electron donor and an electron acceptor included in the photoelectric conversion layer 24 and undergo exciton separation. In other words, the excitons are dissociated into electrons and holes. The electric charge (electrons and holes) generated here is transported to different electrodes by diffusion due to a carrier concentration difference and an internal electric field caused by a work function difference between the anode (e.g., the upper electrode 25) and the cathode (e.g., the lower electrode 21). The transported electric charge is detected as a photocurrent. In addition, the application of a potential between the lower electrode 21 and the upper electrode 25 makes it possible to control the transport directions of electrons and holes.

The following describes configurations, materials, and the like of the respective sections in detail.

The organic photoelectric conversion section 20 is an organic photoelectric conversion element that absorbs, for example, green light corresponding to a portion or the whole of a selective wavelength range (e.g., 450 nm or more and 650 nm or less) and generates excitons.

The lower electrode 21 includes, for example, the readout electrode 21A and the accumulation electrode 21B disposed in parallel on the interlayer insulating layer 27. The readout electrode 21A is for transferring the electric charge generated in the photoelectric conversion layer 24 to the floating diffusion FD1. Each of the pixel units 1a is provided with the one readout electrode 21A. The pixel unit 1a includes four pixels that are disposed, for example, in two rows and two columns. The readout electrode 21A is coupled to the floating diffusion FD1, for example, through the upper first contact 39C, the pad section 39A, the through electrode 34, the coupling section 41A, and the lower second contact 46. The accumulation electrode 21B is for accumulating the electrons of the electric charge generated in the photoelectric conversion layer 24, for example, in the semiconductor layer 23 as signal charge. The accumulation electrode 21B is provided for each of the pixels. Each of the unit pixels P is provided with the accumulation electrode 21B is provided in a region that is opposed to the light receiving surfaces of the inorganic photoelectric conversion sections 32B and 32R formed in the semiconductor substrate 30 and covers these light receiving surfaces. It is preferable that the accumulation electrode 21B be larger than the readout electrode 21A. This makes it possible to accumulate more electric charge.

The lower electrode 21 includes an electrically conducive film having light transmissivity. The lower electrode 21 includes, for example, ITO (indium tin oxide). In addition to ITO, a tin oxide ($SnO_2$)-based material to which a dopant is added or a zinc oxide-based material obtained by adding a dopant to zinc oxide (ZnO) may be used as a material included in the lower electrode 21. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, IGZO, ITZO, CuI, $InSbO_4$, ZnMgO, $CuInO_2$, $MgIN_2O_4$, CdO, $ZnSnO_3$, or the like may also be used in addition to these.

The insulating layer 22 is for electrically separating the accumulation electrode 21B and the semiconductor layer 23. The insulating layer 22 is provided, for example, above the interlayer insulating layer 27 to cover the lower electrode 21. The insulating layer 22 is provided with the opening 22H on the readout electrode 21A of the lower electrode 21 and the readout electrode 21A and the semiconductor layer 23 are electrically coupled through this opening 22H. The insulating layer 22 includes, for example, a single layer film including one of silicon oxide ($SiO_x$), silicon nitride ($SiN_x$), silicon oxynitride (SiON), or the like or a stacked film including two or more of them. The insulating layer 22 has, for example, a thickness of 20 nm to 500 nm.

The semiconductor layer 23 is for accumulating the electric charge generated by the photoelectric conversion layer 24. As described above, the semiconductor layer 23 is provided between the lower electrode 21 and the photoelectric conversion layer 24. The semiconductor layer 23 has a stacked structure in which the first semiconductor layer 23A and the second semiconductor layer 23B are stacked in this order from the lower electrode 21 side. Specifically, the first semiconductor layer 23A is provided on the insulating layer 22 that electrically separates the lower electrode 21 and the semiconductor layer 23. The first semiconductor layer 23A covers a side surface of the opening 22H provided on the readout electrode 21A and has the opening 23AH for exposing the readout electrode 21A in the opening 22H. The second semiconductor layer 23B is provided between the first semiconductor layer 23A and the photoelectric conversion layer 24 and electrically coupled directly to the readout electrode 21A through the openings 22H and 23AH. The first semiconductor layer 23A and the second semiconductor layer 23B each have a predetermined energy level.

FIG. 4A illustrates the energy levels of the insulating layer 22, the first semiconductor layer 23A, the second semiconductor layer 23B, and the photoelectric conversion layer 24 stacked above the accumulation electrode 21B. FIG. 4B illustrates the energy levels of the insulating layer 22, the second semiconductor layer 23B, and the photoelectric conversion layer 24 stacked in the openings 22H and 23AH provided on the readout electrode 21A. It is preferable that the first semiconductor layer 23A have the energy level (Ec1) at the lowest edge of the conduction band that is shallower than the energy level (Ec2) of the second semiconductor layer 23B at the lowest edge of the conduction band (Ec1>Ec2 in a case where the direction farther from the vacuum level is defined as leading to less energy (negative and a larger absolute value)). In addition, it is preferable that the photoelectric conversion layer 24 have an energy level (Ec0) at the lowest edge of the conduction band that is shallower than the energy level (Ec2) of the second semiconductor layer 23B at the lowest edge of the conduction band (Ec0>Ec2 in a case where the direction farther from the vacuum level is defined as leading to less energy (negative and a larger absolute value)). It is effective especially in a case where Ec1 is shallower than Ec2 as the difference (Ec2−Ec1) between the energy levels of the first semiconductor layer 23A and the second semiconductor layer 23B at the lowest edges of the conduction bands, but an absolute value of more than 0.2 eV is preferable. Further, an absolute value of more than 0.4 eV is desirable.

This transports the electric charge (electrons) generated by the photoelectric conversion layer 24 to the accumulation electrode 21B side in accordance with the energy gradient. The first semiconductor layer 23A, however, has the energy level at the lowest edge of the conduction band that is higher (shallower) than that of the second semiconductor layer 23B. The electrons transported from the photoelectric conversion layer 24 are thus accumulated on the first semiconductor layer 23A. After that, the electrons accumulated above the accumulation electrode 21B are transferred to the readout electrode 21A by controlling the potential of the accumulation electrode 21B and generating a potential gradient, which is described in detail below. In that case, the first semiconductor layer 23A on the readout electrode 21A is removed and the readout electrode 21A thus transfers electrons to the floating diffusion FD1 with no electron barrier.

It is possible to form the semiconductor layer 23 (the first semiconductor layer 23A and the second semiconductor layer 23B) by using, for example, the following materials. In the present embodiment, the electrons of the electric charge generated by the photoelectric conversion layer 24 are used as signal charge. This makes it possible to form the semiconductor layer 23 by using an n-type oxide semiconductor material. Specifically, IGZO (In—Ga—Zn—O-based oxide semiconductor), ITZO (In—Sn—Zn—O-based oxide semiconductor), ZTO (Zn—Sn—O-based oxide semiconductor), IGZTO (In—Ga—Zn—Sn—O-based oxide semiconductor), GTO (Ga—Sn—O-based oxide semiconductor), IGO (In—Ga—O-based oxide semiconductor), or the like is included. In addition, it is possible to use AlZnO, GaZnO, InZnO, or the like obtained by adding aluminum (Al), gallium (Ga), indium (In), or the like to the oxide semiconductor described above as a dopant or a material including CuI, InSbO$_4$, ZnMgO, CuInO$_2$, MgIN$_2$O$_4$, CdO, and the like.

It is preferable to use at least one of the oxide semiconductor materials described above for the first semiconductor layer 23A and the second semiconductor layer 23B. Among them, IGZO is favorably used. It is possible to control the energy levels (Ec) of the first semiconductor layer 23A and the second semiconductor layer 23B at the lowest edges of the conduction bands, for example, by using the content of one of gallium (Ga) or zinc (Zn) or the contents of both of them. For example, the first semiconductor layer 23A has a Ga content that is higher than or equal to the Ga content of the second semiconductor layer 23B. This allows the energy level (Ec1) of the first semiconductor layer 23A at the lowest edge of the conduction band to be shallower than the energy level (Ec2) of the second semiconductor layer 23B at the lowest edge of the conduction band. In addition, the first semiconductor layer 23A has a Zn content that is higher than or equal to the Zn content of the second semiconductor layer 23B. This allows the energy level (Ec1) of the first semiconductor layer 23A at the lowest edge of the conduction band to be shallower than the energy level (Ec2) of the second semiconductor layer 23B at the lowest edge of the conduction band. In addition, it is also possible to obtain similar characteristics by causing the first semiconductor layer 23A to have a Si content that is higher than or equal to the Si content of the second semiconductor layer 23B.

The first semiconductor layer 23A and the second semiconductor layer 23B both have, for example, crystallinity or amorphousness. Alternatively, one of the first semiconductor layer 23A or the second semiconductor layer 23B may have crystallinity and the other may have amorphousness. In addition, in a case where the first semiconductor layer 23A and the second semiconductor layer 23B both have crystallinity, the first semiconductor layer 23A may have a stacked structure of an amorphous layer and a crystal layer. Specifically, a portion (an initial layer having a film thickness of several nm in a case where the first semiconductor layer 23A is formed) of the first semiconductor layer 23A may be an amorphous layer. In a case where the first semiconductor layer 23A and the second semiconductor layer 23B are both formed as crystal layers, the first semiconductor layer 23A plays the role of the seed crystal of the second semiconductor layer 23B. This makes it possible to form the second semiconductor layer 23B having favorable film quality. It is possible to reduce the defect level at the interface between the first semiconductor layer 23A and the second semiconductor layer 23B. In a case where the first semiconductor layer 23A is a crystal layer and the second semiconductor layer 23B is an amorphous layer, the impurities in the layers are reduced as compared with the direction formation on the insulating layer 22. This makes it possible to reduce the defect level caused by the impurities. In addition, the inhibition of crystal growth caused by the impurities is also reduced, making it possible to increase crystallinity. In a case where the first semiconductor layer 23A is an amorphous layer and the second semiconductor layer 23B is a crystal layer and in a case where both the first semiconductor layer 23A and the second semiconductor layer 23B are amorphous layers, the impurities in silicon are also reduced. This makes it possible to reduce the defect level.

The thickness of the first semiconductor layer 23A is not specified in particular, but it is preferable that the first semiconductor layer 23A have, for example, a thickness of 1 nm or more and 50 nm or less. This is because a tunnelling effect causes electrons to pass through the first semiconductor layer 23A in a thin film region having, for example, a thickness of less than 1 nm. This is because the capacitance increases and the saturated amount of electric charge decreases in a case where the thickness is greater, for example, than 50 nm. It is preferable that the second semiconductor layer 23B have, for example, a thickness of 5 nm or more. This is because electrons are more likely to flow back to the photoelectric conversion film in a thin film region having, for example, a thickness of less than 5 nm in a case where the electrons are transferred. No upper limit is set in particular for the thickness of the second semiconductor layer 23B. For example, 200 nm, however, makes it possible to obtain sufficiently stable characteristics. Providing the semiconductor layer 23 having the configuration described above between the insulating layer 22 and the photoelectric conversion layer 24 makes it possible to accumulate and transfer electric charge while avoiding an electric charge trap at the interface between the insulating layer 22 and the semiconductor layer 23 including different types of materials.

The photoelectric conversion layer 24 converts light energy to electric energy. The photoelectric conversion layer 24 includes, for example, two or more types of organic semiconductor materials (a p-type semiconductor material or an n-type semiconductor material) that each function as a p-type semiconductor or an n-type semiconductor. The photoelectric conversion layer 24 has the junction surface (p/n junction surface) therein between the p-type semiconductor material and the n-type semiconductor material. The p-type semiconductor relatively functions as an electron donor (donor) and the n-type semiconductor relatively functions as an electron acceptor (acceptor). The photoelectric conversion layer 24 provides a field in which excitons generated in absorbing light are separated into electrons and holes. Specifically, excitons are separated into electrons and holes at the interface (p/n junction surface) between the electron donor and the electron acceptor.

The photoelectric conversion layer 24 may include an organic material or a so-called dye material in addition to the p-type semiconductor material and the n-type semiconductor material. The organic material or the dye material photoelectrically converts light in a predetermined wavelength range and transmits light in another wavelength range. In a case where the photoelectric conversion layer 24 is formed by using the three types of organic materials including a p-type semiconductor material, an n-type semiconductor material, and a dye material, it is preferable that the p-type semiconductor material and the n-type semiconductor material be materials each having light transmissivity in a visible region (e.g., 450 nm to 800 nm). The photoelectric conversion layer 24 has, for example, a thickness of 50 nm to 500 nm.

Examples of organic materials included in the photoelectric conversion layer 24 include a quinacridone derivative, a naphthalene derivative, an anthracene derivative, a phenanthrene derivative, a tetracene derivative, a pyrene derivative, a perylene derivative, and a fluoranthene derivative. The photoelectric conversion layer 24 includes two or more of the organic materials described above in combination. The organic materials described above function as a p-type semiconductor or an n-type semiconductor depending on the combination.

It is to be noted that the organic materials included in the photoelectric conversion layer 24 are not limited in particular. It is possible to use, for example, a polymer including phenylenevinylene, fluorene, carbazole, indole, pyrene, pyrrole, picoline, thiophene, acetylene, diacetylene, and the like or a derivative thereof in addition to the organic materials described above. Alternatively, it is possible to use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, a naphthoquinone-based dye, an anthraquinone-based dye, a chain compound in which a fused polycyclic aromatic group including pyrene and the like, an aromatic ring, or a heterocyclic compound is fused, a cyanine-like dye bonded by two nitrogen-containing hetero rings including quinoline, benzothiazole, benzoxazole, and the like that have a squarylium group and a croconic methine group as a bonded chain or by a squarylium group and a croconic methine group, or the like. It is to be noted that a dithiol metal complex-based dye, a metallophthalocyanine dye, a metalloporphyrine dye, or a ruthenium complex dye is included as the metal complex dye. A ruthenium complex dye is preferable in particular among them, but the metal complex dye is not limited to this.

The upper electrode 25 includes an electrically conducive film having light transmissivity as with the upper electrode 25. The upper electrode 25 includes, for example, ITO (indium tin oxide). In addition to this ITO, a tin oxide ($SnO_2$)-based material to which a dopant is added or a zinc oxide-based material obtained by adding a dopant to zinc oxide (ZnO) may be used as a material included in the upper electrode 25. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, IGZO, ITZO, CuI, $InSbO_4$, ZnMgO, $CuInO_2$, $MgIN_2O_4$, CdO, $ZnSnO_3$, or the like may also be used in addition to these. The upper electrodes 25 may be separated for the respective pixels or the upper electrode 25 may be formed as an electrode common to the respective pixels. The upper electrode 25 has, for example, a thickness of 10 nm to 200 nm.

It is to be noted that the organic photoelectric conversion section 20 may be provided with other layers between the photoelectric conversion layer 24 and the lower electrode 21 (e.g., between the semiconductor layer 23 and the photoelectric conversion layer 24) and between the photoelectric conversion layer 24 and the upper electrode 25. For example, in the organic photoelectric conversion section 20, the semiconductor layer 23, a buffer layer also serving as an electron blocking film, the photoelectric conversion layer 24, a buffer layer also serving as a hole blocking film, a work function adjustment layer, and the like may be stacked in order from the lower electrode 21 side. In addition, the photoelectric conversion layer 24 may have a pin bulk heterostructure in which, for example, a p-type blocking layer, a layer (i layer) including a p-type semiconductor and an n-type semiconductor, and an n-type blocking layer are stacked.

The insulating layer 26 covers the first surface 30A of the semiconductor substrate 30 and reduces the interface state with the semiconductor substrate 30. In addition, the insulating layer 26 is for suppressing the generation of dark currents from the interface with the semiconductor substrate 30. In addition, the insulating layer 26 extends from the first surface 30A of the semiconductor substrate 30 to a side surface of the opening 34H (see FIG. 8) in which the through electrode 34 is formed. The through electrode 34 penetrates the semiconductor substrate 30. The insulating layer 26 has, for example, a stacked structure of the fixed electric charge layer 26A and the dielectric layer 26B.

The fixed electric charge layer 26A may be a film having positive fixed electric charge or a film having negative fixed electric charge. It is preferable that a semiconductor material or an electrically conductive material having a wider band gap than that of the semiconductor substrate 30 be used as a material of the fixed electric charge layer 26A. This makes it possible to suppress the generation of dark currents at the interface of the semiconductor substrate 30. Examples of materials included in the fixed electric charge layer 26A include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_xN_y$), aluminum oxynitride ($AlO_xN_y$), and the like.

The dielectric layer 26B is for preventing the reflection of light caused by a refractive index difference between the semiconductor substrate 30 and the interlayer insulating layer 27. It is preferable that a material included in the dielectric layer 26B be a material having a refractive index between the refractive index of the semiconductor substrate 30 and the refractive index of the interlayer insulating layer 27. Examples of a material included in the dielectric layer 26B include silicon oxide, TEOS, silicon nitride, silicon oxynitride (SiON), and the like.

The interlayer insulating layer 27 includes, for example, a single layer film including one of silicon oxide, silicon nitride, silicon oxynitride, or the like or a stacked film including two or more of them.

Although not illustrated in FIG. 1, there is provided a shield electrode 28 on the interlayer insulating layer 27 along with the lower electrode 21. The shield electrode 28 is for preventing capacitive coupling between the adjacent pixel units 1a. The shield electrode 28 is provided around the pixel units 1a each including four pixels that are disposed, for example, in two rows and two columns. A fixed potential is applied to the shield electrode 28. The shield electrode 28 further extends between the pixels adjacent in the row direction (Z axis direction) and the column direction (X axis direction) in the pixel unit 1a.

The semiconductor substrate 30 includes, for example, an n-type silicon (Si) substrate and includes a p-well 31 in a predetermined region.

The inorganic photoelectric conversion sections 32B and 32R each include a photodiode (PD) having a pn junction in a predetermined region in the semiconductor substrate 30. The inorganic photoelectric conversion sections 32B and 32R each allow light to be dispersed in the vertical direction by using the fact that pieces of light to be absorbed have different wavelengths in accordance with the light incidence depth in the Si substrate. The inorganic photoelectric conversion section 32B selectively detects, for example, blue light to accumulate the signal charge corresponding to blue. The inorganic photoelectric conversion section 32B is installed at a depth that allows the blue light to be photoelectrically converted efficiently. The inorganic photoelectric conversion section 32R selectively detects, for example, red light to accumulate the signal charge corresponding to red. The inorganic photoelectric conversion section 32R is installed at a depth that allows the red light to be photoelectrically converted efficiently. It is to be noted that blue (B) is a color corresponding, for example, to a wavelength range of 450 nm to 495 nm and red (R) is a color corresponding, for example, to a wavelength range of 620 nm to 750 nm. It is sufficient if each of the inorganic photoelectric conversion sections 32B and 32R is configured to detect light in a portion or the whole of the wavelength range.

The inorganic photoelectric conversion section 32B includes, for example, a p+ region serving as a hole accumulation layer and an n region serving as an electron accumulation layer. The inorganic photoelectric conversion section 32R includes, for example, a p+ region serving as a hole accumulation layer and an n region serving as an electron accumulation layer (has a p-n-p stacked structure). The n region of the inorganic photoelectric conversion section 32B is coupled to the vertical transfer transistor Tr2. The p+ region of the inorganic photoelectric conversion section 32B is bent along the transfer transistor Tr2 and leads to the p+ region of the inorganic photoelectric conversion section 32R.

The gate insulating layer 33 includes, for example, a single layer film including one of silicon oxide, silicon nitride, silicon oxynitride, or the like or a stacked film including two or more of them.

The through electrode 34 is provided between the first surface 30A and the second surface 30B of the semiconductor substrate 30. The through electrode 34 has a function of a connector for the organic photoelectric conversion section 20 and the gate Gamp of the amplifier transistor AMP and the floating diffusion FD1 and serves as a transmission path for the electric charge generated by the organic photoelectric conversion section 20. A reset gate Grst of the reset transistor RST is disposed next to the floating diffusion FD1 (the one source/drain region 36B of the reset transistor RST). This allows the reset transistor RST to reset the electric charge accumulated in the floating diffusion FD1.

It is possible to form the pad sections 39A and 39B, the upper first contact 39C, an upper second contact 39D, the lower first contact 45, the lower second contact 46, and the wiring line 52 by using, for example, doped silicon materials such as PDAS (Phosphorus Doped Amorphous Silicon) or metal materials including aluminum (Al), tungsten (W), titanium (Ti), cobalt (Co), hafnium (Hf), tantalum (Ta), and the like.

The protective layer 51 and the on-chip lens 54 each include a material having light transmissivity. The protective layer 51 and the on-chip lens 54 each include, for example, a single layer film including any of silicon oxide, silicon nitride, silicon oxynitride, or the like or a stacked film including two or more of them. This protective layer 51 has, for example, a thickness of 100 nm to 30000 nm.

The light shielding film 53 is provided, for example, in the protective layer 51 along with the wiring line 52 not to overlap with at least the accumulation electrode 21B, but to cover the region of the readout electrode 21A in direct contact with the semiconductor layer 23. It is possible to form the light shielding film 53 by using, for example, tungsten (W), aluminum (Al), an alloy of Al and copper (Cu), and the like.

FIG. 5 is an equivalent circuit diagram of the imaging element 10 illustrated in FIG. 1. FIG. 6 schematically illustrates disposition of the lower electrode 21 and a transistor included in a controller in the imaging element 10 illustrated in FIG. 1.

The reset transistor RST (reset transistor TR1*rst*) is for resetting the electric charge transferred from the organic photoelectric conversion section 20 to the floating diffusion FD1 and includes, for example, a MOS transistor. Specifically, the reset transistor TR1*rst* includes the reset gate Grst, a channel formation region 36A, and the source/drain regions 36B and 36C. The reset gate Grst is coupled to a reset line RST1. The one source/drain region 36B of the reset transistor TR1*rst* also serves as the floating diffusion FD1. The other source/drain region 36C included in the reset transistor TR1*rst* is coupled to a power supply line VDD.

The amplifier transistor AMP (amplifier transistor TR1*amp*) is a modulation element that modulates, to a voltage, the amount of electric charge generated by the organic photoelectric conversion section 20 and includes, for example, a MOS transistor. Specifically, the amplifier transistor AMP includes the gate Gamp, a channel formation region 35A, and the source/drain regions 35B and 35C. The gate Gamp is coupled to the readout electrode 21A and the one source/drain region 36B (floating diffusion FD1) of the reset transistor TR1*rst* through the lower first contact 45, the coupling section 41A, the lower second contact 46, the through electrode 34, and the like. In addition, the one source/drain region 35B shares a region with the other source/drain region 36C included in the reset transistor TR1*rst* and is coupled to the power supply line VDD.

The selection transistor SEL (selection transistor TR1*sel*) includes a gate Gsel, a channel formation region 34A, and source/drain regions 34B and 34C. The gate Gsel is coupled to a selection line SEL1. The one source/drain region 34B shares a region with the other source/drain region 35C included in the amplifier transistor AMP and the other source/drain region 34C is coupled to a signal line (data output line) VSL1.

The transfer transistor TR2 (transfer transistor TR2*trs*) is for transferring, to the floating diffusion FD2, the signal charge corresponding to blue that has been generated and accumulated in the inorganic photoelectric conversion section 32B. The inorganic photoelectric conversion section 32B is formed at a deep position from the second surface 30B of the semiconductor substrate 30 and it is thus preferable that the transfer transistor TR2*trs* of the inorganic photoelectric conversion section 32B include a vertical transistor. The transfer transistor TR2*trs* is coupled to a transfer gate line TG2. The floating diffusion FD2 is provided in the region 37C near a gate Gtrs2 of the transfer transistor TR2*trs*. The electric charge accumulated in the inorganic photoelectric conversion section 32B is read out to the floating diffusion FD2 through a transfer channel formed along the gate Gtrs2.

The transfer transistor TR3 (transfer transistor TR3*trs*) is for transferring, to the floating diffusion FD3, the signal charge corresponding to red that has been generated and accumulated in the inorganic photoelectric conversion section 32R. The transfer transistor TR3 (transfer transistor TR3*trs*) includes, for example, a MOS transistor. The transfer transistor TR3*trs* is coupled to a transfer gate line TG3. The floating diffusion FD3 is provided in the region 38C near a gate Gtrs3 of the transfer transistor TR3*trs*. The electric charge accumulated in the inorganic photoelectric conversion section 32R is read out to the floating diffusion FD3 through a transfer channel formed along the gate Gtrs3.

The second surface 30B side of the semiconductor substrate 30 is further provided with a reset transistor TR2*rst*, an amplifier transistor TR2*amp*, and a selection transistor TR2*sel* included in the controller of the inorganic photoelectric conversion section 32B. Further, there are provided a reset transistor TR3*rst*, an amplifier transistor TR3*amp*, and a selection transistor TR3*sel* included in the controller of the inorganic photoelectric conversion section 32R.

The reset transistor TR2*rst* includes a gate, a channel formation region, and source/drain regions. The gate of the reset transistor TR2*rst* is coupled to a reset line RST2 and the one source/drain region of the reset transistor TR2*rst* is coupled to the power supply line VDD. The other source/drain region of the reset transistor TR2*rst* also serves as the floating diffusion FD2.

The amplifier transistor TR2*amp* includes a gate, a channel formation region, and source/drain regions. The gate is coupled to the other source/drain region (floating diffusion FD2) of the reset transistor TR2*rst*. The one source/drain region included in the amplifier transistor TR2*amp* shares a region with the one source/drain region included in the reset transistor TR2*rst* and is coupled to the power supply line VDD.

The selection transistor TR2*sel* includes a gate, a channel formation region, and source/drain regions. The gate is coupled to a selection line SEL2. The one source/drain region included in the selection transistor TR2*sel* shares a region with the other source/drain region included in the amplifier transistor TR2*amp*. The other source/drain region included in the selection transistor TR2*sel* is coupled to a signal line (data output line) VSL2.

The reset transistor TR3*rst* includes a gate, a channel formation region, and source/drain regions. The gate of the reset transistor TR3*rst* is coupled to a reset line RST3 and the one source/drain region included in the reset transistor TR3*rst* is coupled to the power supply line VDD. The other source/drain region included in the reset transistor TR3*rst* also serves as the floating diffusion FD3.

The amplifier transistor TR3*amp* includes a gate, a channel formation region, and source/drain regions. The gate is coupled to the other source/drain region (floating diffusion FD3) included in the reset transistor TR3*rst*. The one source/drain region included in the amplifier transistor TR3*amp* shares a region with the one source/drain region included in the reset transistor TR3*rst* and is coupled to the power supply line VDD.

The selection transistor TR3*sel* includes a gate, a channel formation region, and source/drain regions. The gate is coupled to a selection line SEL3. The one source/drain region included in the selection transistor TR3*sel* shares a region with the other source/drain region included in the amplifier transistor TR3*amp*. The other source/drain region included in the selection transistor TR3*sel* is coupled to a signal line (data output line) VSL3.

The reset lines RST1, RST2, and RST3, the selection lines SEL1, SEL2, and SEL3, and the transfer gate lines TG2 and TG3 are each coupled to a vertical drive circuit included in a drive circuit. The signal lines (data output lines) VSL1, VSL2, and VSL3 are coupled to a column signal processing circuit 113 included in the drive circuit.

1-2. Method of Manufacturing Imaging Element

It is possible to manufacture the imaging element 10 according to the present embodiment, for example, as follows.

FIGS. 7 to 12 illustrate a method of manufacturing the imaging element 10 in the order of steps. First, as illustrated in FIG. 7, for example, the p-well 31 is formed in the semiconductor substrate 30. For example, the n-type inorganic photoelectric conversion sections 32B and 32R are formed in this p-well 31. A p+ region is formed near the first surface 30A of the semiconductor substrate 30.

As also illustrated in FIG. 7, for example, n+ regions that serve as the floating diffusions FD1 to FD3 are formed on the second surface 30B of the semiconductor substrate 30 and a gate insulating layer 33 and a gate wiring layer 47 are then formed. The gate wiring layer 47 includes the respective gates of the transfer transistor Tr2, the transfer transistor Tr3, the selection transistor SEL, the amplifier transistor AMP, and the reset transistor RST. This forms the transfer transistor Tr2, the transfer transistor Tr3, the selection transistor SEL, the amplifier transistor AMP, and the reset transistor RST. Further, the multilayer wiring layer 40 is formed on the second surface 30B of the semiconductor substrate 30. The multilayer wiring layer 40 includes the wiring layers 41 to 43 and the insulating layer 44. The wiring layers 41 to 43 include the lower first contact 45, the lower second contact 46, and the coupling section 41A.

As the base of the semiconductor substrate 30, for example, an SOI (Silicon on Insulator) substrate is used in which the semiconductor substrate 30, a buried oxide film (not illustrated), and a holding substrate (not illustrated) are stacked. Although not illustrated in FIG. 7, the buried oxide film and the holding substrate are joined to the first surface 30A of the semiconductor substrate 30. After ion implantation, annealing treatment is performed.

Next, a support substrate (not illustrated), another semiconductor base, or the like is joined onto the multilayer wiring layer 40 provided on the second surface 30B side of the semiconductor substrate 30 and flipped vertically. Subsequently, the semiconductor substrate 30 is separated from the buried oxide film and the holding substrate of the SOI substrate to expose the first surface 30A of the semiconductor substrate 30. It is possible to perform the steps described above with technology used in a normal CMOS process including ion implantation, a CVD (Chemical Vapor Deposition) method, and the like.

Next, as illustrated in FIG. 8, the semiconductor substrate 30 is processed from the first surface 30A side, for example, by dry etching to form, for example, an annular opening 34H. The depth of the opening 34H extends from the first surface 30A to the second surface 30B of the semiconductor substrate 30 and reaches, for example, the coupling section 41A as illustrated in FIG. 8.

Subsequently, for example, the fixed electric charge layer 26A and the dielectric layer 26B are formed in order on the first surface 30A of the semiconductor substrate 30 and the side surfaces of the opening 34H. It is possible to form the fixed electric charge layer 26A by forming a hafnium oxide film or an aluminum oxide film, for example, with an atomic layer deposition method (ALD method). It is possible to form the dielectric layer 26B by forming a silicon oxide film, for example, with a plasma CVD method. Next, the pad sections 39A and 39B are formed at predetermined positions on the dielectric layer 26B. In each of the pad sections 39A and 39B, a barrier metal including, for example, a stacked film (Ti/TiN film) of titanium and titanium nitride and a tungsten film are stacked. This makes it possible to use the pad sections 39A and 39B as light shielding films. After that, the interlayer insulating layer 27 is formed on the dielectric layer 26B and the pad sections 39A and 39B and the surface of the interlayer insulating layer 27 is planarized by using a CMP (Chemical Mechanical Polishing) method.

Subsequently, as illustrated in FIG. 9, openings 27H1 and 27H2 are respectively formed above the pad sections 39A and 39B. After that, these openings 27H1 and 27H2 are filled, for example, with electrically conductive materials such as Al to form the upper first contact 39C and the upper second contact 39D.

Next, as illustrated in FIG. 10, the electrically conductive film 21x is formed on the interlayer insulating layer 27 by using, for example, a sputtering method and patterning is then performed by using photolithography technology. Specifically, the photoresist PR is formed at a predetermined position in the electrically conducive film 21x and the electrically conducive film 21x is then processed by using dry etching or wet etching. After that, the readout electrode 21A and the accumulation electrode 21B are formed as illustrated in FIG. 11 by removing the photoresist PR.

Subsequently, as illustrated in FIG. 12, the insulating layer 22, the semiconductor layer 23 including the first semiconductor layer 23A and the second semiconductor layer 23B, the photoelectric conversion layer 24, and the upper electrode 25 are formed. For example, a silicon oxide film is formed for the insulating layer 22 by using, for example, an ALD method. After that, the surface of the insulating layer 22 is planarized by using a CMP method. After that, the opening 22H is formed on the readout electrode 21A by using, for example, wet etching. It is possible to form the semiconductor layer 23 (the first semiconductor layer 23A and the second semiconductor layer 23B) by using, for example, a sputtering method. In this case, it is possible to form the first semiconductor layer 23A having the predetermined energy level (Ec1) at the lowest edge of the conduction band and the second semiconductor layer 23B having the energy level (Ec2) at the lowest edge of the conduction band that is deeper than that of the first semiconductor layer 23A by adjusting the content of one of gallium (Ga) or zinc (Zn) or the contents of both of them. Alternatively, it is also possible to expect a similar effect by using InGaSiO for the first semiconductor layer 23A. The opening 23AH of the first semiconductor layer 23A is formed by using, for example, wet etching. The photoelectric conversion layer 24 is formed by using, for example, a vacuum evaporation method. The upper electrode 25 is formed by using, for example, a sputtering method as with the lower electrode 21. Finally, the protective layer 51 including the wiring line 52 and the light shielding film 53 and the on-chip lens 54 are provided on the upper electrode 25. Thus, the imaging element 10 illustrated in FIG. 1 is completed.

It is to be noted that, in a case where other layers each including an organic material such as buffer layers also serving as electron blocking films, buffer layers also serving as hole blocking films, or work function adjustment layers are formed between the semiconductor layer 23 and the photoelectric conversion layer 24 and between the photoelectric conversion layer 24 and the upper electrode 25 as described above, it is preferable to form the respective layers continuously (in an in-situ vacuum process) in a vacuum step. In addition, the method of forming the photoelectric conversion layer 24 is not necessarily limited to a technique that uses a vacuum evaporation method. For example, spin coating technology, printing technology, or the like may be used. Further, a method of forming transparent electrodes (the lower electrode 21 and the upper electrode 25) includes, depending on materials included in the transparent electrodes, a physical vapor deposition method (PVD method) such as a vacuum evaporation method, a reactive evaporation method, an electron beam evaporation method, or an ion plating method, a pyrosol method, a method of pyrolyzing an organic metal compound, a spraying method, a dip method, a variety of CVD methods including a MOCVD method, an electroless plating method, and an electroplating method in addition to a sputtering method.

1-3. Signal Acquisition Operation of Imaging Element

In a case where light enters the organic photoelectric conversion section 20 through the on-chip lens 54 in the imaging element 10, the light passes through the organic photoelectric conversion section 20 and the inorganic photoelectric conversion sections 32B and 32R in this order. While the light passes through the organic photoelectric conversion section 20 and the inorganic photoelectric conversion sections 32B and 32R, the light is photoelectrically converted for each of green (G) light, blue (B) light, and red (R) light. The following describes operations of acquiring signals of the respective colors.

(Acquisition of Green Color Signal by Organic Photoelectric Conversion Section 20)

First, the green light of the pieces of light having entered the imaging element 10 is selectively detected (absorbed) and photoelectrically converted by the organic photoelectric conversion section 20.

The organic photoelectric conversion section 20 is coupled to the gate Gamp of the amplifier transistor TR1*amp* and the floating diffusion FD1 through the through electrode 34. Thus, the electron of an exciton generated by the organic photoelectric conversion section 20 is taken out from the lower electrode 21 side, transferred to the second surface 30S2 side of the semiconductor substrate 30 through the through electrode 34, and accumulated in the floating diffusion FD1. At the same time as this, the amplifier transistor TR1*amp* modulates the amount of electric charge generated by the organic photoelectric conversion section 20 to a voltage.

In addition, the reset gate Grst of the reset transistor TR1*rst* is disposed next to the floating diffusion FD1. This causes the reset transistor TR1*rst* to reset the electric charge accumulated in the floating diffusion FD1.

Here, the organic photoelectric conversion section 20 is coupled to not only the amplifier transistor TR1*amp*, but also the floating diffusion FD1 through the through electrode 34, allowing the reset transistor TR1*rst* to easily reset the electric charge accumulated in the floating diffusion FD1.

In contrast, in a case where the through electrode 34 and the floating diffusion FD1 are not coupled, it is difficult to reset the electric charge accumulated in the floating diffusion FD1. A large voltage has to be applied to pull out the electric charge to the upper electrode 25 side. The photoelectric conversion layer 24 may be therefore damaged. In addition, a structure that allows for resetting in a short period of time leads to increased dark-time noise and results in a trade-off. This structure is thus difficult.

FIG. 13 illustrates an operation example of the imaging element 10. (A) illustrates the potential at the accumulation electrode 21B, (B) illustrates the potential at the floating diffusion FD1 (readout electrode 21A), and (C) illustrates the potential at the gate (Gsel) of the reset transistor TR1*rst*. In the imaging element 10, voltages are individually applied to the readout electrode 21A and the accumulation electrode 21B.

In the imaging element 10, the drive circuit applies a potential V1 to the readout electrode 21A and applies a potential V2 to the accumulation electrode 21B in an accumulation period. Here, it is assumed that the potentials V1 and V2 satisfy V2>V1. This causes electric charge (signal charge; electrons) generated through photoelectric conversion to be drawn to the accumulation electrode 21B and accumulated in the region of the semiconductor layer 23 opposed to the accumulation electrode 21B (accumulation period). Additionally, the value of the potential in the region of the semiconductor layer 23 opposed to the accumulation electrode 21B becomes more negative with the passage of time of photoelectric conversion. It is to be noted that holes are sent from the upper electrode 25 to the drive circuit.

In the imaging element 10, a reset operation is performed in the latter half of the accumulation period. Specifically, at a timing t1, a scanning section changes the voltage of a reset signal RST from the low level to the high level. This turns on the reset transistor TR1*rst* in the unit pixel P. As a result, the voltage of the floating diffusion FD1 is set to the power supply voltage and the voltage of the floating diffusion FD1 is reset (reset period).

After the reset operation is completed, the electric charge is read out. Specifically, the drive circuit applies a potential V3 to the readout electrode 21A and applies a potential V4 to the accumulation electrode 21B at a timing t2. Here, it is assumed that the potentials V3 and V4 satisfy V3<V4. This causes the electric charge accumulated in the region corresponding to the accumulation electrode 21B to be read out from the readout electrode 21A to the floating diffusion FD1. In other words, the electric charge accumulated in the semiconductor layer 23 is read out to the controller (transfer period).

The drive circuit applies a potential V1 to the readout electrode 21A and applies the potential V2 to the accumulation electrode 21B again after the readout operation is completed. This causes electric charge generated through photoelectric conversion to be drawn to the accumulation electrode 21B and accumulated in the region of the photoelectric conversion layer 24 opposed to the accumulation electrode 21B (accumulation period).

(Acquisition of Blue Color Signal and Red Color Signal by Inorganic Photoelectric Conversion Sections 32B and 32R)

Subsequently, the blue light and the red light of the pieces of light having passed through the organic photoelectric conversion section 20 are respectively absorbed and photoelectrically converted in order by the inorganic photoelectric conversion section 32B and the inorganic photoelectric conversion section 32R. In the inorganic photoelectric conversion section 32B, the electrons corresponding to the incident blue light are accumulated in an n region of the inorganic photoelectric conversion section 32B and the accumulated electrons are transferred to the floating diffusion FD2 by the transfer transistor Tr2. Similarly, in the inorganic photoelectric conversion section 32R, the electrons corresponding to the incident red light are accumulated in an n region of the inorganic photoelectric conversion section 32R and the accumulated electrons are transferred to the floating diffusion FD3 by the transfer transistor Tr3.

1-4. Workings and Effects

The imaging element 10 according to the present embodiment is provided with the semiconductor layer 23 between the lower electrode 21 including the readout electrode 21A and the accumulation electrode 21B and the photoelectric conversion layer 24 in the organic photoelectric conversion section 20. The semiconductor layer 23 includes the first semiconductor layer 23A and the second semiconductor layer 23B. The first semiconductor layer 23A is provided on the lower electrode 21 side and the second semiconductor layer 23B is provided on the photoelectric conversion layer 24 side. The first semiconductor layer 23A has the energy level (Ec1) at the lowest edge of the conduction band that is shallower than the energy level (Ec2) of the second semiconductor layer 23B at the lowest edge of the conduction band. This improves the characteristics of transporting electric charge to the readout electrode 21A. The following describes this.

In recent years, a stacked imaging element in which a plurality of photoelectric conversion sections is stacked in the vertical direction has been developed as an imaging element included in a CCD image sensor, a CMOS image sensor, or the like. The stacked imaging element has a configuration in which two inorganic photoelectric conversion sections each including a photodiode (PD) are formed to be stacked, for example, in a silicon (Si) substrate and an organic photoelectric conversion section including a photoelectric conversion layer including an organic material is provided above the Si substrate.

The stacked imaging element is requested to have a structure that accumulates and transfers the signal charge generated by each of the photoelectric conversion sections. For example, among paired electrodes disposed to be opposed to each other with the photoelectric conversion layer interposed in between, the electrode on the inorganic photoelectric conversion section side includes the two electrodes of a first electrode and an electrode for electric charge accumulation in the organic photoelectric conversion section. This makes it possible to accumulate the signal charge generated by the photoelectric conversion layer. Such an imaging element temporarily accumulates signal charge above the electrode for electric charge accumulation and then transfers the signal charge to the floating diffusion FD in the Si substrate. This makes it possible to fully deplete the electric charge accumulation section and erase electric charge at the start of exposure. As a result, it is possible to suppress the occurrence of a phenomenon such as an increase in kTC noise, the deterioration of random noise, a decrease in image quality in imaging.

In addition, an imaging element provided with a composite oxide layer including indium-gallium-zinc composite oxide (IGZO) between the first electrode including an electrode for electric charge accumulation and the photoelectric conversion layer as described above to achieve an improvement in photoresponsivity is disclosed as an imaging element including a plurality of electrodes on the inorganic photoelectric conversion section side as described above. In such an imaging element, the transfer of signal charge may be inhibited by a trap included in the interface between an insulating film covering the electrode for electric charge accumulation and the composite oxide layer. The decreasing efficiency of transferring signal charge causes noise to be generated.

In contrast, in the present embodiment, the semiconductor layer 23 including the first semiconductor layer 23A and the second semiconductor layer 23B each having the predetermined energy level (Ec) at the lowest edge of the conduction band is provided between the lower electrode 21 including the readout electrode 21A and the accumulation electrode 21B and the photoelectric conversion layer 24. The first semiconductor layer 23A and the second semiconductor layer 23B are stacked in this order from the lower electrode 21 side. The first semiconductor layer 23A has the energy level (Ec1) at the lowest edge of the conduction band that is shallower than the energy level (Ec2) of the second semiconductor layer 23B at the lowest edge of the conduction band. This transports electrons serving as signal charge in the electric charge generated by the photoelectric conversion layer 24 to the accumulation electrode 21B side in accordance with the energy gradient, but accumulates the electrons on the first semiconductor layer 23A having the energy level at the lowest edge of the conduction band that is higher (shallower) than that of the second semiconductor layer 23B. This reduces the influence of a trap included in the interface between the insulating layer 22 and the semiconductor layer 23 and improves the characteristics of transporting electric charge to the readout electrode 21A.

As described above, the imaging element 10 according to the present embodiment is provided with the semiconductor layer 23 between the lower electrode 21 including the readout electrode 21A and the accumulation electrode 21B and the photoelectric conversion layer 24. In the semiconductor layer 23, the first semiconductor layer 23A (Ec1) and the second semiconductor layer 23B (Ec2) that have the relationship between the energy levels at the lowest edges of the conduction bands that satisfies Ec1>Ec2 are stacked in order from the lower electrode 21 side. This accumulates the signal charge (electrons) transported to the accumulation electrode 21B side in accordance with the energy gradient on the first semiconductor layer 23A, reduces the influence of a trap included in the interface between the insulating layer 22 and the semiconductor layer 23, and improves the characteristics of transporting electric charge to the readout electrode 21A. This increases the efficiency of transferring electric charge to the readout electrode 21A and makes it possible to reduce noise.

In addition, in the imaging element 10 according to the present embodiment, the first semiconductor layer 23A on the readout electrode 21A is provided with the opening 23AH and the readout electrode 21A and the second semiconductor layer 23B are electrically coupled directly. Signal charge is thus efficiently read out from the readout electrode 21A and it is possible to further reduce noise. It is thus possible to increase the image quality in imaging.

Further, in the imaging element 10 according to the present embodiment, the first semiconductor layer 23A and the second semiconductor layer 23B are both formed as crystal layers. This causes the first semiconductor layer 23A to serve as the seed crystal of the second semiconductor layer 23B and thus increases the film quality of the second semiconductor layer 23B. It is possible to reduce the defect level at the interface between the first semiconductor layer 23A and the second semiconductor layer 23B. This makes it possible to further increase the efficiency of transferring electric charge. It is to be noted that the initial layer of the first semiconductor layer 23A may have amorphousness.

Next, modification examples (modification examples 1 to 16) of the present disclosure are described. The following assigns the same signs to components similar to those of the embodiment described above and omits descriptions thereof as appropriate.

2. Modification Examples

2-1. Modification Example 1

FIG. 14 schematically illustrates a cross-sectional configuration of the main portion (organic photoelectric conversion section 20A) of an imaging element according to the modification example 1 of the present disclosure. The organic photoelectric conversion section 20A according to the present modification example is different from that of the embodiment described above in that there is provided a protective layer 29 between the semiconductor layer 23 and the photoelectric conversion layer 24.

The protective layer 29 is for preventing oxygen from being eliminated from an oxide semiconductor material included in the semiconductor layer 23. Examples of materials included in the protective layer 29 include $TiO_2$, titanium silicide oxide (TiSiO), niobium oxide ($Nb_2O_5$), $TaO_x$, and the like. It is effective in a case where the protective layer 29 has, for example, one atomic layer as the thickness thereof. It is preferable that the protective layer 29 have, for example, a thickness of 0.5 nm or more and 10 nm or less.

FIG. 15A illustrates the energy levels of the insulating layer 22, the first semiconductor layer 23A, the second semiconductor layer 23B, the protective layer 29, and the photoelectric conversion layer 24 stacked above the accumulation electrode 21B. FIG. 15B illustrates the energy levels of the insulating layer 22, the second semiconductor layer 23B, the protective layer 29, and the photoelectric conversion layer 24 stacked in the openings 22H and 23AH provided on the readout electrode 21A. It is preferable that the protective layer 29 have an energy level (Ecp) at the lowest edge of the conduction band which is, for example, substantially the same as or deeper than the energy level (Ec0) of the photoelectric conversion layer 24 at the lowest edge of the conduction band and substantially the same as or shallower than the energy level (Ec2) of the second semiconductor layer 23B at the lowest edge of the conduction band. This makes it possible to prevent signal charge (electrons) from flowing back to the photoelectric conversion layer 24 from the semiconductor layer 23 side.

In this way, in the present modification example, the protective layer 29 is provided between the semiconductor layer 23 and the photoelectric conversion layer 24. This makes it possible to reduce the elimination of oxygen from the surface of the semiconductor layer 23. This reduces the generation of a trap at the interface between the semiconductor layer 23 (specifically, the second semiconductor layer 23B) and the photoelectric conversion layer 24. In addition, it is possible to prevent signal charge (electrons) from flowing back to the photoelectric conversion layer 24 from the semiconductor layer 23 side. This attains an effect of making it possible to suppress a decrease in reliability caused by the elimination of oxygen in addition to the effects of the embodiment described above.

2-2. Modification Example 2

FIG. 16 schematically illustrates a cross-sectional configuration of the main portion (organic photoelectric conversion section 20B) of an imaging element according to the modification example 2 of the present disclosure. The organic photoelectric conversion section 20B according to the present modification example is further provided with a third semiconductor layer 23C on the second semiconductor layer 23B in addition to the components of the organic photoelectric conversion section 20A according to the modification example 1 described above.

In the semiconductor layer 23 according to the present modification example, the first semiconductor layer 23A, the second semiconductor layer 23B, and the third semiconductor layer 23C are stacked in this order from the lower electrode 21 side. The first semiconductor layer 23A and the second semiconductor layer 23B have configurations similar to those of the embodiment described above. It is possible to form the third semiconductor layer 23C by using, for example, an n-type oxide semiconductor material as with the first semiconductor layer 23A and the second semiconductor layer 23B. Specifically, ITO, $Ga_2O_3$, $TiO_2$, $In_2O_3$, ZnO, $SnO_2$, AZO, GZO, IZO, IGZO, ITZO, and the like are included. In addition, it is possible to use a material including CuI, $InSbO_4$, ZnMgO, $CuInO_2$, $MgIn_2O_4$, CdO, $ZnSnO_3$, InGaSiO, InGaZnSiO, InGaSnZnO, and the like.

It is preferable that the third semiconductor layer 23C have an energy level (Ec3) at the lowest edge of the conduction band which is, for example, substantially the same as or deeper than the energy level (Ecp) of the protective layer 29 at the lowest edge of the conduction band and substantially the same as or shallower than the energy level (Ec2) of the second semiconductor layer 23B at the lowest edge of the conduction band. It is preferable to use, for the third semiconductor layer 23C, a material such as InGaSiO from which oxygen is less likely to be eliminated.

In this way, in the present modification example, the semiconductor layer 23 has a three-layer structure of the first semiconductor layer 23A, the second semiconductor layer 23B, and the third semiconductor layer 23C. Further, the protective layer 29 is provided between the semiconductor layer 23 and the photoelectric conversion layer 24. This makes it possible to further prevent oxygen from being eliminated from the surface of the semiconductor layer 23 (specifically, the third semiconductor layer 23C) and further increase the reliability. Further, the third semiconductor layer 23C is formed by using a material such as InGaSiO from which oxygen is less likely to be eliminated. This makes it possible to further reduce the elimination of oxygen as compared with the modification example 1 described above and increase the reliability.

2-3. Modification Example 3

FIG. 17 schematically illustrates a cross-sectional configuration of the main portion (organic photoelectric conversion section 20C) of an imaging element according to the modification example 3 of the present disclosure. The organic photoelectric conversion section 20C according to the present modification example is different from that of the embodiment described above in that the first semiconductor layer 23A is not provided with the opening 23AH, but provided with a high concentration carrier region 23X in a region in contact with the readout electrode 21A on the bottom surface of the opening 22H. The high concentration carrier region 23X is higher than other regions in carrier concentration.

As described above, the high concentration carrier region 23X is formed in a region in contact with the readout electrode 21A and is higher than the other regions in carrier concentration. For example, a carrier concentration of 1E17 or more is preferable. This lowers the barrier between the readout electrode 21A and a second semiconductor layer 23b.

It is possible to form the high concentration carrier region 23X, for example, as follows. First, the first semiconductor layer 23A is formed on the insulating layer 22 in which the opening 22H is formed on the readout electrode 21A. After that, the photoresist PR having an opening, for example, at a position corresponding to the opening 22H is patterned on the first semiconductor layer 23A. This is followed, for example, by the irradiation of argon (Ar) plasma or hydrogen ($H_2$) plasma. This forms the high concentration carrier region 23X at a predetermined position (a region in contact with the readout electrode 21A in the opening 22H) in the first semiconductor layer 23A.

In this way, in the present modification example, the high concentration carrier region 23X is formed in a region in the first semiconductor layer 23A in contact with the readout electrode 21A on the bottom surface of the opening 22H. This makes it possible to lower the barrier between the readout electrode 21A and the second semiconductor layer 23b without providing the opening 23AH in the opening 22H. This eliminates the necessity of the series of steps for forming the opening 23AH in the first semiconductor layer 23A and makes it possible to simplify the method of manufacturing the imaging element 10 and further miniaturize the imaging element 10.

2-4. Modification Example 4

FIG. 18 schematically illustrates a cross-sectional configuration of the main portion (organic photoelectric conversion section 20D) of an imaging element according to the modification example 4 of the present disclosure. In the embodiment described above, the example has been described in which the insulating layer 22 on the readout electrode 21A is provided, for example, with the tapered opening 22H, the first semiconductor layer 23A extending on the top of the insulating layer 22 and the side surfaces and the bottom surface of the opening 22H is formed, and the opening 23AH is then formed in the opening 22H. The openings 22H and 23AH on the readout electrode 21A may be, however, formed, for example, at a time. This makes it possible to simplify the method of manufacturing the imaging element 10.

It is to be noted that the respective openings 22H and 23AH of the insulating layer 22 and the first semiconductor layer 23A have the same side surface on the readout electrode 21A as illustrated in FIG. 18 in the organic photoelectric conversion section 20D obtained in this way.

2-5. Modification Example 5

FIG. 19 schematically illustrates a cross-sectional configuration of the main portion (organic photoelectric conversion section 20E) of an imaging element according to the modification example 5 of the present disclosure. In the embodiment described above, the example has been described in which the opening 23AH of the first semiconductor layer 23A is provided in the opening 22H of the insulating layer 22, but this is not limitative. For example, as illustrated in FIG. 19, the opening 23AH may be provided on the insulating layer 22 outside the opening 22H. This widens the process margin at the time of manufacturing and makes it possible to increase the manufacturing yield.

2-6. Modification Example 6

FIG. 20 schematically illustrates a cross-sectional configuration of the main portion (organic photoelectric conversion section 20F) of an imaging element according to the modification example 6 of the present disclosure. The organic photoelectric conversion section 20F according to the present modification example is different from that of the embodiment described above in that there is provided a transfer electrode 21C between the readout electrode 21A and the accumulation electrode 21B.

The transfer electrode 21C is for increasing the efficiency of transferring the electric charge accumulated above the accumulation electrode 21B to the readout electrode 21A. The transfer electrode 21C is provided between the readout electrode 21A and the accumulation electrode 21B. Specifically, the transfer electrode 21C is formed, for example, in a layer lower than the layer provided with the readout electrode 21A and the accumulation electrode 21B. The transfer electrode 21C is provided to cause a portion thereof to overlap with the readout electrode 21A and the accumulation electrode 21B.

It is possible to independently apply respective voltages to the readout electrode 21A, the accumulation electrode 21B, and the transfer electrode 21C. In the present modification example, the drive circuit applies a potential V5 to the readout electrode 21A, applies a potential V6 to the accumulation electrode 21B, and applies a potential V7 (V5>V6>V7) to the transfer electrode 21C in a transfer period following the completion of the reset operation. This causes the electric charge accumulated above the accumulation electrode 21B to move from the accumulation electrode 21B onto the transfer electrode 21C and the readout electrode 21A in this order and be read out to the floating diffusion FD1.

In this way, in the present modification example, the transfer electrode 21C is provided between the readout electrode 21A and the accumulation electrode 21B. This makes it possible to move electric charge from the readout electrode 21A to the floating diffusion FD1 more certainly. The characteristics of transporting electric charge to the readout electrode 21A are further improved to make it possible to further reduce noise.

2-7. Modification Example 7

FIG. 21 schematically illustrates a cross-sectional configuration of the main portion (organic photoelectric conversion section 20G) of an imaging element according to the modification example 7 of the present disclosure. The organic photoelectric conversion section 20G according to the present modification example is different from that of the embodiment described above in that the first semiconductor layer 23A is a stacked film (first semiconductor layers 23A1 and 23A2).

Specifically, the organic photoelectric conversion section 20G according to the present modification example includes a resist 71 between the first semiconductor layer 23A1 and the first semiconductor layer 23A2 included in the first semiconductor layer 23A. The first semiconductor layer 23A2 covers the side surfaces of the opening 23AH formed by the first semiconductor layer 23A1 and the exposed readout electrode 21A in the opening 22H.

The organic photoelectric conversion section 20G according to the present modification example is formed, for example, as follows.

First, as illustrated in FIG. 22A, the first semiconductor layer 23A1 is formed on the insulating layer 22 having the opening 22H on the readout electrode 21A by using, for example, a sputtering method. Next, as illustrated in FIG. 22B, the resist 71 is patterned on the first semiconductor layer 23A1. Subsequently, as illustrated in FIG. 22C, the first semiconductor layer 23A1 on the readout electrode 21A is etched by using, for example, wet etching to form the opening 23AH. After that, the resist 71 is removed. In this case, a portion of the resist 71 remains on the first semiconductor layer 23A1.

Next, as illustrated in FIG. 22D, the first semiconductor layer 23A2 is formed to have, for example, a thickness of 1 nm to 10 nm above the first semiconductor layer 23A1 on which the resist 71 remains by using, for example, a sputtering method. After that, as illustrated in FIG. 22E, the second semiconductor layer 23B is formed by using, for example, a sputtering method. After that, the photoelectric conversion layer 24 and the upper electrode 25 are formed on the second semiconductor layer 23B as in the embodiment described above. Thus, the organic photoelectric conversion section 20G illustrated in FIG. 21 is completed.

In the embodiment described above, the semiconductor layer 23 has a stacked structure of the first semiconductor layer 23A and the second semiconductor layer 23B that include materials different from each other. The first semiconductor layer 23A is provided with the opening 23AH for directly coupling the readout electrode 21A and the second semiconductor layer 23B. It is not therefore possible to subject the first semiconductor layer 23A and the second semiconductor layer 23B to an in-situ process. This may cause a trap at the interface between the first semiconductor layer 23A and the second semiconductor layer 23B. More specifically, for example, the remaining resist film (resist 71) used to form the opening 23AH may cause a trap between the first semiconductor layer 23A and the second semiconductor layer 23B.

In contrast, in the present modification example, the first semiconductor layer 23A is formed that has the opening 23AH on the readout electrode 21A. After that, the first semiconductor layer 23A2 is formed to have a film thickness sufficient to hold a tunnelling effect. This makes it possible to process the first semiconductor layer 23A2 and the second semiconductor layer 23B in situ. In other words, electric charge traps are reduced at the interface between the first semiconductor layer 23A and the second semiconductor layer 23B in which signal charge (electrons) is accumulated. This further increases the efficiency of transferring electric charge to the readout electrode 21A and makes it possible to further reduce noise.

In addition, FIG. 21 illustrates a structure in which the resist 71 remains in the first semiconductor layer 23A, but this is not limitative. For example, even a configuration in which the second semiconductor layer 23B has a stacked structure (second semiconductor layers 23B1 and 23B2) and the resist 71 remains between these second semiconductor layer 23B1 and second semiconductor layer 23B2 as with an organic photoelectric conversion section 20H illustrated in FIG. 23 offers a similar effect. The organic photoelectric conversion section 20H according is formed, for example, as follows.

First, as illustrated in FIG. 24A, the first semiconductor layer 23A and the second semiconductor layer 23B1 are formed in order on the insulating layer 22 having the opening 22H on the readout electrode 21A by using, for example, a sputtering method. Next, as illustrated in FIG. 24B, the resist 71 is patterned on the second semiconductor layer 23B1. Subsequently, as illustrated in FIG. 24C, an opening 23BH extending through the first semiconductor layer 23A and the second semiconductor layer 23B1 is formed on the readout electrode 21A by using, for example, wet etching. After that, the resist 71 is removed. In this case, a portion of the resist 71 remains on the second semiconductor layer 23B1.

Next, as illustrated in FIG. 24D, the second semiconductor layer 23B2 is formed above the second semiconductor layer 23B1 on which the resist 71 remains by using, for example, a sputtering method. After that, the photoelectric conversion layer 24 and the upper electrode 25 are formed on the second semiconductor layer 23B as in the embodiment described above. Thus, the organic photoelectric conversion section 20H illustrated in FIG. 23 is completed.

It is to be noted that the resist 71 remaining in the first semiconductor layer 23A or the second semiconductor layer 23B is confirmable by using, for example, secondary ion-mass spectrography (SIMS). For example, the resist 71 is a resist for exposure for an KrF excimer laser such as a polyhydroxystyrene (PHS) resin including, for example, a chemically amplified photoacid generator (PAG), ethyl lactate, methoxypropyl acetate (MPA), and the like and includes a large amount of carbon. Specifically, the resist 71 includes more carbon in the layer (e.g., first semiconductor layer 23A) in which the resist 71 remains than other regions. It is therefore possible to confirm the resist 71 as a peak of carbon by SIMS.

2-8. Modification Example 8

FIG. 25 schematically illustrates a cross-sectional configuration of the main portion (organic photoelectric conversion section 20I) of an imaging element according to the modification example 8 of the present disclosure. The organic photoelectric conversion section 20I according to the present modification example is different from that of the modification example 3 described above in that there is provided a metal film 72 on the readout electrode 21A and the high concentration carrier region 23X is higher than other regions in the first semiconductor layer 23A in carrier concentration is provided on the readout electrode 21A.

The organic photoelectric conversion section 20I according to the present modification example is formed, for example, as follows.

First, as illustrated in FIG. 26A, the metal film 72 is formed on the insulating layer 22 and the readout electrode 21A exposed in the opening 22H. It is possible to form this metal film 72 by using metal having lower Gibbs energy than that of a material included in the first semiconductor layer 23A. Specific examples of materials of the metal film 72 include titanium (Ti), gallium (Ga), niobium (Nb), aluminum (Al), vanadium (V), zirconium (Ze), and the like. As a material of the metal film 72, a material having equal Gibbs energy may be further used. Metal having the same element as an element included in the first semiconductor layer 23A may also be used. Examples include indium (In), zinc (Zn), tin (Sn), and the like. These materials each bring the amount of oxygen into equilibrium between metal oxide and metal, making it possible to cause oxygen deficiency in the first semiconductor layer. Next, as illustrated in FIG. 26B, a resist (not illustrated) is patterned on the metal film 72. After that, the metal film 72 is patterned on the readout electrode 21A, for example, by wet etching with a gap made between the metal film 72 and the side surfaces of the opening 22H.

Subsequently, as illustrated in FIG. 26C, the first semiconductor layer 23A is formed by using, for example, a sputtering method. After that, the second semiconductor layer 23B is similarly formed as illustrated in FIG. 26D. Next, heating treatment is performed, for example, at about 200° C. to 450° C. As illustrated in FIG. 26E, this causes the high concentration carrier region 23X resulting from oxygen deficiency to be formed in the first semiconductor layer 23A around the metal film 72. After that, the photoelectric conversion layer 24 and the upper electrode 25 are formed on the second semiconductor layer 23B as in the embodiment described above. Thus, the organic photoelectric conversion section 20G illustrated in FIG. 21 is completed.

In this way, the metal film 72 is formed in the opening 22H. This makes it possible to form the high concentration carrier region 23X in the first semiconductor layer 23A on the readout electrode 21A. The high concentration carrier region 23X is higher than other regions in carrier concentration. In other words, as with the organic photoelectric conversion section 20C described in the modification example 3 described above, it is possible to lower the barrier between the readout electrode 21A and the second semiconductor layer 23B without providing the opening 23AH in the opening 22H. This eliminates the necessity of the series of steps for forming the opening 23AH in the first semiconductor layer 23A and makes it possible to simplify the method of manufacturing the imaging element 10 and further miniaturize the imaging element 10.

FIG. 25 illustrates an example in which the metal film 72 is provided directly on the readout electrode 21A, but the metal film 72 may be provided on the first semiconductor layer 23A in the opening 22H after the first semiconductor layer 23A is formed as with an organic photoelectric conversion section 20J illustrated in FIG. 27. Even in this case, heating treatment after the second semiconductor layer 23B is formed causes oxygen deficiency from the first semiconductor layer 23A and the second semiconductor layer 23B around the metal film 72. It is possible to form the high concentration carrier region 23X over the first semiconductor layer 23A and the second semiconductor layer 23B around the metal film 72.

Further, a thin film (e.g., 0.1 nm to 2 nm) is used for the metal film 72 as with an organic photoelectric conversion section 20K illustrated in FIG. 28. This allows the metal film 72 to be formed to extend on not only the readout electrode 21A, but also a portion of the side surfaces and the upper surface of the opening 22H of an insulating layer 222. In a case where a thin film is used for the metal film 72, the metal film 72 may be formed above the first semiconductor layer 23A as with an organic photoelectric conversion section 20L illustrated in FIG. 29. Even such a structure allows the high concentration carrier region 23X to be formed in the first semiconductor layer 23A or the first semiconductor layer 23A and second semiconductor layer 23B around the metal film 72. It is possible to lower the barrier between the readout electrode 21A and the second semiconductor layer 23*b* without providing the first semiconductor layer 23A with the opening 23AH.

It is to be noted that an oxide of metal having lower Gibbs energy than that of a material included in the first semiconductor layer 23A may be used as a material included in the metal film 72. In addition, it is also possible to obtain a similar effect by forming not the metal film 72, but the readout electrode 21A with a material including metal included in the metal film 72.

2-9. Modification Example 9

FIG. 30 schematically illustrates a cross-sectional configuration of the main portion (organic photoelectric conversion section 20M) of an imaging element according to the modification example 9 of the present disclosure. FIG. 31 schematically illustrates an overall planar configuration of the imaging device 1 in which the organic photoelectric conversion section 20 is used. It is to be noted that FIG. 30 illustrates a cross section taken along the II-II line illustrated in FIG. 31. The organic photoelectric conversion section 20M according to the present modification example is different from that of the embodiment described above in that the second semiconductor layer 23B is a stacked film in which a layer (crystal layer 23B1) having crystallinity and a layer (amorphous layer 23B2) having amorphousness are stacked in this order from a lower electrode 11 side.

FIG. 32A illustrates the energy levels of the insulating layer 22, the first semiconductor layer 23A, the second semiconductor layer 23B (the crystal layer 23B1 and the amorphous layer 23B2), the protective layer 29, and the photoelectric conversion layer 24 stacked above the accumulation electrode 21B. FIG. 32B illustrates the energy levels of the insulating layer 22, the second semiconductor layer 23B (the crystal layer 23B1 and the amorphous layer 23B2), the protective layer 29, and the photoelectric conversion layer 24 stacked in the openings 22H and 23AH provided on the readout electrode 21A. The second semiconductor layer 23B (the crystal layer 23B1 and the amorphous layer 23B2) has the energy level at the lowest edge of the conduction band that is deeper than the energy level (Ec1) of the first semiconductor layer 23A at the lowest edge of the conduction band as in the embodiment described above. In addition, the second semiconductor layer 23B (the crystal layer 23B1 and the amorphous layer 23B2) has the energy level at the lowest edge of the conduction band that is substantially the same as or deeper than the energy level (Ecp) of the protective layer 29 at the lowest edge of the conduction band as in the modification example 1 described above.

It is preferable that an energy level (Ec2_*c*) of the crystal layer 23B1 at the lowest edge of the conduction band and an energy level (Ec2_*a*) of the amorphous layer 23B2 at the lowest edge of the conduction band be substantially the same or the amorphous layer 23B2 have the energy level (Ec2_*a*) at the lowest edge of the conduction band that is shallower than the energy level (Ec2_*c*) of the crystal layer 23B1 at the lowest edge of the conduction band. Further, in a case where the direction farther from the vacuum level is defined as leading to less energy (negative and a larger absolute value), setting an absolute value of 0.4 eV or more as the difference (Ec2_*a*–Ec2_*c*) of the energy level of the crystal layer 23B1 at the lowest edge of the conduction band from that of the amorphous layer 23B2 makes it possible to prevent the electric charge accumulated in the semiconductor layer 23 from flowing into the photoelectric conversion layer 24.

The crystal layer 23B1 and the amorphous layer 23B2 may be formed by using the same material or may be formed by using different materials. In a case where different materials are used, it is preferable to combine materials that include the same kind of elements and have close lattice constants, but do not deteriorate the interface state. It is preferable that the crystal layer 23B1 have, for example, a film thickness of 10 nm or more and 100 nm or less. This makes it possible to reduce the occurrence of defects in the bulk section of the crystal layer 23B1. The amorphous layer 23B2 has, for example, a film thickness of 1 nm or more and 50 nm or less. It is preferable that the amorphous layer 23B2 have a film thickness of 20 nm or more and 50 nm or less. This makes it possible to not only protect the surface of the crystal layer 23B1, but also prevent the electric charge accumulated in the semiconductor layer 23 from flowing into the photoelectric conversion layer 24.

It is to be noted that the amorphous layer 23B2 and the crystal layer 23B1 are confirmable by using a light flux Fourier transform (FFT) image of a transmission electron microscope (TEM) image. For example, the TEM has, on the crystal layer 23B1, an image having a bright and dark fringe pattern that is caused by interference between a diffracted wave and a transmitted wave from a certain lattice plane of a crystal and corresponds to both intervals of the lattice. This is referred to as lattice fringe. In contrast, no lattice fringe is confirmed in a case of the amorphous layer 23B2. Further, the TEM image is subjected to FFT two-dimensionally. This makes a spotted pattern confirmable that corresponds, for example, the cycle of lattice fringes and extends in one direction in a case of the crystal layer 23B1. In contrast, a broad ring-shaped pattern (halo ring) is confirmable in a case of the amorphous layer 23B2.

In general, in a case where an inorganic oxide film is formed on an oxide semiconductor layer having crystallinity, the surface of the oxide semiconductor layer is sometimes damaged and deteriorated. In addition, in a case where the oxide semiconductor layer and the inorganic oxide film have a layer inserted in between that includes a material different from materials of the respective layers, the number of interfaces between different types of materials increases and traps at the interfaces between different types of materials sometimes inhibit the transfer of electric charge from the photoelectric conversion layer to the oxide semiconductor layer.

In contrast, in the present modification example, the amorphous layer 23B2 is formed on the crystal layer 23B1 serving as the second semiconductor layer 23B. This reduces the occurrence of traps on the surface of the second semiconductor layer 23B caused by damage resulting from the formation of the protective layer 29. It is thus possible to increase the reliability and the image quality in imaging in addition to the effects of the embodiment and the modification example 1 described above.

Figure 33:
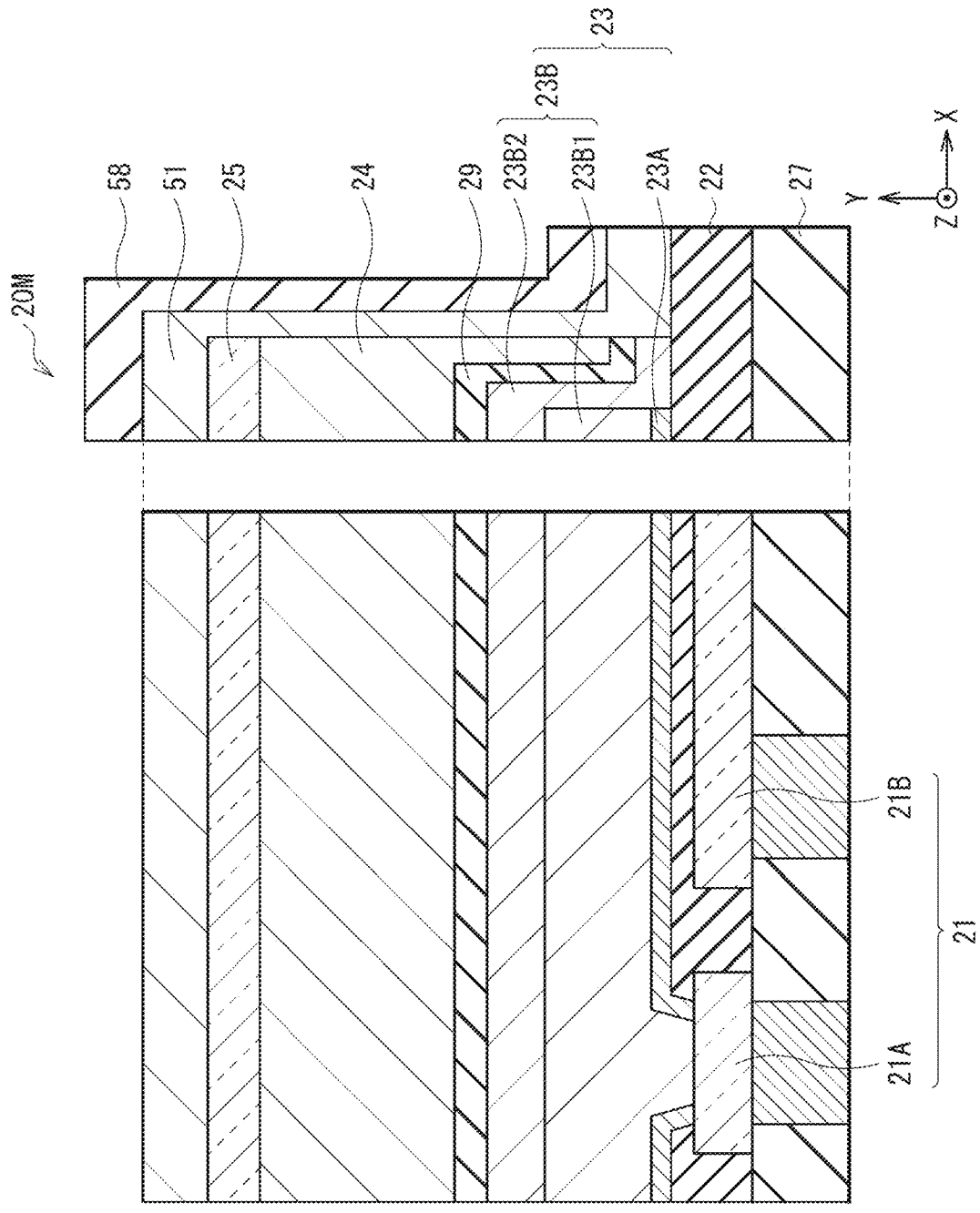
FIG. 33 is a cross-sectional schematic diagram illustrating another example of a structure of a side surface of the organic photoelectric conversion section near a peripheral region.

It is to be noted that the protective layer 51 and an optical black (OPB) layer 58 are formed on the organic photoelectric conversion section 20 near a peripheral region 1B provided around the pixel section TA in the imaging element 10. For example, as illustrated in FIG. 30, the protective layer 51 and the OPB layer 58 cover a side surface of the organic photoelectric conversion section 20 and extend to the peripheral region 1B. The structure of the side surface of the organic photoelectric conversion section 20 near this peripheral region 1B is not limited to this. For example, as illustrated in FIG. 33, the amorphous layer 23B2 may cover side surfaces of the first semiconductor layer 23A and the crystal layer 23B1. This reduces deterioration caused by damage to the side surfaces of the first semiconductor layer 23A and the crystal layer 23B1 brought about in a case where the protective layers 29 and 51 are formed. It is thus possible to further increase the reliability and the image quality in imaging.

In addition, in the present modification example, the example has been described in which the first semiconductor layer 23A and the second semiconductor layer 23B are stacked, but this is not limitative. It is possible to obtain a similar effect even in a case where the second semiconductor layer 23B (specifically, the crystal layer 23B1) is formed directly on the insulating layer 22, for example, as illustrated in FIG. 34.

2-10. Modification Example 10

FIG. 35 schematically illustrates a cross-sectional configuration of the main portion (organic photoelectric conversion section 20N) of an imaging element according to the modification example 10 of the present disclosure. The organic photoelectric conversion section 20N according to the present modification example is different from that of the embodiment described above in that the amorphous layer 23B2 and the protective layer 29 are formed along an opening 23H extending through the insulating layer 22, the first semiconductor layer 23A, and the crystal layer 23B1 provided on the readout electrode 21A in addition to the configuration according to the modification example 9 described above.

The first semiconductor layer 23A, the second semiconductor layer 23B (the crystal layer 23B1 and the amorphous layer 23B2), the protective layer 29, and the photoelectric conversion layer 24 according to the present modification example have the magnitude relationship between energy levels similar to those of the embodiment and the modification examples described above. In other words, the first semiconductor layer 23A has the energy level (Ec1) at the lowest edge of the conduction band that is shallower than the energy level (Ec2) of the second semiconductor layer 23B at the lowest edge of the conduction band (Ec1>Ec2 in a case where the direction farther from the vacuum level is defined as leading to less energy (negative and a larger absolute value)). The photoelectric conversion layer 24 has the energy level (Ec0) at the lowest edge of the conduction band that is shallower than the energy level (Ec2) of the second semiconductor layer 23B at the lowest edge of the conduction band (Ec0>Ec2 in a case where the direction farther from the vacuum level is defined as leading to less energy (negative and a larger absolute value)). The protective layer 29 has the energy level (Ecp) at the lowest edge of the conduction band which is, for example, substantially the same as or deeper than the energy level (Ec0) of the photoelectric conversion layer 24 at the lowest edge of the conduction band and substantially the same as or shallower than the energy level (Ec2) of the second semiconductor layer 23B at the lowest edge of the conduction band. The crystal layer 23B1 and the amorphous layer 23B2 included in the second semiconductor layer 23B have substantially the same energy levels or the amorphous layer 23B2 has the energy level (Ec2_a) at the lowest edge of the conduction band that is shallower than the energy level (Ec2_c) of the crystal layer 23B1 at the lowest edge of the conduction band.

The first semiconductor layer 23A has, for example, a film thickness of 1 nm or more and 20 nm or less. The crystal layer 23B1 has, for example, a film thickness of 10 nm or more and 30 nm or less. The amorphous layer 23B2 has, for example, a film thickness of 1 nm or more and 100 nm or less. It is more preferable that the amorphous layer 23B2 have, for example, a film thickness of 1 nm or more and 10 nm or less. The protective layer 29 has, for example, a film thickness of 1 nm or more and 10 nm or less.

The organic photoelectric conversion section 20N according to the present modification example is formed, for example, as follows.

First, the first semiconductor layer 23A and the crystal layer 23B1 are formed on the insulating layer 22 in order by using, for example, a sputtering method. After that, the resist 71 is patterned on the crystal layer 23B1 as illustrated in FIG. 36A. Subsequently, as illustrated in FIG. 36B, the crystal layer 23B1, the first semiconductor layer 23A1, and the insulating layer 22 on the readout electrode 21A are etched by using, for example, dry etching to form the opening 23H in which the readout electrode 21A is exposed. After that, the resist 71 is removed.

Next, as illustrated in FIG. 36C, the amorphous layer 23B2 is formed on the top of the crystal layer 23B1 and the side surfaces of the opening 23H by using, for example, a sputtering method. Subsequently, as illustrated in FIG. 36D, the protective layer 29 is formed on the amorphous layer 23B2 by using, for example, an ALD method. After that, the photoelectric conversion layer 24 and the upper electrode 25 are formed on the protective layer 29 as in the embodiment described above. Thus, the organic photoelectric conversion section 20N illustrated in FIG. 35 is completed.

In this way, in the present modification example, the opening 23H extending through the insulating layer 22, the first semiconductor layer 23A, and the crystal layer 23B1 is formed on the readout electrode 21A and the amorphous layer 23B2 and the protective layer 29 are formed along the top of the crystal layer 23B1 and the side surfaces of the opening 23H. This reduces the amount of trapping on the readout electrode 21A. This makes it possible to further increase the efficiency of transferring electric charge to the readout electrode 21A and increase the image quality in imaging as compared with the embodiment described above.

FIG. 37 schematically illustrates another example of the cross-sectional configuration of the organic photoelectric conversion section 20N according to the modification example 10 of the present disclosure. The organic photoelectric conversion section 20N according to the present modification example may be further provided with the third semiconductor layer 23C between the second semiconductor layer 23B and the protective layer 29 as in the modification example 2 described above. The third semiconductor layer 23C has the energy level (Ec3) at the lowest edge of the conduction band that is substantially the same as or deeper than the energy level (Ecp) of the protective layer 29 at the lowest edge of the conduction band and substantially the same as or shallower than the energy level (Ec2) of the second semiconductor layer 23B at the lowest edge of the conduction band. This makes it possible to prevent the electric charge accumulated in the second semiconductor layer 23B from flowing into the photoelectric conversion layer 24.

In addition, FIGS. 35 and 37 each illustrate an example in which the side surfaces of the opening 23H are formed by the continuous end surfaces of the insulating layer 22, the first semiconductor layer 23A, and the crystal layer 23B1, but this is not limitative. For example, a side surface of the opening 23H may be formed to have a stepped shape as illustrated in FIG. 38. In addition, for example, as illustrated in FIG. 39, the opening 22H extending through the insulating layer 22 may be formed on the readout electrode 21A and the opening 23H may be then formed that is smaller than the opening 22H in diameter and extends through the first semiconductor layer 23A and the crystal layer 23B1.

2-11. Modification Example 11

FIG. 40 schematically illustrates a cross-sectional configuration of the main portion (organic photoelectric conversion section 20O) of an imaging element according to the modification example 11 of the present disclosure. The organic photoelectric conversion section 20O according to the present modification example is different from that of the embodiment described above in that the first semiconductor layer 23A has an end inside the second semiconductor layer 23B at an end of the organic photoelectric conversion section 20O in addition to the configuration according to the modification example 9 described above. In addition, the organic photoelectric conversion section 20O is different from that of the embodiment described above in that a film to be formed after this does not come into contact with the first semiconductor layer 23A at the end. This shortens the processing time of a stacked film included in the organic photoelectric conversion section.

In addition, in the present modification example, there is provided a shield electrode 21D, for example, around the readout electrode 21A and the accumulation electrode 21B as a plurality of electrodes included in the lower electrode 21. The shield electrode 21D provides an electric field effect to the second semiconductor layer 23B that transfers and accumulates electric charge. For example, a fixed potential is applied to the shield electrode 21D. In the present modification example, the first semiconductor layer 23A is also removed above this shield electrode 21D. This increases an electric field effect for the second semiconductor layer 23B.

The organic photoelectric conversion section 20O according to the present modification example is formed, for example, as follows.

First, as illustrated in FIG. 41A, the first semiconductor layer 23A including, for example, IGZO (e.g., In:Ga:Zn=1:3:4) is formed on the insulating layer 22 by using, for example, a sputtering method. Subsequently, the first semiconductor layer 23A is processed by using, for example, dry etching. Specifically, as illustrated in FIG. 41B, the opening 23AH is formed on the readout electrode 21A and the first semiconductor layer 23A on the shield electrode 21D and near the peripheral region 1B, for example, is removed. In this case, a substance may be attached again at the time of processing because the oxide semiconductor is a material that is difficult to etch. In a case where this attachment of a substance occurs again, the substance is removed by other dry etching or removed along with a resist to be peeled off. The resist has been formed to process the first semiconductor layer 23A.

Next, as illustrated in FIG. 41C, the second semiconductor layer 23B including, for example, IGZO (e.g., In:Ga:Zn=1:1:1) is formed by using, for example, a sputtering method. Subsequently, as illustrated in FIG. 41D, the protective layer 29 including a single layer film including, for example, SiO or TiO or a stacked film thereof, the photoelectric conversion layer 24 including an organic material, the upper electrode 25 including, for example, IZO, and the protective layer 51 including, for example, AlO are formed. The protective layers 29 and 51 are formed by using, for example, an ALD method. The photoelectric conversion layer 24 is formed by using, for example, vacuum evaporation. The upper electrode 25 is formed by using, for example, a sputtering method. After that, as illustrated in FIG. 41D, a resist 72 is patterned on the protective layer 51.

Next, a process is performed for up to the second semiconductor layer 23B at a time by using, for example, dry etching. The resist 72 then functions as a mask in the middle of the etching step, but the resist 72 disappears in the etching step. After that, the protective layer 51 behaves as a hard mask. Specifically, for example, the resist 72 remains as a mask for up to the photoelectric conversion layer 24 (FIG. 41E), but the resist 72 is etched to disappear along with the protective layer 29, for example, at the stage of processing the protective layer 29 (FIG. 41F). After that, the protective layer 51 serves as a hard mask and the second semiconductor layer 23B is etched (FIG. 41G). It is to be noted that the resist 72 does not disappear only at the stage of processing the protective layer 29, but is also likely to disappear, for example, in the latter half of the etching process such as the etching of the second semiconductor layer 23B. Even in that case, the protective layer 51, however, serves as a hard mask and is etched as described above. Thus, the organic photoelectric conversion section 20O illustrated in FIG. 40 is completed.

In general, it is technically difficult to process a stacked film of an inorganic material and an organic material at a time. In addition, an oxide semiconductor such as IGZO is a material that is difficult to process (a material that is difficult to etch). It is more difficult for etching to proceed, for example, than in an organic film. Therefore, in a case where the stacked film in which the oxide semiconductor layer (semiconductor layer 23), the organic film (photoelectric conversion layer 24), and the inorganic oxide film (protective layer 51) are stacked is subjected to dry etching at a time as in the organic photoelectric conversion section 20O, an increase in temperature or the like is likely to occur in the step of etching the oxide semiconductor layer. This increase in temperature causes the organic film to be damaged. In addition, both the semiconductor layer 23 and the protective layer 51 serving as a hard mask to etch the semiconductor layer 23 in this configuration are oxides. Thus, the protective layer 51 is also etched and damaged in a case where the semiconductor layer 23 is etched. This series of steps have low controllability and the photoelectric conversion layer 24 and the protective layer 51 may be damaged.

Possible methods of addressing this issue include, for example, increasing the film thickness of the inorganic oxide film (protective layer 51) serving as a resist or a hard mask. The increasing film thickness of the protective layer 51 brings about, for example, side effects such as the occurrence of membrane stress in some cases. The occurrence of membrane stress causes the photoelectric conversion layer 24 below to be peeled off. In addition, in a case where the film thickness of the resist is changed, the total design is changed.

In contrast, the first semiconductor layer 23A has an end inside the second semiconductor layer 23B at an end (e.g., a peripheral section of the pixel section TA) of the organic photoelectric conversion section 20O. In other words, for example, in a case where the opening 23AH is formed in the first semiconductor layer 23A on the readout electrode 21A, the first semiconductor layer 23A in the peripheral section of the pixel section TA is also removed. This decreases the film thickness of the semiconductor layer 23, for example, in the peripheral section of the pixel section TA by the film thickness of the first semiconductor layer 23A. This shortens the processing time of the semiconductor layer 23 in the step of processing the stacked film including the semiconductor layer 23, the protective layer 29, the photoelectric conversion layer 24, the upper electrode 25, and the protective layer 51 by dry etching at a time. It is therefore possible to reduce damage to the photoelectric conversion layer 24 and the protective layer 51. In addition, the controllability of the manufacturing step is increased. This effect becomes greater in a case where the first semiconductor layer 23A has a slower etching rate or a longer processing time than that of the second semiconductor layer 23B.

In addition, in the present modification example, as described above, the shield electrode 21D is provided around the readout electrode 21A and the accumulation electrode 21B and the first semiconductor layer 23A is also removed above this shield electrode 21D. This increases an electric field effect, for example, for the second semiconductor layer 23B by about 25% as compared with a case where the first semiconductor layer 23A is formed between the shield electrode 21D and the second semiconductor layer 23B.

This increasing electric field effect is based on the following calculation. For example, silicon oxide (e.g., $SiO_2$) included in the insulating layer 22 has a permittivity of about 4 and IGZO included in the first semiconductor layer 23A and the second semiconductor layer 23B has a permittivity of about 16. In a case where a film thickness of 10 nm is set for $SiO_2$ and IGZO and the capacitance of $SiO_2$ is represented as C, the capacitance of IGZO is 4C. In a case where there is a stacked film of the insulating layer 22 and the first semiconductor layer 23A between the shield electrode 21D and the second semiconductor layer 23B, combined capacitance $C_{total}$ thereof contributes to an electric field effect for the second semiconductor layer 23B. Specifically, $1/C_{total}=1/C+1/4C$, resulting in $C_{total}=0.8C$. In contrast, in a case where only the insulating layer 22 exists between the shield electrode 21D and the second semiconductor layer 23B, capacitance is represented as C and this demonstrates that an electric field effect is strengthened by about 25%. This application voltage is several V (e.g., about 5 V). This causes an effective voltage of about 1 V as a difference in this case.

It is to be noted that the organic photoelectric conversion section 20O according to the present modification example may be further configured as follows. For example, as illustrated in FIG. 42, an end of the first semiconductor layer 23A and the opening 23AH may each have a round shape in a plan view. This increases the adhesiveness between the first semiconductor layer 23A and the second semiconductor layer 23B and reduces stress. In addition, for example, as illustrated in FIG. 43, a processed end of the first semiconductor layer 23A may be formed to have an inclined surface (e.g., a forward tapered shape) in a cross-sectional view. This increases the coverage of the second semiconductor layer 23B and makes it possible to increase the adhesiveness to the second semiconductor layer 23B.

FIG. 44 schematically illustrates a cross-sectional configuration of the organic photoelectric conversion section 20O in the pixel section 1A of the imaging device 1 and the peripheral region 1B around the pixel section 1A in a case where the organic photoelectric conversion section 20O illustrated in FIG. 40 is used. FIG. 44 illustrates an example in which the first semiconductor layer 23A is removed that is located on the top of the shield electrode 21D provided on the outermost periphery of the pixel section 1A and located outside the shield electrode 21D, but this is not limitative. For example, as illustrated in FIG. 45, for example, a geometrical pattern of the first semiconductor layer 23A may be left near an end of the organic photoelectric conversion section 20O extending to the peripheral region 1B. This makes it possible to secure processing uniformity for dry etching and adhesiveness between the insulating layer 22 and the second semiconductor layer 23B. It is to be noted that there may be further provided a planarization layer 56 and a wiring line 57 on the protective layer 51 as illustrated in FIG. 46 or the on-chip lens 54 and the like as illustrated in FIG. 1 may be provided on the protective layer 51. In that case, a feature of the present modification example is apparent that the planarization layer 56 is in contact with the second semiconductor layer 23B on a side surface of the organic photoelectric conversion section 20O, but not in contact with the first semiconductor layer 23A. In addition, FIGS. 40, 44, and the like each illustrate an example in which the first semiconductor layer 23A above the shield electrode 21D is removed. However, as long as an end of the first semiconductor layer 23A is formed inside and end of the organic photoelectric conversion section 20, for example, in the peripheral region 1B as illustrated in FIG. 47, it is possible to obtain effects of the present modification example that the processing time of the semiconductor layer 23 is shortened and the controllability of the manufacturing step increases.

Further, the present technology is also applicable to an imaging element having the following configurations.

2-12. Modification Example 12

FIG. 48A schematically illustrates a cross-sectional configuration of an imaging element 10A according to the modification example 12 of the present disclosure. FIG. 48B schematically illustrates an example of a planar configuration of the imaging element 10A illustrated in FIG. 48A. FIG. 48A illustrates a cross section taken along the III-III line illustrated in FIG. 48B. The imaging element 10A is a stacked imaging element in which, for example, an inorganic photoelectric conversion section 32 and an organic photoelectric conversion section 60 are stacked. In the pixel section 1A of an imaging device (e.g., the imaging device 1) including this imaging element 10A, the pixel units 1a are repeatedly disposed as repeating units in an array having the row direction and the column direction as in the embodiment described above. Each of the pixel units 1a includes four pixels disposed, for example, in two rows and two columns, for example, as illustrated in FIG. 48B.

The imaging element 10A according to the present modification example is provided with color filters 55 above the organic photoelectric conversion sections 60 (light incidence side S1) for the respective unit pixels P. The respective color filters 55 selectively transmit red light (R), green light (G), and blue light (B). Specifically, in the pixel unit 1a including four pixels disposed in two rows and two columns, two color filters each of which selectively transmits green light (G) are disposed on a diagonal line and color filters that selectively transmit red light (R) and blue light (B) are disposed one by one on the orthogonal diagonal line. The unit pixels (Pr, Pg, and Pb) provided with the respective color filters each detect the corresponding color light, for example, in the organic photoelectric conversion section 60. In other words, the respective pixels (Pr, Pg, and Pb) that detect red light (R), green light (G), and blue light (B) have a Bayer arrangement in the pixel section 1A.

The organic photoelectric conversion section 60 includes, for example, a lower electrode 61, an insulating layer 62, a semiconductor layer 63, a photoelectric conversion layer 64, and an upper electrode 65. The lower electrode 61, the insulating layer 62, the semiconductor layer 63, the photoelectric conversion layer 64, and the upper electrode 65 each have a configuration similar to that of the organic photoelectric conversion section 20 according to the embodiment described above. The inorganic photoelectric conversion section 32 detects light in a wavelength range different from that of the organic photoelectric conversion section 60.

In the imaging element 10A, pieces of light (red light (R), green light (G), and blue light (B)) in the visible light region among the pieces of light passing through the color filters 55 are absorbed by the organic photoelectric conversion sections 60 of the unit pixels (Pr, Pg, and Pb) provided with the respective color filters. The other light including, for example, light (infrared light (IR)) in the infrared light region (e.g., 700 nm or more and 1000 nm or less) passes through the organic photoelectric conversion sections 60. This infrared light (IR) passing through the organic photoelectric conversion section 60 is detected by the inorganic photoelectric conversion section 32 of each of the unit pixels Pr, Pg, and Pb. Each of the unit pixels Pr, Pg, and Pb generates the signal charge corresponding to the infrared light (IR). In other words, the imaging device 1 including the imaging element 10A is able to concurrently generate both a visible light image and an infrared light image.

2-13. Modification Example 13

FIG. 49A schematically illustrates a cross-sectional configuration of an imaging element 10B according to the modification example 13 of the present disclosure. FIG. 49B schematically illustrates an example of a planar configuration of the imaging element 10B illustrated in FIG. 49A. FIG. 49A illustrates a cross section taken along the IV-IV line illustrated in FIG. 49B. In the modification example 7 described above, the example has been described in which the color filters 55 that selectively transmit red light (R), green light (G), and blue light (B) are provided above the organic photoelectric conversion sections 60 (light incidence side S1), but the color filters 55 may be provided between the inorganic photoelectric conversion sections 32 and the organic photoelectric conversion sections 60, for example, as illustrated in FIG. 49A.

For example, the color filters 55 in the imaging element 10B have a configuration in which color filters (color filters 55R) each of which selectively transmits at least red light (R) and color filters (color filters 55B) each of which selectively transmits at least blue light (B) are disposed on the respective diagonal lines in the pixel unit Ta. The organic photoelectric conversion section 60 (photoelectric conversion layer 64) is configured to selectively absorb a wavelength corresponding to green light, for example, as in the embodiment described above. This allows the organic photoelectric conversion sections 60 and the respective inorganic photoelectric conversion sections (inorganic photoelectric conversion sections 32R and 32G) disposed below the color filters 55R and 55B to acquire signals corresponding to R, G, and B. The imaging element 10B according to the present modification example allows the respective photoelectric conversion sections of R, G, and B to each have larger area than that of an imaging element having a typical Bayer arrangement. This makes it possible to increase the S/N ratio.

2-14. Modification Example 14

FIG. 50 schematically illustrates a cross-sectional configuration of an imaging element 10C according to the modification example 14 of the present disclosure. In the imaging element 10C according to the present modification example, the two organic photoelectric conversion sections 20 and 80 and the one inorganic photoelectric conversion section 32 are stacked in the vertical direction.

The organic photoelectric conversion sections 20 and 80 and the inorganic photoelectric conversion section 32 perform photoelectric conversion by selectively detecting respective pieces of light in different wavelength ranges. For example, the organic photoelectric conversion section 20 acquires a color signal of green (G). For example, the organic photoelectric conversion section 80 acquires a color signal of blue (B). For example, the inorganic photoelectric conversion section 32 acquires a color signal of red (R). This allows the imaging element 10C to acquire a plurality of types of color signals in one pixel without using any color filter.

The organic photoelectric conversion section 80 is stacked, for example, above the organic photoelectric conversion section 20. As with the organic photoelectric conversion section 20, the organic photoelectric conversion section 80 has a configuration in which a lower electrode 81, a semiconductor layer 83, a photoelectric conversion layer 84, and an upper electrode 85 are stacked in this order from the first surface 30A side of the semiconductor substrate 30. The semiconductor layer 83 includes, for example, a first semiconductor layer 83A and a second semiconductor layer 83B. The lower electrode 81 includes a readout electrode 81A and an accumulation electrode 81B as with the organic photoelectric conversion section 20. The lower electrode 81 is electrically separated by an insulating layer 82. The insulating layer 82 is provided with an opening 82H on the readout electrode 81A. There is provided an interlayer insulating layer 87 between the organic photoelectric conversion section 80 and the organic photoelectric conversion section 20.

A through electrode 88 is coupled to the readout electrode 81A. The through electrode 88 penetrates the interlayer insulating layer 87 and the organic photoelectric conversion section 20. The through electrode 88 is electrically coupled to the readout electrode 21A of the organic photoelectric conversion section 20. Further, the readout electrode 81A is electrically coupled to the floating diffusion FD provided in the semiconductor substrate 30 through the through electrodes 34 and 88. It is possible for the readout electrode 81A to temporarily accumulate the electric charge generated by the photoelectric conversion layer 84. Further, the readout electrode 81A is electrically coupled to the amplifier transistor AMP and the like provided in the semiconductor substrate 30 through the through electrodes 34 and 88.

2-15. Modification Example 15

FIG. 51 illustrates a cross-sectional configuration of an imaging element (imaging element 10D) according to the modification example 15 of the present disclosure. The imaging element 10D is included, for example, in one of pixels (unit pixels P) that are repeatedly disposed in an array in the pixel section 1A of an imaging device (imaging device 1) such as a CMOS image sensor used for an electronic apparatus such as a digital still camera or a video camera. In the imaging element 10D according to the present modification example, the two organic photoelectric conversion sections 20 and 70 and the one inorganic photoelectric conversion section 32 are stacked in the vertical direction.

The organic photoelectric conversion sections 20 and 70 and the inorganic photoelectric conversion section 32 perform photoelectric conversion by selectively detecting respective pieces of light in different wavelength ranges. For example, the organic photoelectric conversion section 20 acquires a color signal of green (G). For example, the organic photoelectric conversion section 70 acquires a color signal of blue (B). For example, the inorganic photoelectric conversion section 32 acquires a color signal of red (R). This allows the imaging element 10D to acquire a plurality of types of color signals in the one unit pixel P without using any color filter.

The organic photoelectric conversion section 70 is stacked, for example, above the organic photoelectric conversion section 20. As with the organic photoelectric conversion section 20, the organic photoelectric conversion section 70 has a configuration in which a lower electrode 71, a semiconductor layer 73, a photoelectric conversion layer 74, and an upper electrode 75 are stacked in this order from the first surface 30A side of the semiconductor substrate 30. The semiconductor layer 73 includes, for example, a first semiconductor layer 73A and a second semiconductor layer 73B. In addition, there is provided an insulating layer 72 between the lower electrode 71 and the semiconductor layer 73. For example, the lower electrodes 71 are formed separately for the respective imaging elements 10D. In addition, the lower electrodes 71 each include a readout electrode 71A and an accumulation electrode 71B that are separated from each other with the insulating layer 72 interposed in between. The readout electrode 71A of the lower electrode 71 is electrically coupled to the first semiconductor layer 72A through an opening 72H provided in the insulating layer 72. FIG. 51 illustrates an example in which the semiconductor layers 73, the photoelectric conversion layers 74, and the upper electrodes 75 are separately formed for the respective imaging elements 10D. For example, the semiconductor layer 73, the photoelectric conversion layer 74, and the upper electrode 75 may be, however, formed as continuous layers common to the plurality of imaging elements 10D.

The semiconductor layer 73 is for accumulating the electric charge generated by the photoelectric conversion layer 74. The semiconductor layer 73 has a stacked structure in which the first semiconductor layer 73A and the second semiconductor layer 73B are stacked in this order from the lower electrode 71 side as with the semiconductor layer 23. Specifically, the first semiconductor layer 73A is provided on the insulating layer 72 that electrically separates the lower electrode 71 and the semiconductor layer 73. The first semiconductor layer 73A is electrically coupled to the readout electrode 71A in the opening 72H provided on the readout electrode 71A. The second semiconductor layer 73B is provided between the first semiconductor layer 73A and the photoelectric conversion layer 74.

The first semiconductor layer 73A and the second semiconductor layer 73B respectively have configurations similar to those of the first semiconductor layer 23A and the second semiconductor layer 23B according to the embodiment described above.

The photoelectric conversion layer 74 converts light energy to electric energy. As with the photoelectric conversion layer 24, the photoelectric conversion layer 74 includes two or more types of organic materials (p-type semiconductor material or n-type semiconductor material) that each function as a p-type semiconductor or an n-type semiconductor. The photoelectric conversion layer 74 includes an organic material or a so-called dye material in addition to the p-type semiconductor and the n-type semiconductor. The organic material or the dye material photoelectrically converts light in a predetermined wavelength range and transmits light in another wavelength range. In a case where the photoelectric conversion layer 74 is formed by using the three types of organic materials including a p-type semiconductor, an n-type semiconductor, and a dye material, it is preferable that the p-type semiconductor and the n-type semiconductor be materials each having light transmissivity in the visible region (e.g., 450 nm to 800 nm). The photoelectric conversion layer 74 has, for example, a thickness of 50 nm to 500 nm. Examples of dye materials used for the photoelectric conversion layer 74 include coumarin and a diazo compound, derivatives thereof, or the like.

There are provided two through electrodes 34X and 34Y between the first surface 30A and the second surface 30B of the semiconductor substrate 30.

The through electrode 34X is electrically coupled to the readout electrode 21A of the organic photoelectric conversion section 20 as with the through electrode 34 according to the embodiment described above. The organic photoelectric conversion section 20 is coupled to the gate Gamp of the amplifier transistor AMP and the one source/drain region 36B1 of the reset transistor RST (reset transistor Trlrst) also serving as the floating diffusion FD1 through the through electrode 34X. The upper end of the through electrode 34X is coupled to the readout electrode 21A, for example, through the pad section 39A and the upper first contact 39C.

The through electrode 34Y is electrically coupled to the readout electrode 71A of the organic photoelectric conversion section 70. The organic photoelectric conversion section 70 is coupled to the gate Gamp of the amplifier transistor AMP and the one source/drain region 36B2 of the reset transistor RST (reset transistor Tr2rst) also serving as the floating diffusion FD2 through the through electrode 34Y The upper end of the through electrode 34Y is coupled to the readout electrode 71A, for example, through a pad section 39E, an upper third contact 39F, a pad section A, and an upper fourth contact 76C. In addition, a pad section 76B is coupled to the accumulation electrode 71B through an upper fifth contact 76D. The accumulation electrode 71B is included in the lower electrode 71 along with the readout electrode 71A.

As described above, the imaging element 10D according to the present modification example has a configuration in which the two organic photoelectric conversion sections 20 and 70 and the one inorganic photoelectric conversion section 32 are stacked. As with the organic photoelectric conversion section 20, the organic photoelectric conversion section 70 is also provided with the semiconductor layer 73 between the lower electrode 71 including the readout electrode 71A and the accumulation electrode 71B and the photoelectric conversion layer 74. In the semiconductor layer 73, the first semiconductor layer 73A (Ec1) and the second semiconductor layer 73B (Ec2) are stacked in order from the lower electrode 71 side. The first semiconductor layer 73A (Ec1) and the second semiconductor layer 73B have the relationship between the energy levels at the lowest edges of the conduction bands that satisfies Ec1>Ec2. This makes it possible to obtain effects similar to those of the embodiment described above.

2-16. Modification Example 16

FIG. 52 schematically illustrates a cross-sectional configuration of an imaging element (imaging element 10E) according to the modification example 16 of the present disclosure. The imaging element 10E is included, for example, in one of pixels (unit pixels P) that are repeatedly disposed in an array in the pixel section 1A of an imaging device (imaging device 1) such as a CMOS image sensor used for an electronic apparatus such as a digital still camera or a video camera. The imaging element 10E according to the present modification example has a configuration in which a red color photoelectric conversion section 90R, a green color photoelectric conversion section 90G, and a blue color photoelectric conversion section 90B are stacked above the semiconductor substrate 30 in this order with an insulating layer 92 interposed in between. The red color photoelectric conversion section 90R, the green color photoelectric conversion section 90G, and the blue color photoelectric conversion section 90B are each formed by using an organic material. It is to be noted that FIG. 52 illustrates a simplified configuration of each of the organic photoelectric conversion sections 90R, 90G, and 90B. A specific configuration is similar to that of the organic photoelectric conversion section 20 or the like according to the embodiment described above.

The red color photoelectric conversion section 90R, the green color photoelectric conversion section 90G, and the blue color photoelectric conversion section 90B respectively include semiconductor layers 93R, 93G, and 93B and photoelectric conversion layers 94R, 94G, and 94B between pairs of electrodes. Specifically, the red color photoelectric conversion section 90R, the green color photoelectric conversion section 90G, and the blue color photoelectric conversion section 90B respectively include the semiconductor layers 93R, 93G, and 93B and the photoelectric conversion layers 94R, 94G, and 94B between a lower electrode 91R and an upper electrode 95R, between a lower electrode 91G and an upper electrode 95G, and between a lower electrode 91B and an upper electrode 95B.

There is provided a protective layer 98 and an on-chip lens layer 99 on the blue color photoelectric conversion section 90B. The on-chip lens layer 99 includes an on-chip lens 99L on the front surface. There are provided a red color electricity storage layer 310R, a green color electricity storage layer 310G, and a blue color electricity storage layer 310B in the semiconductor substrate 30. The pieces of light entering the on-chip lenses 99L are photoelectrically converted by the red color photoelectric conversion section 90R, the green color photoelectric conversion section 90G, and the blue color photoelectric conversion section 90B and the signal charge is transmitted from the red color photoelectric conversion section 90R to the red color electricity storage layer 310R, from the green color photoelectric conversion section 90G to the green color electricity storage layer 310G, and from the blue color photoelectric conversion section 90B to the blue color electricity storage layer 310B. Although any of electrons or holes generated through photoelectric conversion may serve as the signal charge, the following gives description by exemplifying a case where electrons are read out as signal charge.

The semiconductor substrate 30 includes, for example, a p-type silicon substrate. The red color electricity storage layer 310R, the green color electricity storage layer 310G, and the blue color electricity storage layer 310B provided in this semiconductor substrate 30 each include an n-type semiconductor region and the signal charge (electrons) supplied from the red color photoelectric conversion section 90R, the green color photoelectric conversion section 90G, and the blue color photoelectric conversion section 90B is accumulated in these n-type semiconductor regions. The n-type semiconductor regions of the red color electricity storage layer 310R, the green color electricity storage layer 310G, and the blue color electricity storage layer 310B are formed, for example, by doping the semiconductor substrate 30 with an n-type impurity such as phosphorus (P) or arsenic (As). It is to be noted that the semiconductor substrate 30 may be provided on a support substrate (not illustrated) including glass or the like.

The semiconductor substrate 30 is provided with a pixel transistor for reading out electrons from each of the red color electricity storage layer 310R, the green color electricity storage layer 310G, and the blue color electricity storage layer 310B and transferring the electrons, for example, to a vertical signal line (e.g., a vertical signal line Lsig in FIG. 32 described below). The floating diffusion of this pixel transistor is provided in the semiconductor substrate 30 and this floating diffusion is coupled to the red color electricity storage layer 310R, the green color electricity storage layer 310G, and the blue color electricity storage layer 310B. The floating diffusion includes an n-type semiconductor region.

The insulating layer 92 includes, for example, a single layer film including one of silicon oxide ($SiO_x$), silicon nitride ($SiN_x$), silicon oxynitride (SiON), hafnium oxide ($HfO_x$), or the like or a stacked film including two or more of them. In addition, the insulating layer 92 may be formed by using an organic insulating material. Although not illustrated, the insulating layer 92 is provided with respective plugs and electrodes for coupling the red color electricity storage layer 310R and the red color photoelectric conversion section 90R, the green color electricity storage layer 310G and the green color photoelectric conversion section 90G, and the blue color electricity storage layer 310B and the blue color photoelectric conversion section 90B.

The red color photoelectric conversion section 90R includes the lower electrode 91R, the semiconductor layer 93R (a first semiconductor layer 93RA and a second semiconductor layer 93RB), the photoelectric conversion layer 94R, and the upper electrode 95R in this order from positions closer to the semiconductor substrate 30. The green color photoelectric conversion section 90G includes the lower electrode 91G, the semiconductor layer 93G (a first semiconductor layer 93GA and a second semiconductor layer 93GB), the photoelectric conversion layer 94G, and the upper electrode 95G in this order from positions closer to the red color photoelectric conversion section 90R. The blue color photoelectric conversion section 90B includes the lower electrode 91B, the semiconductor layer 93B (a first semiconductor layer 93BA and a second semiconductor layer 93BB), the photoelectric conversion layer 94B, and the upper electrode 95B in this order from positions closer to the green color photoelectric conversion section 90G. There is further provided an insulating layer 96 between the red color photoelectric conversion section 90R and the green color photoelectric conversion section 90G and there is further provided an insulating layer 97 between the green color photoelectric conversion section 90G and the blue color photoelectric conversion section 90B. The red color photoelectric conversion section 90R, the green color photoelectric conversion section 90G, and the blue color photoelectric conversion section 90B respectively absorb selectively red (e.g., wavelengths of 620 nm or more and less than 750 nm) light, green (e.g., wavelengths of 495 nm or more and less than 620 nm) light, and blue (e.g., wavelengths of 400 nm or more and less than 495 nm) light to generate electron-hole pairs.

The lower electrode 91R, the lower electrode 91G, and the lower electrode 91B respectively extract the signal charge generated by the photoelectric conversion layer 94R, the signal charge generated by the photoelectric conversion layer 94G, and the signal charge generated by the photoelectric conversion layer 94B. Although not illustrated, each of the lower electrodes 91R, 91G, and 91B includes a plurality of electrodes (e.g., a readout electrode and an accumulation electrode) that is separated from each other by an insulating layer in each of the unit pixels P as with the lower electrode 21 of the organic photoelectric conversion section 20 according to the embodiment described above.

Each of the lower electrodes 91R, 91G, and 91B includes, for example, an electrically conductive material having light transmissivity. For example, each of the lower electrodes 91R, 91G, and 91B includes ITO. In addition to ITO, a tin oxide ($SnO_2$)-based material to which a dopant is added or a zinc oxide-based material obtained by adding a dopant to zinc oxide (ZnO) may be used as a material included in the lower electrode 21. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, IGZO, ITZO, CuI, $InSbO_4$, ZnMgO, $CuInO_2$, $MgIN_2O_4$, CdO, $ZnSnO_3$, or the like may also be used in addition to these.

The semiconductor layers 93R, 93G, and 93B are for respectively accumulating the electric charge generated by the photoelectric conversion layers 94R, 94G, and 94B. The semiconductor layers 93R, 93G, and 93B have stacked structures in which the first semiconductor layers 93RA, 93GA, and 93BA and the second semiconductor layers 93RB, 93GB, and 93BB are stacked in this order from the lower electrodes 91R, 91G, and 91B side as with the semiconductor layer 23 of the organic photoelectric conversion section 20 according to the embodiment described above. Specifically, for example, in the organic photoelectric conversion section 90R, the first semiconductor layer 93RA, the second semiconductor layer 93RB, the photoelectric conversion layer 94R, and the upper electrode 95R are stacked in this order from the lower electrode 91R side. The same applies to the organic photoelectric conversion section 90G and the organic photoelectric conversion section 90B.

The first semiconductor layers 93RA, 93GA, and 93BA and the second semiconductor layers 93RB, 93GB, and 93BB respectively have configurations similar to those of the first semiconductor layer 23A and the second semiconductor layer 23B.

Each of the photoelectric conversion layers 94R, 94G, and 94B converts light energy to electric energy. Each of the photoelectric conversion layers 94R, 94G, and 94B absorbs and photoelectrically converts light in a selective wavelength range and transmits light in the other wavelength ranges. Here, the light in the selective wavelength range is, for example, light in the wavelength range of wavelengths of 620 nm or more and less than 750 nm for the photoelectric conversion layer 94R. The light in the selective wavelength range is, for example, light in the wavelength range of wavelengths of 495 nm or more and less than 620 nm for the photoelectric conversion layer 94G. The light in the selective wavelength range is, for example, light in the wavelength range of wavelengths of 400 nm or more and less than 495 nm for the photoelectric conversion layer 94B.

Each of the photoelectric conversion layers 94R, 94G, and 94B includes two or more types of organic materials that each function as a p-type semiconductor or an n-type semiconductor as with the photoelectric conversion layer 24. Each of the photoelectric conversion layers 94R, 94G, and 94B includes an organic material or a so-called dye material in addition to the p-type semiconductor and the n-type semiconductor. The organic material or the dye material photoelectrically converts light in a predetermined wavelength range and transmits light in another wavelength range. Examples of such materials include rhodamine and merocyanine or derivatives thereof for the photoelectric conversion layer 94R. Examples of such materials include a BODIPY dye for the photoelectric conversion layer 94G. Examples of such materials include coumarin, a diazo compound, and a cyanine-based dye, derivatives thereof, or the like for the photoelectric conversion layer 94B.

The upper electrode 95R, the upper electrode 95G, and the upper electrode 95B are for respectively extracting the holes generated by the photoelectric conversion layer 94R, the holes generated by the photoelectric conversion layer 94G, and the holes generated by the photoelectric conversion layer 94G. The holes extracted from the upper electrodes 95R, 95G, and 95B are discharged, for example, to a p-type semiconductor region (not illustrated) in the semiconductor substrate 30 through the respective transmission paths (not illustrated).

As with the lower electrodes 91R, 91G, and 91B, the upper electrodes 95R, 95G, and 95B each include an electrically conductive material having light transmissivity. For example, each of the upper electrodes 95R, 95G, and 95B includes ITO. In addition, the upper electrodes 95R, 95G, and 95B may include, for example, electrically conductive materials including gold (Au), silver (Ag), copper (Cu), aluminum (Al), and the like.

The insulating layer 96 is for insulating the upper electrode 95R and the lower electrode 91G. The insulating layer 97 is for insulating the upper electrode 95G and the lower electrode 91B. Each of the insulating layers 96 and 97 includes, for example, metal oxide, metal sulfide, or an organic substance. Examples of the metal oxide include silicon oxide ($SiO_x$), aluminum oxide ($AlO_x$), zirconium oxide ($ZrO_x$), titanium oxide ($TiO_x$), zinc oxide ($ZnO_x$), tungsten oxide ($WO_x$), magnesium oxide ($MgO_x$), niobium oxide ($NbO_x$), tin oxide ($SnO_x$), gallium oxide ($GaO_x$), and the like. The metal sulfide includes zinc sulfide (ZnS), magnesium sulfide (MgS), and the like.

As described above, the imaging element 10E according to the present modification example has a configuration in which three organic photoelectric conversion sections (the red color photoelectric conversion section 90R, the green color photoelectric conversion section 90G, and the blue color photoelectric conversion section 90B) are stacked. The respective organic photoelectric conversion sections 90R, 90G, and 90B are provided with the semiconductor layers 93R, 93G, and 93B between the lower electrodes 91R, 91G, and 91B and the photoelectric conversion layers 94R, 94G, and 94B as with the organic photoelectric conversion section 20 according to the embodiment described above. In the semiconductor layers 93R, 93G, and 93B, the first semiconductor layers 93RA, 93GA, and 93BA (Ec1) and the second semiconductor layers 93RB, 93GB, and 93BB (Ec2) are respectively stacked in order from the lower electrodes 91R, 91G, and 91B side. The first semiconductor layers 93RA, 93GA, and 93BA (Ec1) and the second semiconductor layers 93RB, 93GB, and 93BB (Ec2) have the relationship between the energy levels at the lowest edges of the conduction band that satisfies Ec1>Ec2. This makes it possible to obtain effects similar to those of the embodiment described above.

3. Application Examples

Application Example 1

FIG. 53 illustrates an overall configuration of an imaging device (imaging device 1) in which an imaging element (e.g., imaging element 10) according to the present disclosure is used for each of the pixels. This imaging device 1 is a CMOS image sensor. The imaging device 1 includes the pixel section 1A as an imaging area and the peripheral circuit portion 130 in a peripheral region of this pixel section 1A on the semiconductor substrate 30. The peripheral circuit portion 130 includes, for example, a row scanning section 131, a horizontal selection section 133, a column scanning section 134, and a system control section 132.

The pixel section 1A includes, for example, the plurality of unit pixels P (each corresponding to the imaging element 10) that is two-dimensionally disposed in a matrix. These unit pixels P are provided, for example, with a pixel drive line Lread (specifically, a row selection line and a reset control line) for each of the pixel rows and provided with a vertical signal line Lsig for each of the pixel columns. The pixel drive line Lread transmits drive signals for reading out signals from the pixels. One end of the pixel drive line Lread is coupled to the output end of the row scanning section 131 corresponding to each of the rows.

The row scanning section 131 is a pixel drive section that includes a shift register, an address decoder, and the like and drives the respective unit pixels P of the pixel section 1A, for example, row by row. Signals outputted from the respective unit pixels P in the pixel rows selectively scanned by the row scanning section 131 are supplied to the horizontal selection section 133 through the respective vertical signal lines Lsig. The horizontal selection section 133 includes an amplifier, a horizontal selection switch, and the like provided for each of the vertical signal lines Lsig.

The column scanning section 134 includes a shift register, an address decoder, and the like. The column scanning section 134 drives the respective horizontal selection switches of the horizontal selection section 133 in order while scanning the horizontal selection switches. The selective scanning by this column scanning section 134 causes signals of the respective pixels transmitted through each of the vertical signal lines Lsig to be outputted to a horizontal signal line 135 in order and causes the signals to be transmitted to the outside of the semiconductor substrate 30 through the horizontal signal line 135.

The circuit portion including the row scanning section 131, the horizontal selection section 133, the column scanning section 134, and the horizontal signal line 135 may be formed directly on the semiconductor substrate 30 or may be provided on external control IC. In addition, the circuit portion thereof may be formed in another substrate coupled by a cable or the like.

The system control section 132 receives a clock supplied from the outside of the semiconductor substrate 30, data for an instruction about an operation mode, and the like and also outputs data such as internal information of the imaging device 1. The system control section 132 further includes a timing generator that generates a variety of timing signals and controls the driving of the peripheral circuits such as the row scanning section 131, the horizontal selection section 133, and the column scanning section 134 on the basis of the variety of timing signals generated by the timing generator.

Application Example 2

The imaging device 1 described above is applicable, for example, to any type of electronic apparatus with an imaging function including a camera system such as a digital still camera and a video camera, a mobile phone having an imaging function, and the like. FIG. 54 illustrates a schematic configuration of an electronic apparatus 2 (camera) as an example thereof. This electronic apparatus 2 is, for example, a video camera that is able to shoot a still image or a moving image. The electronic apparatus 2 includes the imaging device 1, an optical system (optical lens) 210, a shutter device 211, a drive section 213 that drives the imaging device 1 and the shutter device 211, and a signal processing section 212.

The optical system 210 guides image light (incident light) from a subject to the pixel section 1A of the imaging device 1. This optical system 210 may include a plurality of optical lenses. The shutter device 211 controls a period of time in which the imaging device 1 is irradiated with light and a period of time in which light is blocked. The drive section 213 controls a transfer operation of the imaging device 1 and a shutter operation of the shutter device 211. The signal processing section 212 performs various kinds of signal processing on signals outputted from the imaging device 1.

An image signal Dout subjected to the signal processing is stored in a storage medium such as a memory or outputted to a monitor or the like.

4. Practical Application Examples

Further, the imaging device 1 described above is also applicable to the following electronic apparatuses (a capsule type endoscope 10100 and a mobile body such as a vehicle).

Example of Practical Application to In-vivo Information Acquisition System

Further, the technology (the present technology) according to the present disclosure is applicable to a variety of products. For example, the technology according to the present disclosure may be applied to an endoscopic surgery system.

FIG. 55 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 55, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112)

can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The example of the in-vivo information acquisition system to which the technology according to the present disclosure may be applied has been described above. The technology according to the present disclosure may be applied, for example, to the image pickup unit 10112 among the components described above. This increases the detection accuracy.

Example of Practical Application to Endoscopic Surgery System

The technology (the present technology) according to the present disclosure is applicable to a variety of products. For example, the technology according to the present disclosure may be applied to an endoscopic surgery system.

FIG. 56 is a view depicting an example of a schematic configuration of an endoscopic surgery system to which the technology according to an embodiment of the present disclosure (present technology) can be applied.

In FIG. 56, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 57 is a block diagram depicting an example of a functional configuration of the camera head 11102 and the CCU 11201 depicted in FIG. 56.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure may be applied has been described above. The technology according to the present disclosure may be applied to the image pickup unit 11402 among the components described above. The application of the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

Example of Practical Application to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 58 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 58, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 58, an audio speaker 12061, a display section 12062, and an instrument panel 12063 are illustrated as the output device. The display section 12062 may, for example, include at least one of an on-board display and a head-up display.

FIG. 59 is a diagram depicting an example of the installation position of the imaging section 12031.

In FIG. 59, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 59 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the description has been given with reference to the embodiment and the modification examples 1 to 16 and the application examples and the practical application examples, the contents of the present disclosure are not limited to the embodiment and the like described above. A variety of modifications are possible. For example, in the embodiment described above, an imaging element has a configuration in which the organic photoelectric conversion section 20 that detects green light and the inorganic photoelectric conversion sections 32B and 32R that respectively detect blue light and red light are stacked. The contents of the present disclosure are not, however, limited to such a structure. For example, the organic photoelectric conversion section may detect the red light or the blue light or the inorganic photoelectric conversion sections may each detect the green light.

In addition, the number of these organic photoelectric conversion sections and inorganic photoelectric conversion sections or the proportion thereof is not limited. The two or more organic photoelectric conversion sections may be provided or color signals of a plurality of colors may be obtained with the organic photoelectric conversion section alone.

Further, in the embodiment or the like described above, the example has been described in which a plurality of electrodes included in the lower electrode 21 includes the two electrodes of the readout electrode 21A and the accumulation electrode 21B or the three electrodes of the readout electrode 21A, the accumulation electrode 21B, and the transfer electrode 21C or the readout electrode 21A, the accumulation electrode 21B, and the shield electrode 21D. In addition, there may be, however, provided four or more electrodes including a discharge electrode and the like.

It is to be noted that the effects described herein are merely examples, but are not limitative. In addition, there may be other effects.

It is to be noted that the present technology may also have configurations as follows. According to the present technology having the following configurations, the semiconductor layer is provided between the first electrode and second electrode and the photoelectric conversion layer including an organic material. The first electrode and the second electrode are disposed in parallel. In the semiconductor layer, the first layer and the second layer are stacked. The first layer is provided on the photoelectric conversion layer side. The second layer is provided on the first electrode and second electrode side. In addition, the second layer has the energy level at the lowest edge of the conduction band that is shallower than the energy level of the first layer at the lowest edge of the conduction band. This improves the characteristics of transporting electric charge to the second electrode and makes it possible to reduce noise.

(1)
   An imaging element including:
   a first electrode and a second electrode that are disposed in parallel;
   a third electrode that is disposed to be opposed to the first electrode and the second electrode;
   a photoelectric conversion layer that is provided between the first electrode and second electrode and the third electrode; and
   a semiconductor layer that is provided between the first electrode and second electrode and the photoelectric conversion layer, the semiconductor layer having a first layer and a second layer stacked therein in order from the photoelectric conversion layer side, the second layer having an energy level at a lowest edge of a conduction band that is shallower than an energy level of the first layer at a lowest edge of a conduction band.

(2)
The imaging element according to (1), further including an insulating layer that is provided between the first electrode and second electrode and the semiconductor layer and has a first opening above the second electrode, in which
   the second electrode and the semiconductor layer are electrically coupled through the first opening.

(3)
The imaging element according to (1) or (2), further including a protective layer between the photoelectric conversion layer and the semiconductor layer, the protective layer including an inorganic material.

(4)
The imaging element according to (3), in which the semiconductor layer further includes a third layer between the protective layer and the first layer, the third layer having an energy level at a lowest edge of a conduction band that is substantially same as or shallower than the energy level of the first layer at the lowest edge of the conduction band.

(5)
The imaging element according to any one of (2) to (4), in which a side surface and a bottom surface of the first opening are covered with the second layer and at least a portion of the second layer that covers the bottom surface has a higher carrier concentration than a carrier concentration of another region.

(6)
The imaging element according to (5), in which the second layer has a second opening in the first opening, the second electrode and the first layer being electrically coupled directly in the second opening.

(7)
The imaging element according to (6), in which the side surface of the first opening is covered with the second layer.

(8)
The imaging element according to (6), in which the first opening and the second opening have a same side surface.

(9)
The imaging element according to (6), in which a side surface of the second opening is provided outside the side surface of the first opening.

(10)
The imaging element according to any one of (1) to (9), in which the second layer includes silicon that is more than or equal to a content of silicon included in the first layer.

(11)
The imaging element according to any one of (1) to (10), in which
   the first layer and the second layer each include gallium, and
   the second layer includes gallium that is more than or equal to a content of gallium included in the first layer.

(12)
The imaging element according to any one of (1) to (10), in which
   the first layer and the second layer each include zinc, and
   the second layer includes zinc that is more than or equal to a content of zinc included in the first layer.

(13)

The imaging element according to any one of (1) to (12), in which the first layer and the second layer both have crystallinity.

(14)

The imaging element according to (13), in which the second layer includes an amorphous layer and a crystal layer and the amorphous layer and the crystal layer are stacked in order from the first electrode and second electrode side.

(15)

The imaging element according to any one of (1) to (14), in which the first layer and the second layer both have amorphousness.

(16)

The imaging element according to any one of (1) to (14), in which one of the first layer or the second layer has crystallinity and another of the first layer or the second layer has amorphousness.

(17)

The imaging element according to any one of (2) to (16), in which the second layer includes a layer therein, the layer including more carbon than another region in the second layer.

(18)

The imaging element according to (17), in which the second layer covers a side surface and a bottom surface of the first opening and the layer including more carbon is provided outside the first opening in the second layer.

(19)

The imaging element according to any one of (1) to (16), in which the first layer includes a layer therein, the layer including more carbon than another region in the first layer.

(20) The imaging element according to (18) or (19), in which the first layer is in direct contact with the second electrode in the first opening and the layer including more carbon is provided outside the first opening in the first layer.

(21)

The imaging element according to any one of (2) to (20), further including, in the first opening, a metal film or a metal oxide film between the first electrode and the semiconductor layer or between the first layer and the second layer.

(22)

The imaging element according to any one of (21), including a gap between the metal film and metal oxide film and a side surface of the first opening.

(23)

The imaging element according to (21) or (22), in which the semiconductor layer has a region around the metal film and the metal oxide film, the region being higher than another region in carrier concentration.

(24)

The imaging element according to any one of (21) to (23), in which the metal film and the metal oxide film cover a side surface and a bottom surface of the first opening.

(25)

The imaging element according to any one of (21) to (24), in which the metal film and the metal oxide film each include a material having Gibbs energy that is less than or equal to Gibbs energy of a material included in the second layer.

(26)

The imaging element according to any one of (1) to (26), in which the first electrode and the second electrode are each formed to include a material having Gibbs energy that is less than or equal to Gibbs energy of a material included in the second layer.

(27)

The imaging element according to any one of (1) to (26), in which the second layer has a thickness of 1 nm or more and 50 nm or less.

(28)

The imaging element according to any one of (1) to (27), further including a fourth electrode between the first electrode and the second electrode.

(29)

The imaging element according to (28), in which the fourth electrode is provided in a layer lower than the first electrode and the second electrode.

(30)

The imaging element according to any one of (1) to (29), in which the first layer has a stacked structure of a layer having crystallinity and a layer having amorphousness.

(31)

The imaging element according to (30), in which the layer having crystallinity and the layer having amorphousness are stacked in this order from the first electrode and second electrode side.

(32)

The imaging element according to (31), in which the layer having amorphousness has an energy level at a lowest edge of a conduction band that is substantially same as or shallower than an energy level of the layer having crystallinity at a lowest edge of a conduction band.

(33)

The imaging element according to any one of (30) to (32), in which the layer having amorphousness covers an upper surface and a side surface of the layer having crystallinity.

(34)

The imaging element according to any one of (31) to (33), further including an opening above the second electrode, the opening extending through the layer having crystallinity, in which the layer having amorphousness is electrically coupled to the second electrode through the opening.

(35)

The imaging element according to (34), further including a protective layer between the photoelectric conversion layer and the layer having amorphousness, the protective layer including an inorganic material, in which the layer having amorphousness and the protective layer are stacked in the opening.

(36)

The imaging element according to any one of (1) to (35), in which the second layer has an end inside an end of the first layer in a plan view.

(37)

The imaging element according to (36), in which the end of the second layer has an inclined surface.

(38)

The imaging element according to (36) or (37), in which the second layer further has a second opening in which the second electrode and the first layer are electrically coupled directly, and the end of the second layer and the second opening each have a round shape in a plan view.

(39)

The imaging element according to any one of (1) to (38), further including a fifth electrode around the first electrode and the second electrode in a plan view, the fifth electrode having a fixed potential applied thereto.

(40)

The imaging element according to (39), in which the first layer is formed above the fifth electrode without interposing the second layer in between.

(41)

The imaging element according to any one of (1) to (40), in which the first electrode and the second electrode are disposed on the photoelectric conversion layer on an opposite side to a light incidence surface.

(42)

The imaging element according to any one of (1) to (41), in which respective voltages are individually applied to the first electrode and the second electrode.

(43)

The imaging element according to (42), in which one or more organic photoelectric conversion sections and one or more inorganic photoelectric conversion sections are stacked, the organic photoelectric conversion sections each including the first electrode, the second electrode, the third electrode, the photoelectric conversion layer, and the semiconductor layer, the inorganic photoelectric conversion sections each performing photoelectric conversion in a wavelength range different from a wavelength range of each of the organic photoelectric conversion sections.

(44)

The imaging element according to (43), in which
the inorganic photoelectric conversion section is formed to be buried in a semiconductor substrate, and
the organic photoelectric conversion section is formed on a first surface side of the semiconductor substrate.

(45)

An imaging device including
a plurality of pixels that is each provided with one or more imaging elements, in which
the imaging elements each include
a first electrode and a second electrode that are disposed in parallel,
a third electrode that is disposed to be opposed to the first electrode and the second electrode,
a photoelectric conversion layer that is provided between the first electrode and second electrode and the third electrode, and
a semiconductor layer that is provided between the first electrode and second electrode and the photoelectric conversion layer, the semiconductor layer having a first layer and a second layer stacked therein in order from the photoelectric conversion layer side, the second layer having an energy level at a lowest edge of a conduction band that is shallower than an energy level of the first layer at a lowest edge of a conduction band.

The present application claims the priority on the basis of Japanese Patent Application No. 2020-064017 filed on Mar. 31, 2020 with Japan Patent Office and Japanese Patent Application No. 2021-045945 filed on Mar. 19, 2021 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging element comprising:
a first electrode and a second electrode that are disposed in parallel;
a third electrode that is disposed to be opposed to the first electrode and the second electrode;
a photoelectric conversion layer that is provided between the first electrode and second electrode and the third electrode; and
a semiconductor layer that is provided between the first electrode and second electrode and the photoelectric conversion layer, the semiconductor layer having a first layer and a second layer stacked therein in order from the photoelectric conversion layer side, the second layer having an energy level at a lowest edge of a conduction band that is shallower than an energy level of the first layer at a lowest edge of a conduction band,
wherein the first layer includes a layer therein, the layer including more carbon than another region in the first layer.

2. The imaging element according to claim 1, further comprising an insulating layer that is provided between the first electrode and second electrode and the semiconductor layer and has a first opening above the second electrode, wherein
the second electrode and the semiconductor layer are electrically coupled through the first opening.

3. The imaging element according to claim 1, further comprising a protective layer between the photoelectric conversion layer and the semiconductor layer, the protective layer including an inorganic material.

4. The imaging element according to claim 3, wherein the semiconductor layer further includes a third layer between the protective layer and the first layer, the third layer having an energy level at a lowest edge of a conduction band that is substantially same as or shallower than the energy level of the first layer at the lowest edge of the conduction band.

5. The imaging element according to claim 2, wherein a side surface and a bottom surface of the first opening are covered with the second layer and at least a portion of the second layer that covers the bottom surface has a higher carrier concentration than a carrier concentration of another region.

6. The imaging element according to claim 5, wherein the second layer has a second opening in the first opening, the second electrode and the first layer being electrically coupled directly in the second opening.

7. The imaging element according to claim 6, wherein the side surface of the first opening is covered with the second layer.

8. The imaging element according to claim 6, wherein the first opening and the second opening have a same side surface.

9. The imaging element according to claim 6, wherein a side surface of the second opening is provided outside the side surface of the first opening.

10. The imaging element according to claim 1, wherein the second layer includes silicon that is more than or equal to a content of silicon included in the first layer.

11. The imaging element according to claim 1, wherein the first layer and the second layer each include gallium, and
the second layer includes gallium that is more than or equal to a content of gallium included in the first layer.

12. The imaging element according to claim 1, wherein the first layer and the second layer each include zinc, and
the second layer includes zinc that is more than or equal to a content of zinc included in the first layer.

13. The imaging element according to claim 1, wherein the first layer and the second layer both have crystallinity.

14. The imaging element according to claim 13, wherein the second layer includes an amorphous layer and a crystal layer and the amorphous layer and the crystal layer are stacked in order from the first electrode and second electrode side.

15. The imaging element according to claim 1, wherein the first layer and the second layer both have amorphousness.

16. The imaging element according to claim 1, wherein one of the first layer or the second layer has crystallinity and another of the first layer or the second layer has amorphousness.

17. The imaging element according to claim 2, further comprising, in the first opening, a metal film or a metal oxide film between the second electrode and the semiconductor layer or between the first layer and the second layer.

18. The imaging element according to claim 17, comprising a gap between the metal film and metal oxide film and a side surface of the first opening.

19. The imaging element according to claim 17, wherein the semiconductor layer has a region around the metal film and the metal oxide film, the region being higher than another region in carrier concentration.

20. The imaging element according to claim 17, wherein the metal film and the metal oxide film cover a side surface and a bottom surface of the first opening.

21. The imaging element according to claim 17, wherein the metal film and the metal oxide film each include a material having Gibbs energy that is less than or equal to Gibbs energy of a material included in the second layer.

22. The imaging element according to claim 1, wherein the first electrode and the second electrode are each formed to include a material having Gibbs energy that is less than or equal to Gibbs energy of a material included in the second layer.

23. The imaging element according to claim 1, wherein the second layer has a thickness of 1 nm or more and 50 nm or less.

24. The imaging element according to claim 1, further comprising a fourth electrode between the first electrode and the second electrode.

25. The imaging element according to claim 24, wherein the fourth electrode is provided in a layer lower than the first electrode and the second electrode.

26. The imaging element according to claim 1, wherein the first layer has a stacked structure of a layer having crystallinity and a layer having amorphousness.

27. The imaging element according to claim 26, wherein the layer having crystallinity and the layer having amorphousness are stacked in this order from the first electrode and second electrode side.

28. The imaging element according to claim 27, wherein the layer having amorphousness has an energy level at a lowest edge of a conduction band that is substantially same as or shallower than an energy level of the layer having crystallinity at a lowest edge of a conduction band.

29. The imaging element according to claim 26, wherein the layer having amorphousness covers an upper surface and a side surface of the layer having crystallinity.

30. The imaging element according to claim 1, wherein the second layer has an end inside an end of the first layer in a plan view.

31. The imaging element according to claim 30, wherein the end of the second layer has an inclined surface.

32. The imaging element according to claim 30, wherein
the second layer further has a second opening in which the second electrode and the first layer are electrically coupled directly, and
the end of the second layer and the second opening each have a round shape in a plan view.

33. The imaging element according to claim 1, further comprising a fifth electrode around the first electrode and the second electrode in a plan view, the fifth electrode having a fixed potential applied thereto.

34. The imaging element according to claim 33, wherein the first layer is formed above the fifth electrode without interposing the second layer in between.

35. The imaging element according to claim 1, wherein the first electrode and the second electrode are disposed on the photoelectric conversion layer on an opposite side to a light incidence surface.

36. The imaging element according to claim 1, wherein respective voltages are individually applied to the first electrode and the second electrode.

37. The imaging element according to claim 36, wherein one or more organic photoelectric conversion sections and one or more inorganic photoelectric conversion sections are stacked, the organic photoelectric conversion sections each including the first electrode, the second electrode, the third electrode, the photoelectric conversion layer, and the semiconductor layer, the inorganic photoelectric conversion sections each performing photoelectric conversion in a wavelength range different from a wavelength range of each of the organic photoelectric conversion sections.

38. The imaging element according to claim 37, wherein
the inorganic photoelectric conversion section is formed to be buried in a semiconductor substrate, and
the organic photoelectric conversion section is formed on a first surface side of the semiconductor substrate.

39. An imaging device comprising
a plurality of pixels that is each provided with one or more imaging elements, wherein the imaging elements each include the imaging element according to claim 1.

40. An imaging element comprising:
a first electrode and a second electrode that are disposed in parallel;
a third electrode that is disposed to be opposed to the first electrode and the second electrode;
a photoelectric conversion layer that is provided between the first electrode and second electrode and the third electrode;
a semiconductor layer that is provided between the first electrode and second electrode and the photoelectric conversion layer, the semiconductor layer having a first layer and a second layer stacked therein in order from the photoelectric conversion layer side, the second layer having an energy level at a lowest edge of a conduction band that is shallower than an energy level of the first layer at a lowest edge of a conduction band; and
an insulating layer that is provided between the first electrode and second electrode and the semiconductor layer and has a first opening above the second electrode,
wherein the second electrode and the semiconductor layer are electrically coupled through the first opening, and
wherein the second layer includes a layer therein, the layer including more carbon than another region in the second layer.

41. The imaging element according to claim 40, wherein the second layer covers a side surface and a bottom surface of the first opening and the layer including more carbon is provided outside the first opening in the second layer.

42. The imaging element according to claim 41, wherein the first layer is in direct contact with the second electrode in the first opening and the layer including more carbon is provided outside the first opening in the first layer.

43. An imaging device comprising a plurality of pixels that is each provided with one or more imaging elements, wherein the imaging elements each include the imaging element according to claim 40.

44. An imaging element comprising:
- a first electrode and a second electrode that are disposed in parallel;
- a third electrode that is disposed to be opposed to the first electrode and the second electrode;
- a photoelectric conversion layer that is provided between the first electrode and second electrode and the third electrode; and
- a semiconductor layer that is provided between the first electrode and second electrode and the photoelectric conversion layer, the semiconductor layer having a first layer and a second layer stacked therein in order from the photoelectric conversion layer side, the second layer having an energy level at a lowest edge of a conduction band that is shallower than an energy level of the first layer at a lowest edge of a conduction band; and
- an opening above the second electrode, the opening extending through the layer having crystallinity,
- wherein the first layer has a stacked structure of a layer having crystallinity and a layer having amorphousness,
- wherein the layer having crystallinity and the layer having amorphousness are stacked in this order from the first electrode and second electrode side, and
- wherein the layer having amorphousness is electrically coupled to the second electrode through the opening.

45. The imaging element according to claim 44, further comprising a protective layer between the photoelectric conversion layer and the layer having amorphousness, the protective layer including an inorganic material, wherein
  the layer having amorphousness and the protective layer are stacked in the opening.

46. An imaging device comprising a plurality of pixels that is each provided with one or more imaging elements, wherein the imaging elements each include the imaging element according to claim 44.

* * * * *